(12) United States Patent
Chen et al.

(10) Patent No.: US 12,363,964 B2
(45) Date of Patent: Jul. 15, 2025

(54) SEMICONDUCTOR DEVICE HAVING DIELECTRIC HYBRID FIN

(71) Applicant: Taiwan Semiconductor Manufacturing Co., Ltd., Hsinchu (TW)

(72) Inventors: Chun-Yuan Chen, Hsinchu (TW); Huan-Chieh Su, Hsinchu (TW); Li-Zhen Yu, Hsinchu (TW); Cheng-Chi Chuang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 462 days.

(21) Appl. No.: 17/743,352

(22) Filed: May 12, 2022

(65) Prior Publication Data

US 2023/0138012 A1    May 4, 2023

Related U.S. Application Data

(60) Provisional application No. 63/275,724, filed on Nov. 4, 2021.

(51) Int. Cl.
| | |
|---|---|
| *H10D 62/10* | (2025.01) |
| *H10D 30/01* | (2025.01) |
| *H10D 30/67* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 84/0128* (2025.01); *H10D 84/013* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Michelle Mandala
(74) *Attorney, Agent, or Firm* — Seed IP Law Group

(57) ABSTRACT

A device includes a substrate and a transistor on the substrate. The transistor includes a channel region that has at least one semiconductor nanostructure, and a gate electrode. A source/drain region is disposed adjacent to a first side of the channel region along a first direction. A hybrid fin structure is disposed adjacent to a second side of the channel region along a second direction that is transverse to the first direction. The hybrid fin structure includes a first hybrid fin dielectric layer and a second hybrid fin dielectric layer. The first and second hybrid fin dielectric layers include silicon, oxygen, carbon and nitrogen and have a different concentration of at least one of silicon oxygen, carbon, or nitrogen from one another.

20 Claims, 29 Drawing Sheets

(56) References Cited

U.S. PATENT DOCUMENTS

| | | | |
|---|---|---|---|
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,714,592 B2 * | 7/2020 | Cheng | H01L 29/0673 |
| 2022/0359517 A1 * | 11/2022 | Ho | H01L 29/7851 |
| 2022/0359677 A1 * | 11/2022 | Jao | H01L 29/401 |
| 2022/0367656 A1 * | 11/2022 | Pao | H01L 27/088 |

* cited by examiner

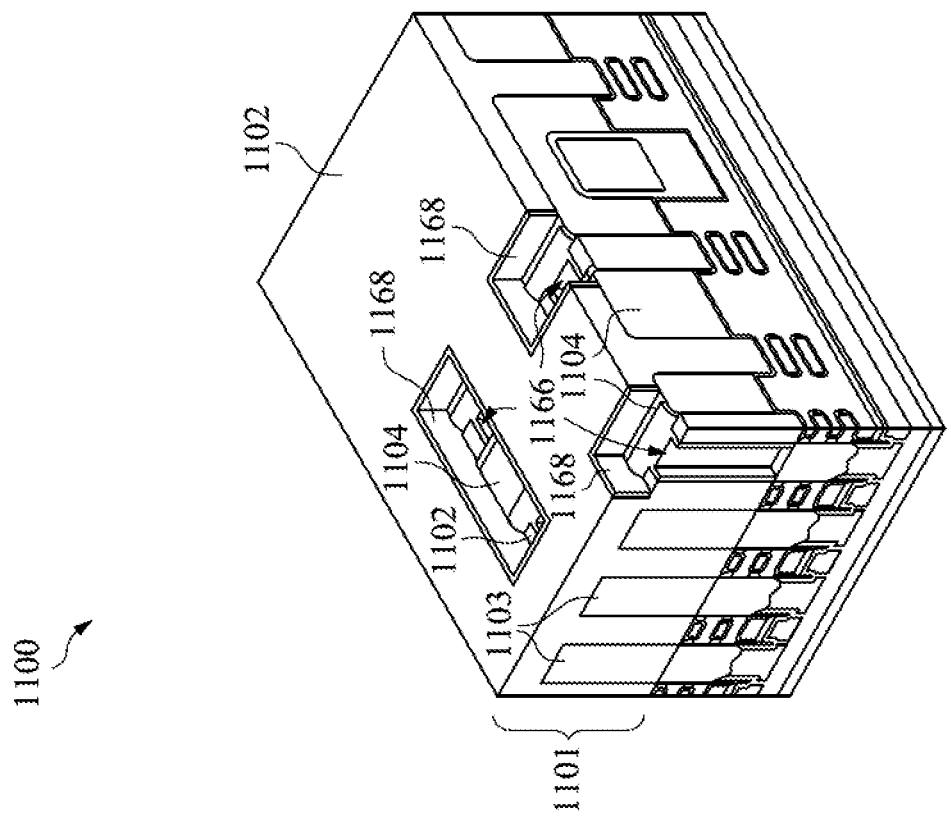
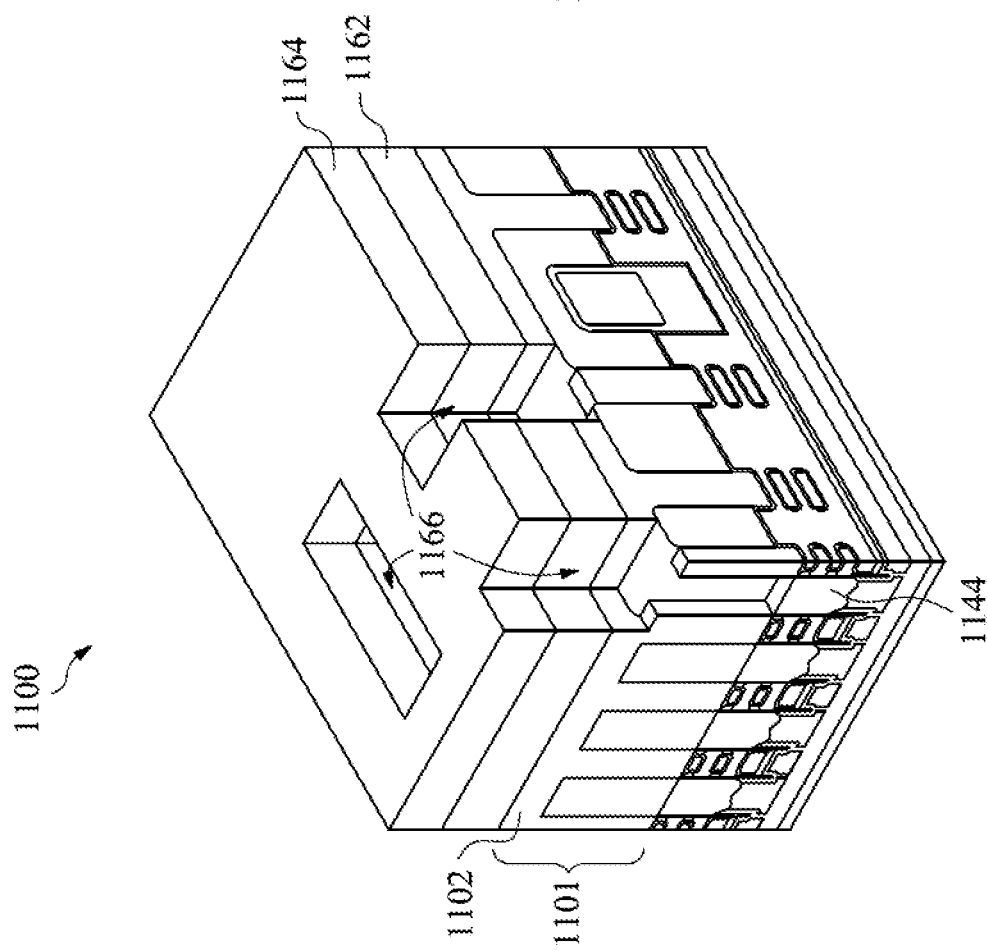
Fig. 4L
Fig. 4K

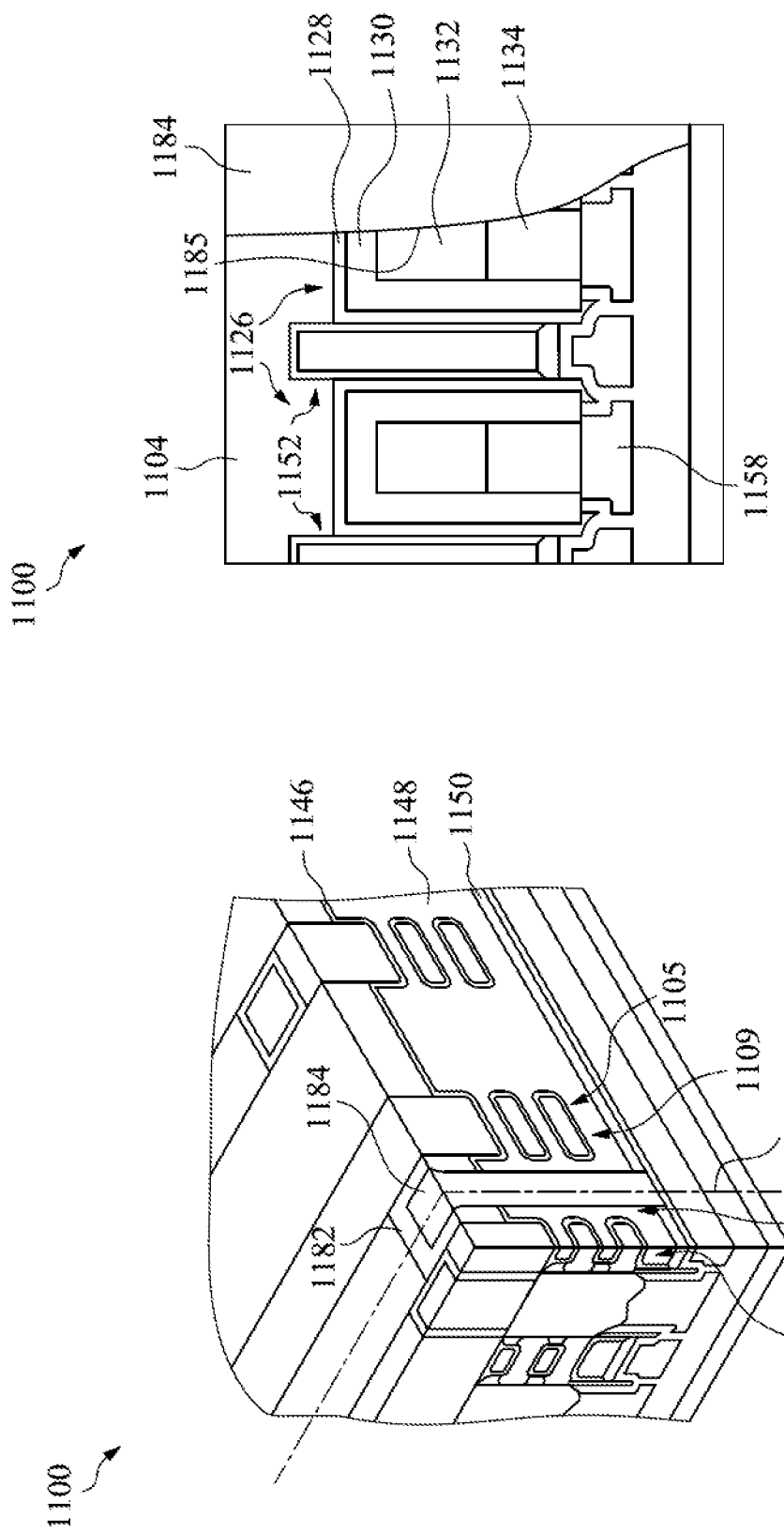

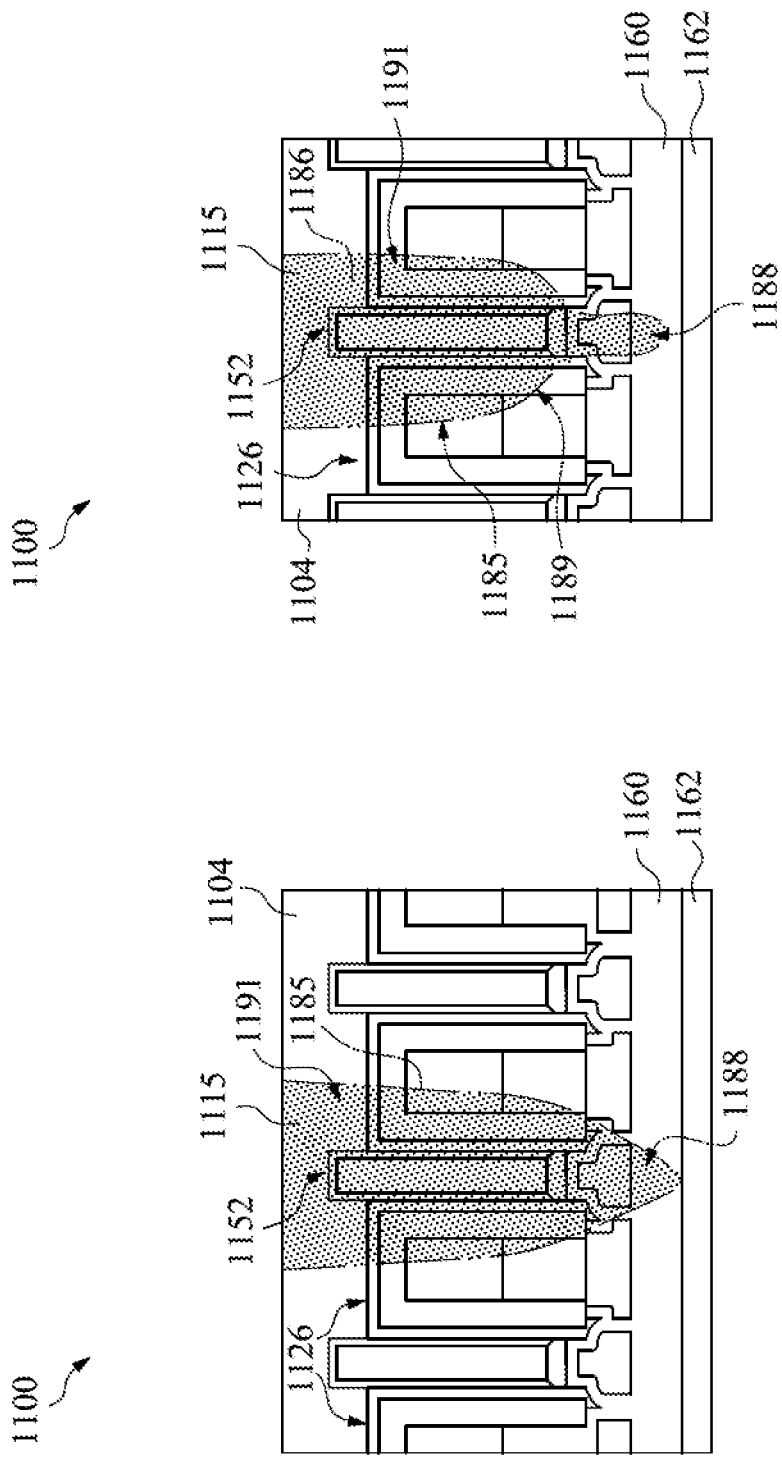

SEMICONDUCTOR DEVICE HAVING DIELECTRIC HYBRID FIN

BACKGROUND

There has been a continuous demand for increasing computing power in electronic devices including smart phones, tablets, desktop computers, laptop computers and many other kinds of electronic devices. Semiconductor devices provide the computing power for these electronic devices. One way to increase computing power in semiconductor devices is to increase the number of transistors and other semiconductor device features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Gate electrodes may be coupled to the nanostructures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-5 are perspective and cross-sectional views of an integrated circuit at various stages of processing, in accordance with some embodiments.

DETAILED DESCRIPTION

Figure 1B:
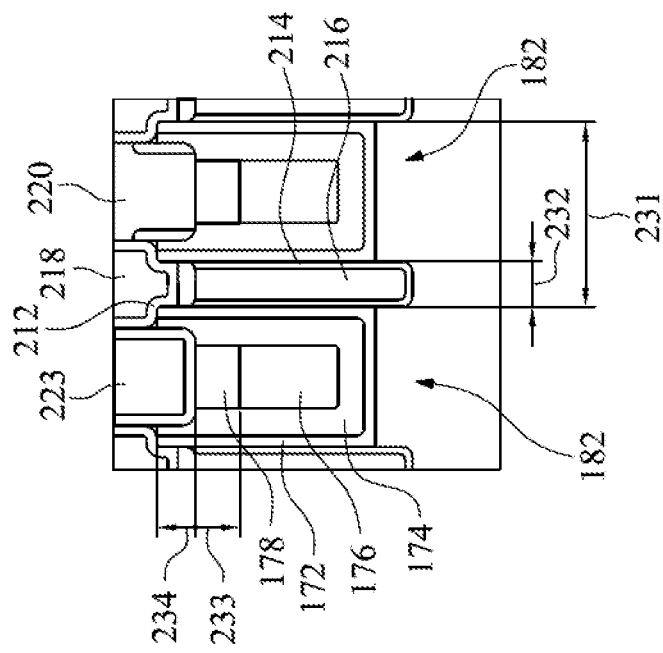
FIG. 1B is a cross-sectional view of the semiconductor device taken along the line B-B' of FIG. 1A, in accordance with some embodiments.

In the following description, many thicknesses and materials are described for various layers and structures within a semiconductor device die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide semiconductor devices and methods of manufacturing semiconductor devices in which hybrid fin structures are formed source/drain regions of neighboring transistors and between gate electrodes of neighboring transistors. The hybrid fin structures include a plurality of silicon oxycarbonitride (SiOCN) hybrid fin dielectric layers, with each of the SiOCN layers having different ratios or different concentrations of at least one of Si, O, C, or N with respect to one another. This results in a hybrid fin structure having good qualities for use in a transistor (e.g., high thermal stability and excellent step coverage), while providing a low dielectric material capable of reducing or preventing current leakage between neighboring transistors. The hybrid fin structures include non-high-K dielectric materials to improve the performance and manufacturing processes of the transistors. The hybrid fin structures may be formed with a lower height as compared to hybrid fin structures which utilize a high-K dielectric material. Moreover, by forming the semiconductor device using non-high-K dielectric materials in the hybrid fin, costs are reduced as the materials and processes may be less costly and more efficient, and process risks associated with high-K dielectric hybrid fins may be avoided.

Figure 1A:
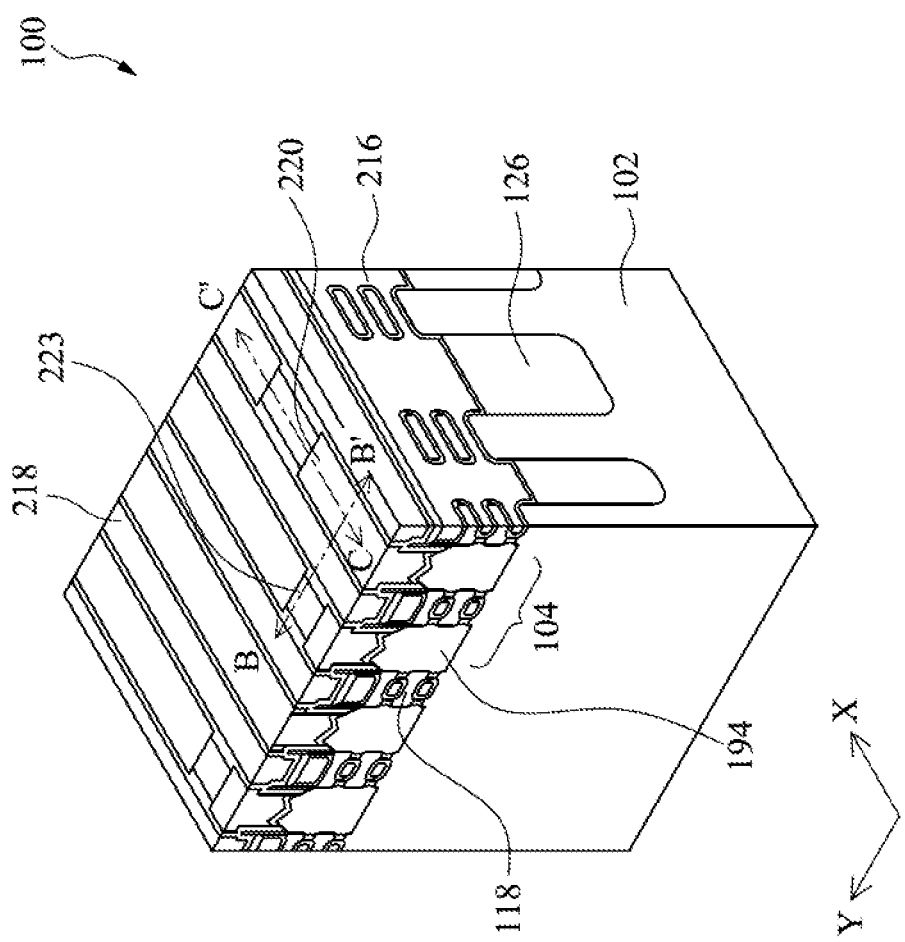
FIG. 1A is a perspective view of a semiconductor device, in accordance with some embodiments.
Figure 1C:
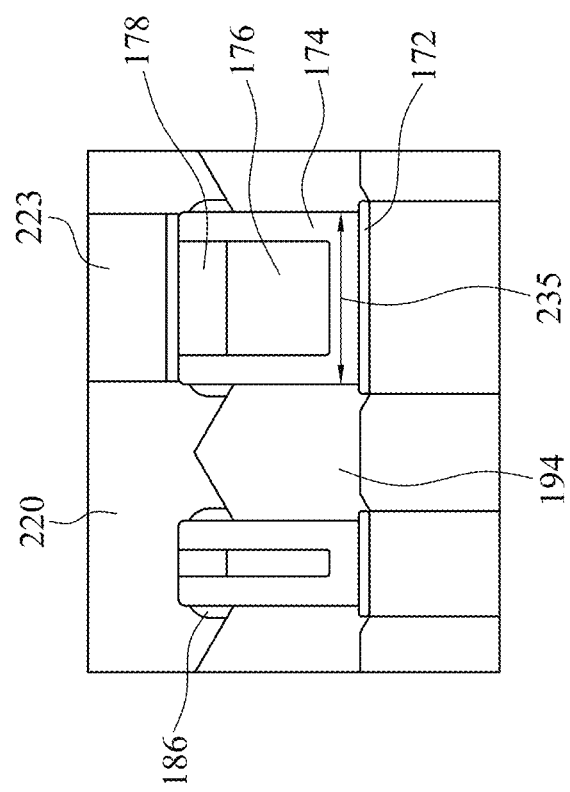
FIG. 1C is a cross-sectional view of the semiconductor device taken along the line C-C' of FIG. 1A, in accordance with some embodiments.

FIG. 1A is a schematic diagram illustrating a semiconductor device 100, in accordance with some embodiments. FIG. 1B is a cross-sectional diagram illustrating the semiconductor device 100 taken along the line B-B'. FIG. 1C is a cross-sectional diagram illustrating the semiconductor device 100 taken along the line C-C'.

The semiconductor device 100 includes a semiconductor substrate 102 and a plurality of transistors 104 formed on the substrate 102. As set forth in more detail below, the semiconductor device 100 utilizes hybrid fin structures 182 that include non-high-K dielectric materials to improve the performance and manufacturing processes of the transistors 104.

In some embodiments, each of the plurality of transistors 104 are nanostructure transistors. In such embodiments, channel regions of each of the transistors 104 include a plurality of semiconductor nanostructures 118 extending between the source/drain regions 194 of the transistors 104. The semiconductor nanostructures 118 may include nanosheets, nanowires, or other types of nanostructures. The semiconductor nanostructures 118 form channel regions of each of the transistors104. Other types of transistors may be utilized without departing from the scope of the present disclosure. A number of the semiconductor nanostructures 118 included in the channel region of each transistor may vary in various embodiments. In some embodiments, the channel region of each transistor 104 may include one or more semiconductor nanostructures 118. In some embodiments, the channel region of each transistor 104 may include anywhere from one to five or more semiconductor nanostructures 118. The semiconductor nanostructures 118 of the channel region of each transistor 104 may be arranged in a stacked arrangement, such that the nanostructures 118 are substantially vertically aligned and overlapping with one another.

The transistors 104 include gate electrodes 216 which may be formed of any suitable electrically conductive material. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf). In some embodiments, the gate electrodes 216 may have a width 232 between adjacent hybrid fin structures 182, as shown in FIG. 1B. In some embodiments, the width 232 is less than 30 nm. In some embodiments, the width 232 is less than 20 nm. In some embodiments, the width 232 is between 9 nm and 20 nm.

In some embodiments, a gate dielectric 214 is disposed on the gate electrodes 216 and may surround (e.g., surround at least four sides) portions of the gate electrodes 216 disposed between the nanostructures 118 of each of the transistors. In various embodiments, the gate dielectric 214 may be formed of a single layer or multiple dielectric layers, as will be described in further detail later herein.

As shown in FIG. 1B, a dielectric liner 212 may be formed on the gate electrodes 216, and source/drain contacts 220 are formed in regions between facing portions of the dielectric liner 212, for example, in contact with the dielectric liner 212. In some embodiments, one or more of the source/drain contacts 220 are disposed over the hybrid fin structures 182.

Shallow trench isolation structures 126 extend into the semiconductor substrate 102. The shallow trench isolation structures 126 can be utilized to separate individual transistors or groups of transistors groups of transistors formed in conjunction with the semiconductor substrate 102. The dielectric material for the shallow trench isolation structures 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD.

As shown in FIG. 1C, the hybrid fin structures 182 are disposed between adjacent source/drain regions 194 along the X-axis direction. As such, the source/drain regions 194 are adjacent to the semiconductor nanostructures 118 along a first direction (e.g., the Y-axis direction), and the hybrid fin structures 182 are disposed adjacent to the source/drain regions 194 along a second direction (e.g., the X-axis direction) that is transverse to the first direction. The hybrid fin structures 182 include a plurality of hybrid fin dielectric layers, none of which are high-K dielectric layers. More particularly, the hybrid fin structures 182 include a first hybrid fin dielectric layer 172, a second hybrid fin dielectric layer 174, and a third hybrid fin dielectric layer 178. The first hybrid fin dielectric layer 172 may be disposed on the shallow trench isolation structures 126, and the second hybrid fin dielectric layer 174 may be disposed on the first hybrid fin dielectric layer 172. The hybrid fin structures 182 further include an oxide layer 176 disposed on the second hybrid fin dielectric layer 174, and the third hybrid fin dielectric layer 178 may be disposed on the oxide layer 176.

In some embodiments, the third hybrid fin dielectric layer 178 may have a height 233 that is less than 50 nm. In some embodiments, the third hybrid fin dielectric layer 178 may have a height 233 that is less than 30 nm.

In some embodiments, a distance (e.g., a vertical distance) 234 between an upper surface of the second hybrid fin dielectric layer 174 and an upper surface of the third hybrid fin dielectric layer 178 is less than 50 nm. In some embodiments, the distance 234 is less than 30 nm.

As shown in FIG. 1C, in some embodiments, a portion of a dielectric spacer layer 186 may be disposed at lateral side portions of the hybrid fin structures 182, e.g., adjacent to or in contact with the second hybrid fin dielectric layer 174. The dielectric spacer layer 186 may be, for example, a silicon nitride (SiN) layer.

While the hybrid fin structures 182 are illustrated in FIG. 1C as having a substantially flat upper surface (e.g., at the upper surface of the first and third hybrid fin dielectric layers 174, 178), embodiments provided herein are not limited thereto. In various embodiments, the upper surface of the hybrid fin structures 182 may have various different shapes and sizes.

In some embodiments, the hybrid fin structures 182 may have a width 235 that is less than 200 nm. In some embodiments, the width 235 may be less than 150 nm. In some embodiments, the width 235 may be less than 100 nm.

In some embodiments, the width 235 of the hybrid fin structures 182 may be between 15 nm and 100 nm.

In some embodiments, a dielectric liner layer 212 is formed on the top portions of the gate electrodes 216. A dielectric cap layer 218 is formed on the dielectric liner layer 212. The dielectric cap layer 218 may include silicon oxide or other suitable dielectric materials. As shown in FIG. 1A, the dielectric cap layer 218 may include a plurality of dielectric strips generally extending along a same direction and substantially parallel to one another.

In some embodiments, the semiconductor device 100 includes dielectric breaks 223 which may be inserted into or between source/drain contacts 220 in order to isolate some transistors from others. The dielectric breaks 223 can include an oxide such as silicon oxide, a nitride such as silicon nitride, or other dielectric materials. In some embodiments, the dielectric breaks 223 are formed over one or more of the hybrid fin structures 223, as shown in FIG. 1B.

In some embodiments, the transistors 104 may have a pitch 231 spanning from an edge of a gate electrode 216 to a corresponding edge of an adjacent gate electrode 216 that is less than 75 nm. In some embodiments, the pitch 231 may be less than 60 nm. In some embodiments, the pitch 231 is between 39 nm and 54 nm.

In some embodiments, the first, second, and third hybrid fin dielectric layers 172, 174, 178 are silicon oxycarbonitride (SiOCN) layers, with each of the first, second, and third hybrid fin dielectric layers 172, 174, 178 having different ratios or different concentrations of at least one of Si, O, C, or N with respect to one another. This results in a hybrid fin structure 182 having good qualities for use in a transistor (e.g., high thermal stability and excellent step coverage), while providing a low dielectric material capable of reducing or preventing current leakage between neighboring transistors.

The semiconductor device 100 utilizes hybrid fin structures 182 that include non-high-K dielectric materials to improve the performance and manufacturing processes of the transistors 104. The hybrid fin structures 182 may be formed with a lower height as compared to hybrid fin structures which utilize a high-K dielectric material. Moreover, by forming the semiconductor device 100 using non-high-K dielectric materials in the hybrid fin, costs are reduced as the materials and processes may be less costly and more efficient, and process risks associated with high-K dielectric hybrid fins may be avoided.

Figure 2A:
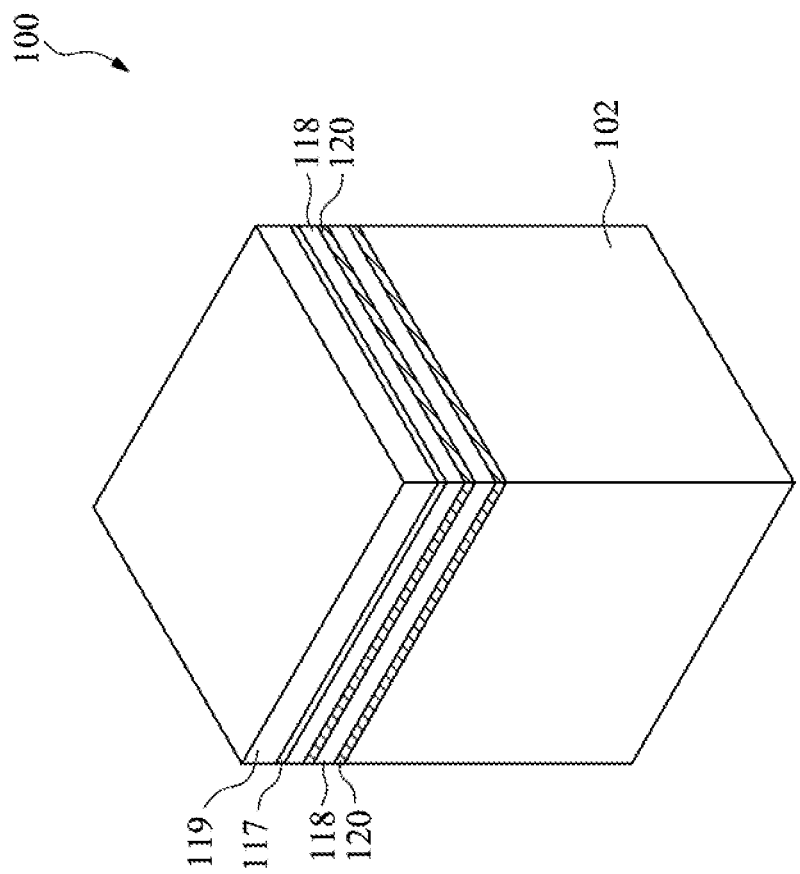
FIGS. 2A-2Q are cross-sectional and perspective views of a semiconductor device at various stages of processing, in accordance with some embodiments.
Figure 2C:
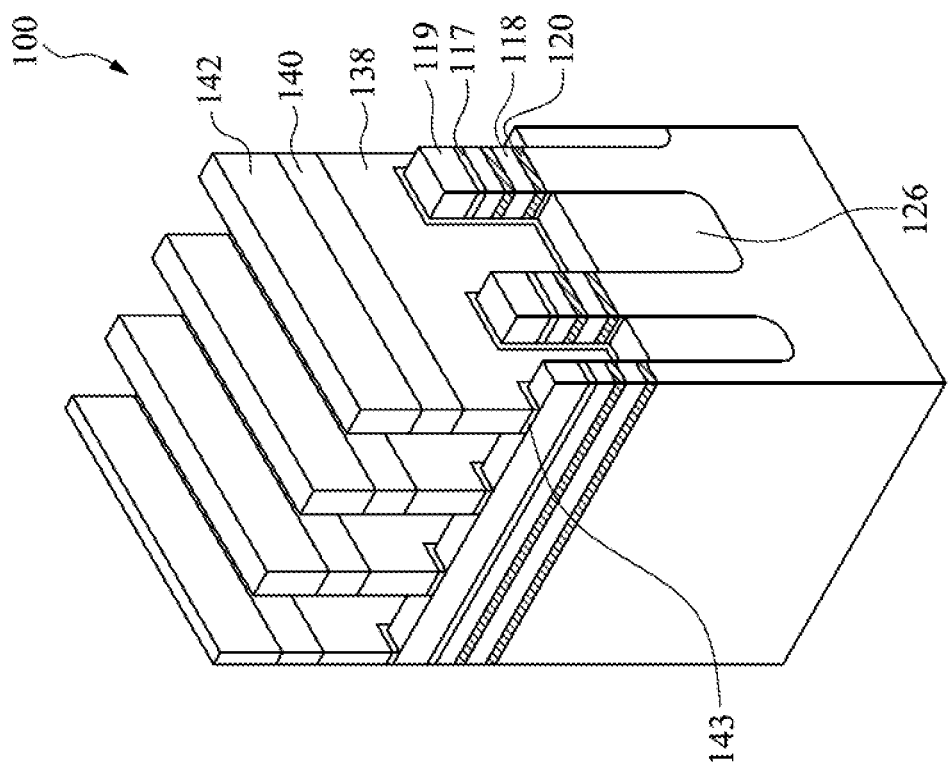
Figure 2B:
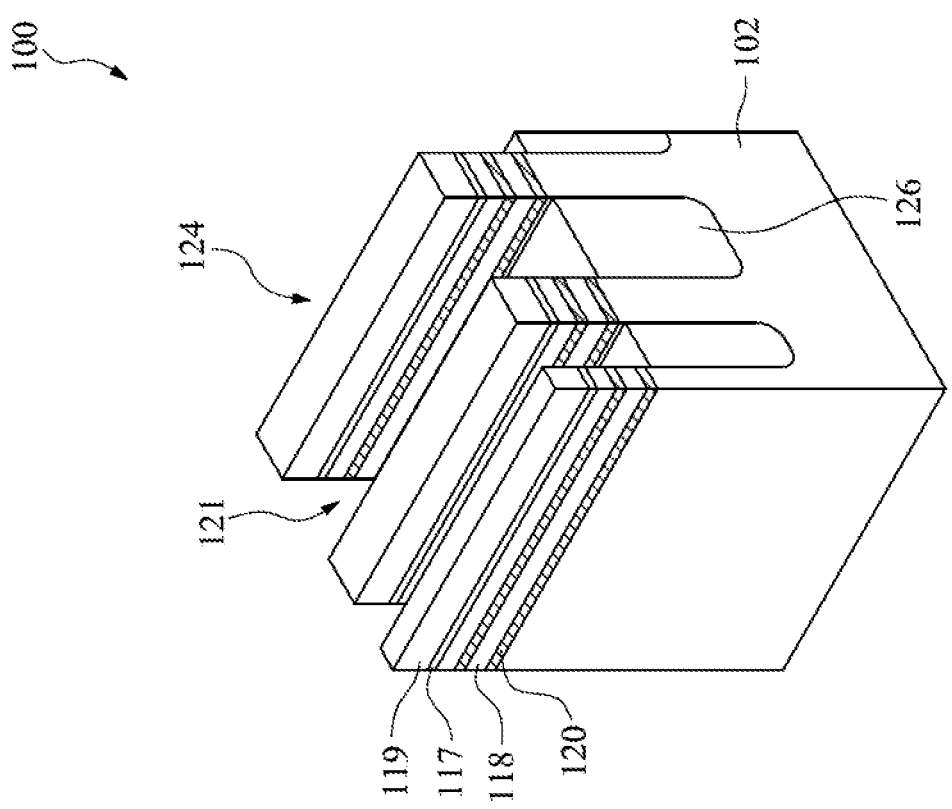
Figure 2E:
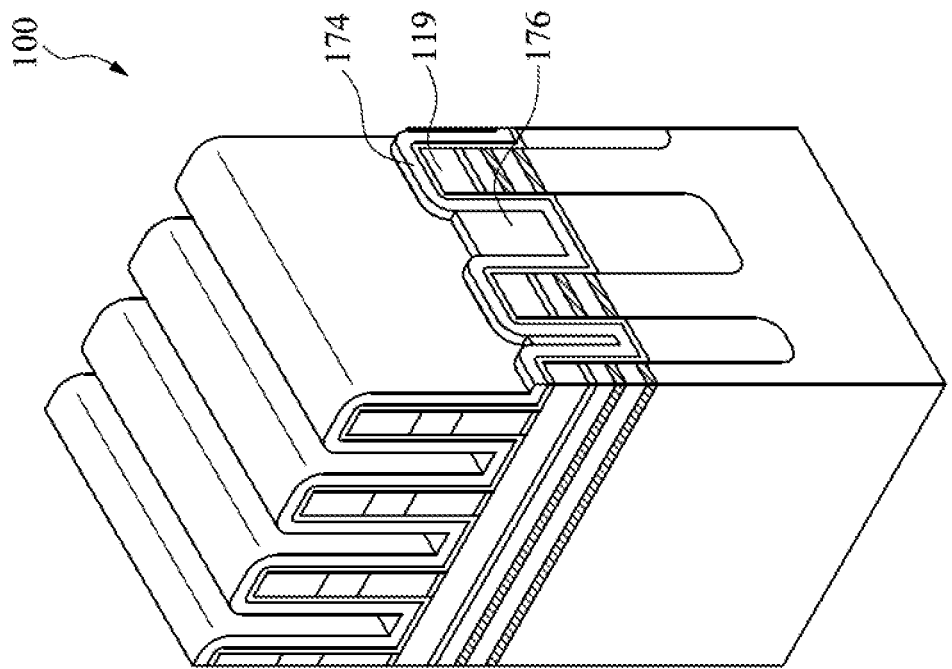
Figure 2D:
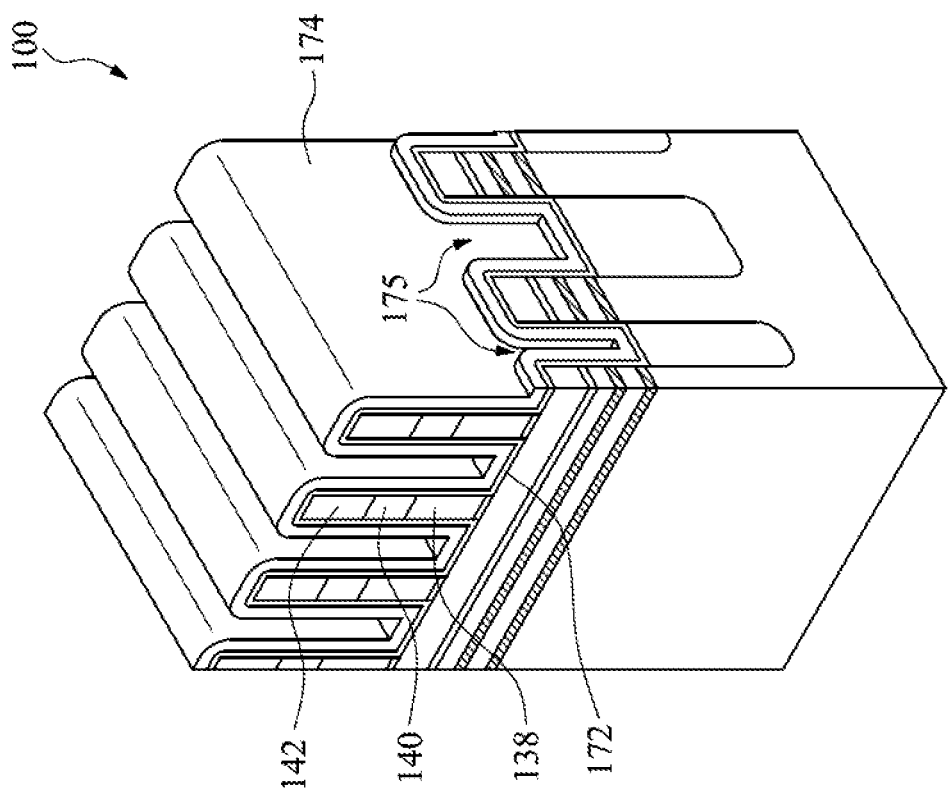
Figure 2G:
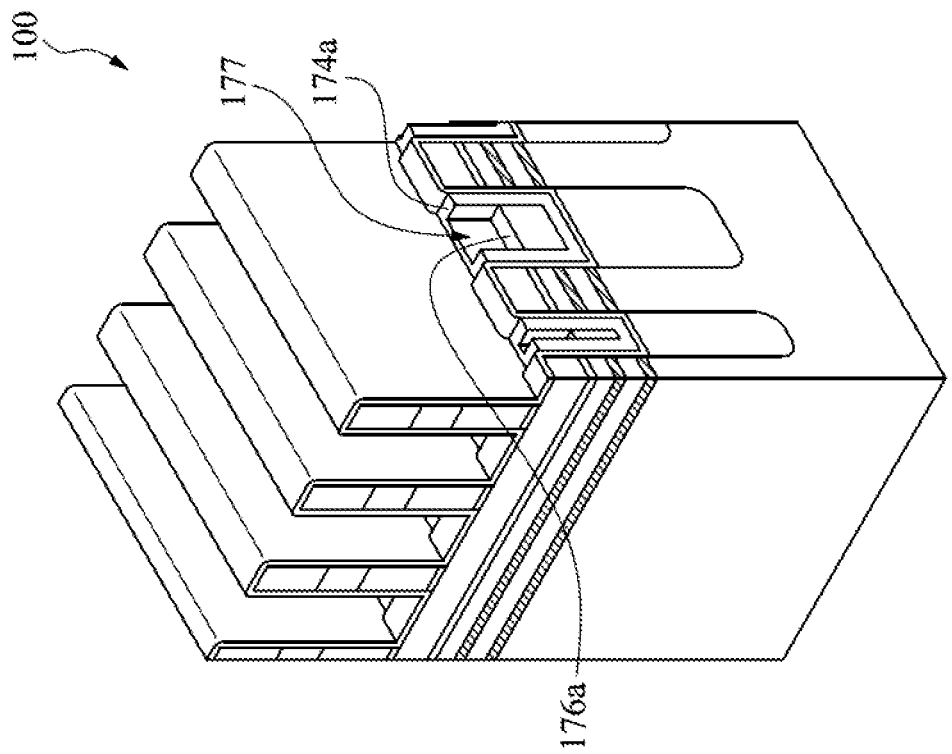
Figure 2F:
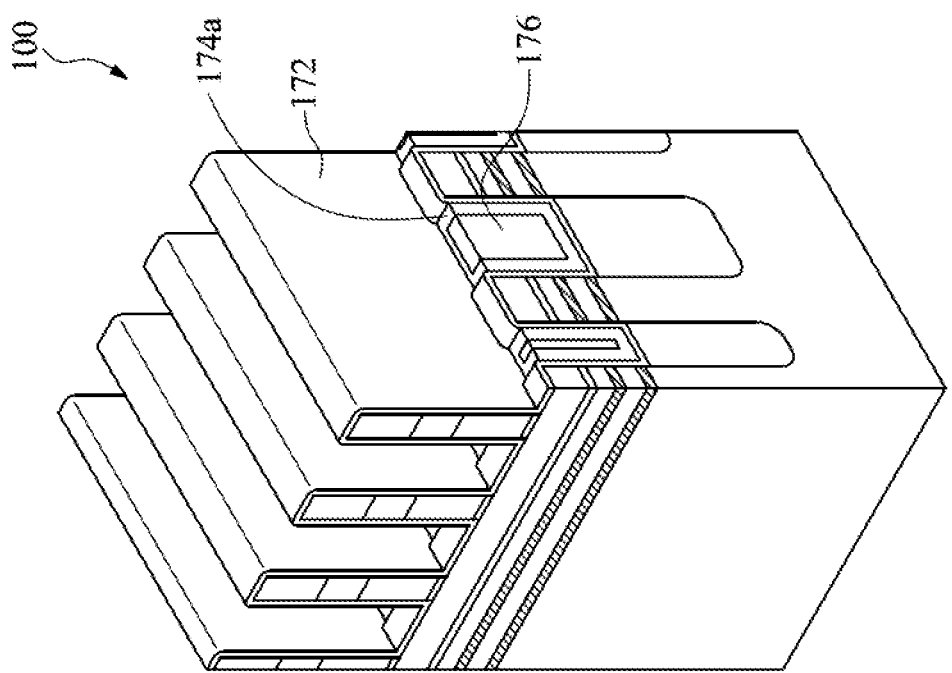
Figure 2I:
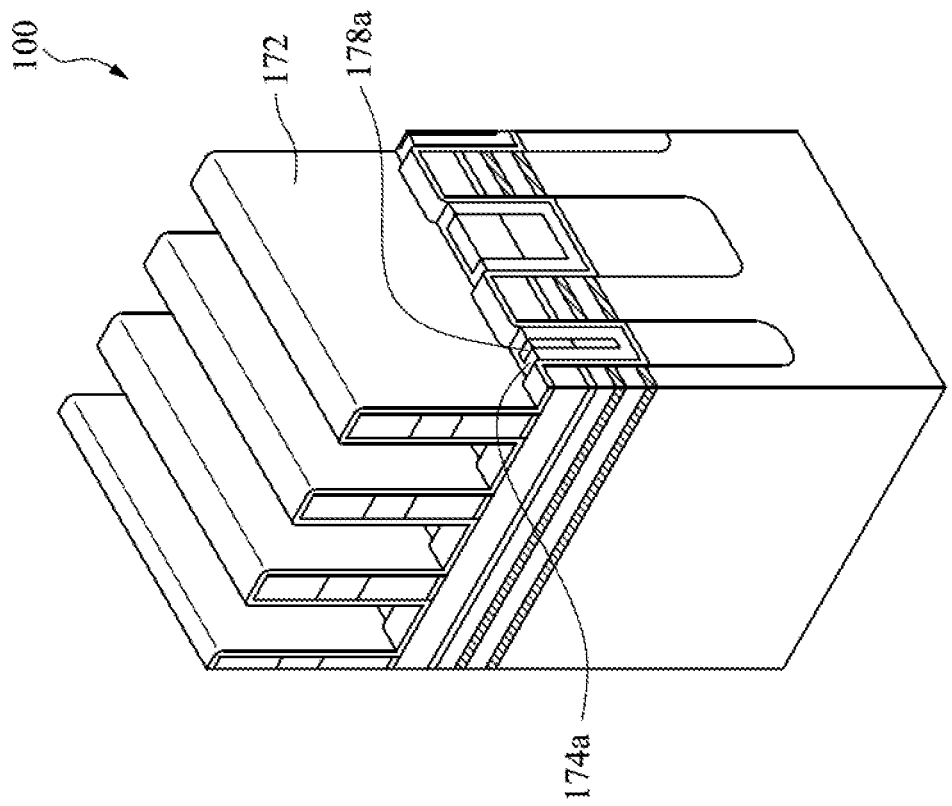
Figure 2H:
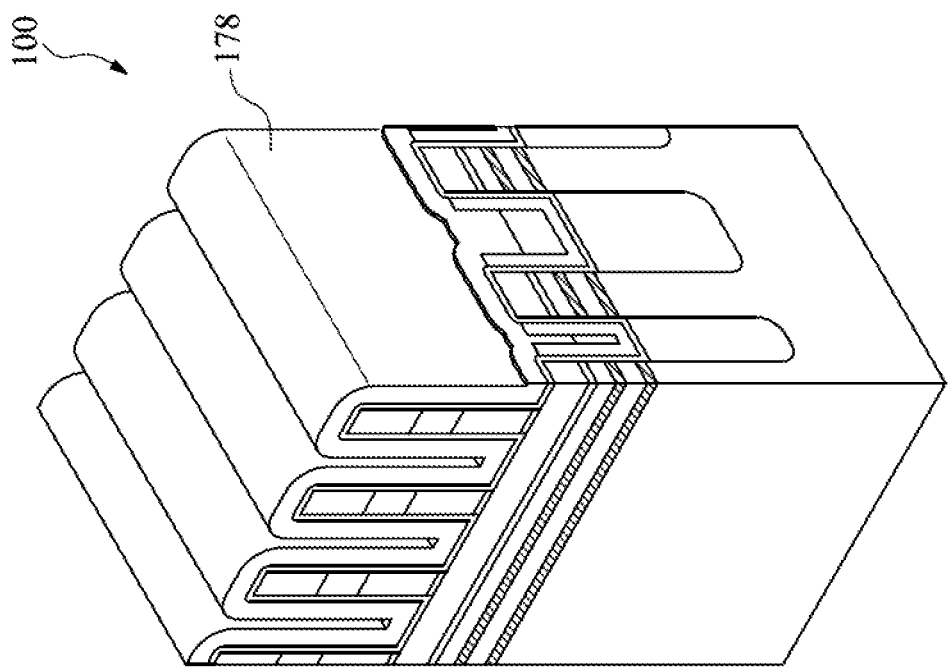
Figure 2K:
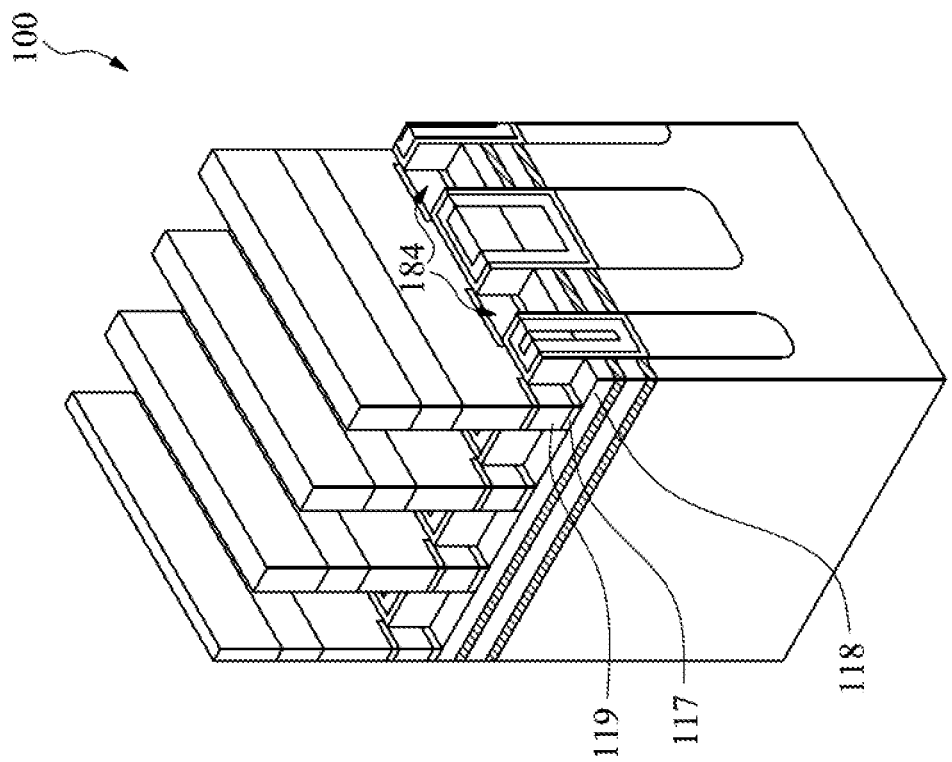
Figure 2J:
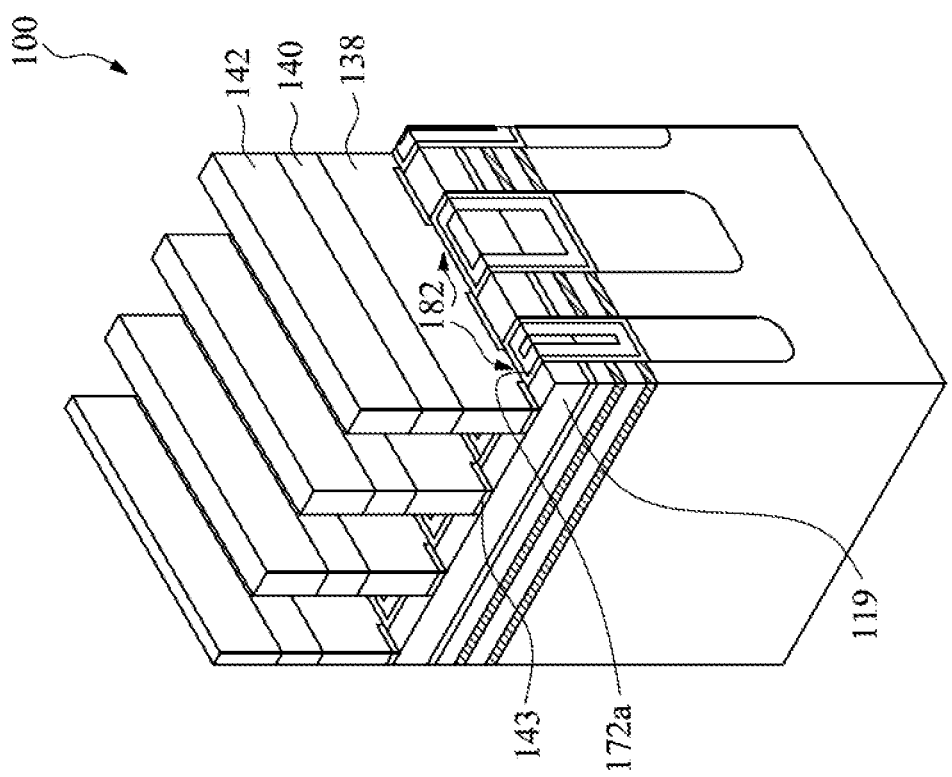
Figure 2M:
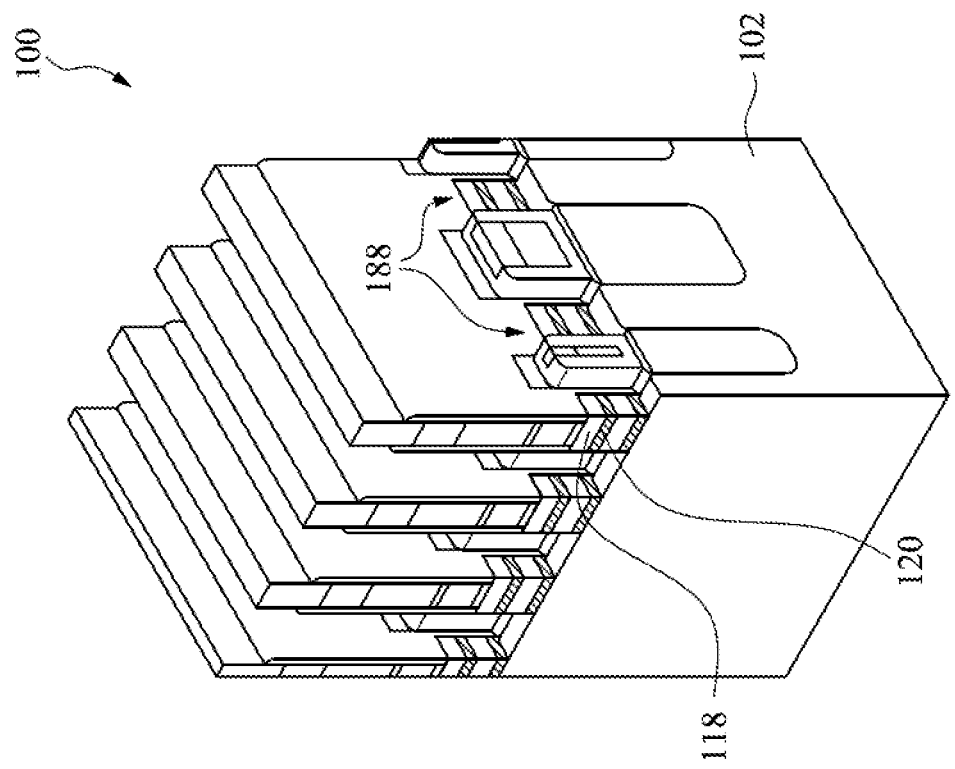
Figure 2L:
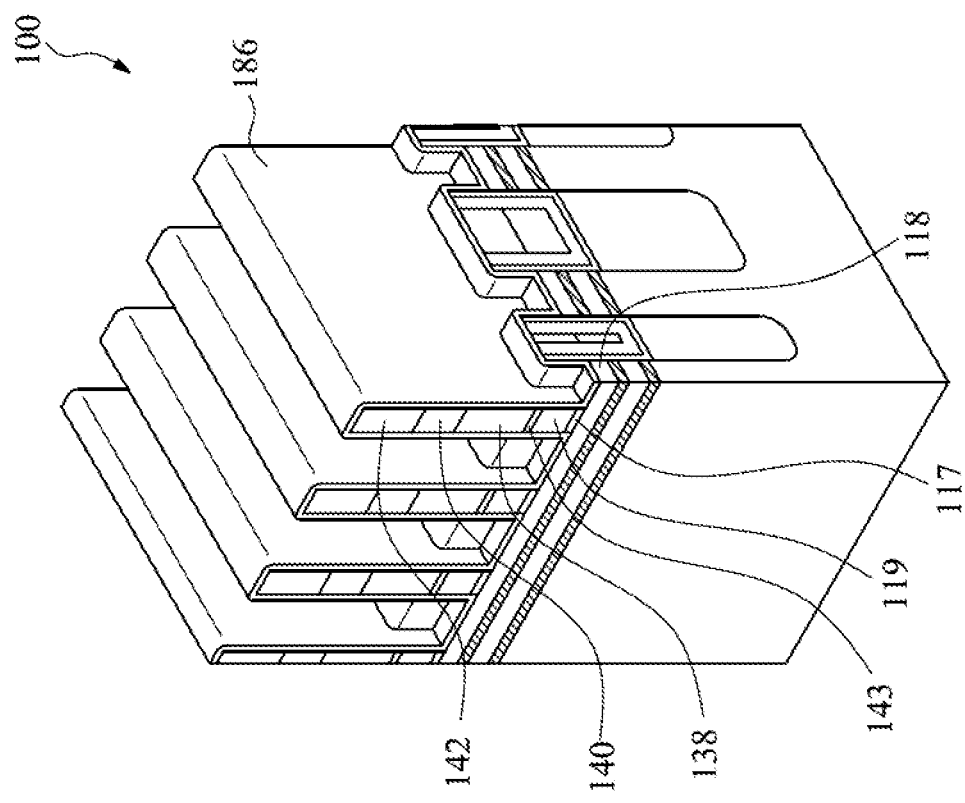
Figure 2O:
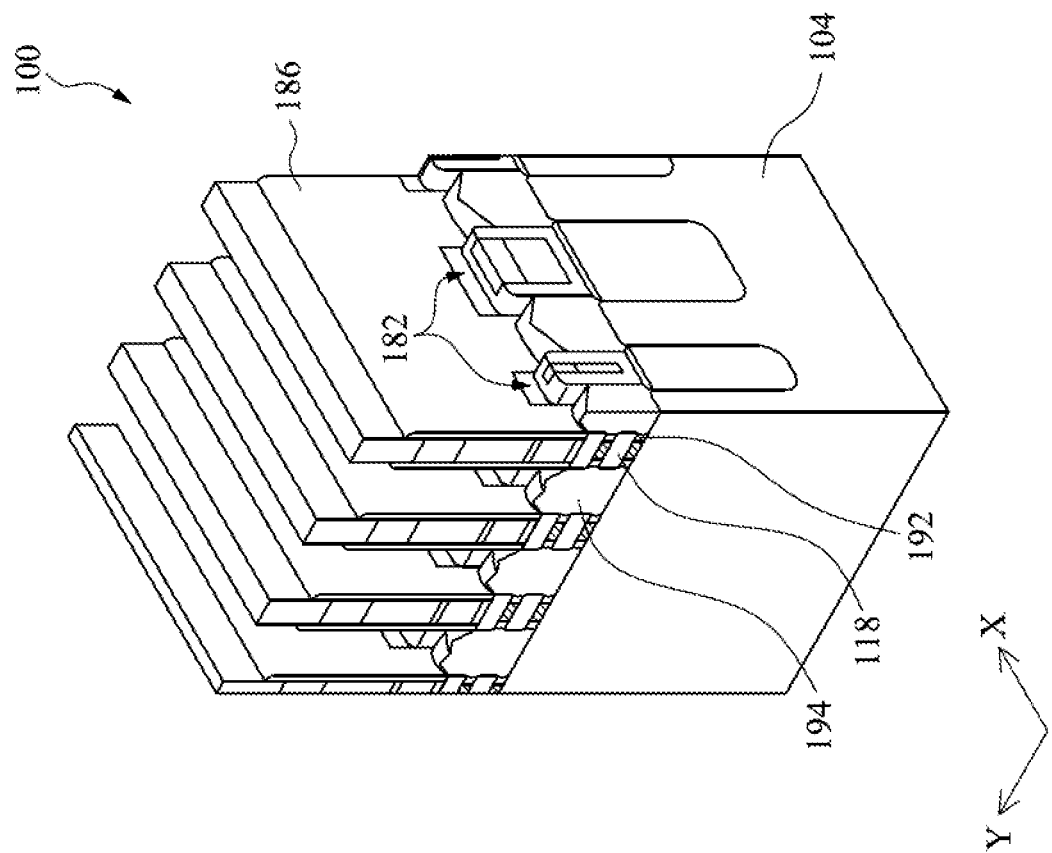
Figure 2N:
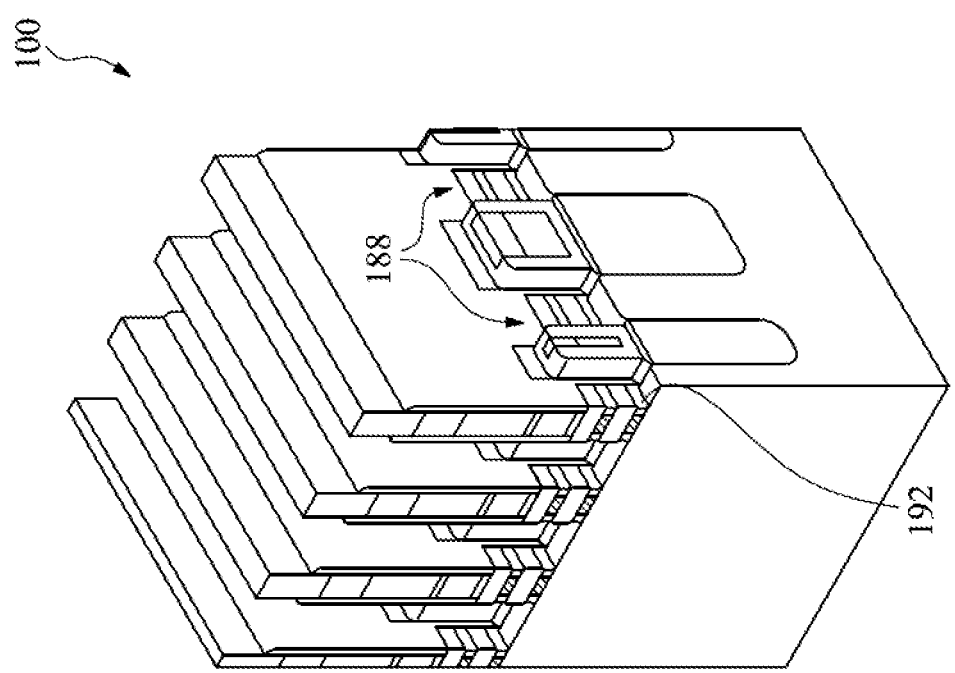
Figure 2Q:
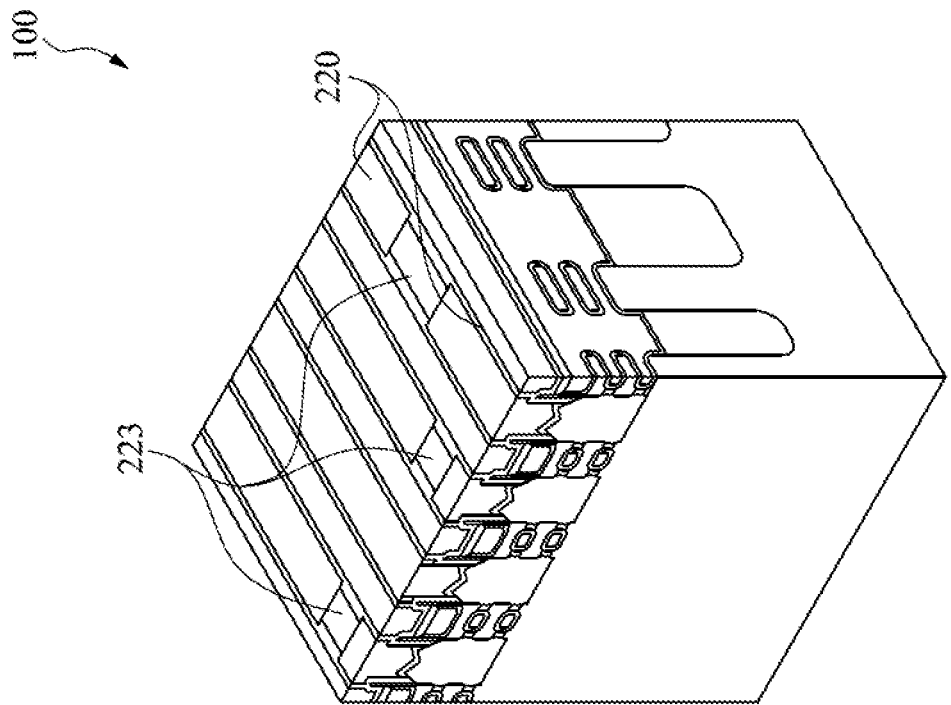

FIGS. 2A-2Q are cross-sectional views of the semiconductor device 100 at various stages of processing, according to some embodiments. FIGS. 2A-2Q illustrate an exemplary process for producing a semiconductor device that includes nanostructure transistors. FIGS. 2A-2Q illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

As shown in FIG. 2A, the semiconductor device 100 includes a semiconductor substrate 102. In some embodiments, the substrate 102 includes a semiconductor material. The semiconductor material may include a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants may include, for example, boron ($BF_2$) for an n-type transistor and phosphorus for a p-type transistor.

A plurality of semiconductor layers 118 are formed on the substrate 102. The semiconductor layers 118 are layers of semiconductor material. The semiconductor layers 118 correspond to the channel regions of the gate all around transistors that will result from the process described herein. The semiconductor layers 118 may be formed over the substrate 102. In various embodiments, the semiconductor layers 118 may include one or more layers of Si, Ge, SiGe, GaAs, InSb, GaP, GaSb, InAlAs, InGaAs, GaSbP, GaAsSb or InP. In some embodiments, the semiconductor layers 118 are formed of the same semiconductor material as the substrate 102. Other semiconductor materials can be utilized for the semiconductor layers 118 without departing from the scope of the present disclosure. In some embodiments, the semiconductor layers 118 are silicon layers and the substrate 102 is a silicon substrate.

A plurality of sacrificial semiconductor layers 120 are formed between the semiconductor layers 118. In some embodiments, the sacrificial semiconductor layers 120 include a different semiconductor material than the semiconductor layers 118. In an example in which the semiconductor layers 118 include silicon, the sacrificial semiconductor layers 120 may include SiGe. In one example, the silicon germanium sacrificial semiconductor layers 120 may include between 20% and 30% germanium, though other concentrations of germanium can be utilized without departing from the scope of the present disclosure.

In some embodiments, the semiconductor layers 118 and the sacrificial semiconductor layers 120 are formed by alternating epitaxial growth processes from the semiconductor substrate 102. For example, a first epitaxial growth process may result in the formation of the lowest sacrificial semiconductor layer 120 on the top surface of the substrate 102. A second epitaxial growth process may result in the formation of the lowest semiconductor layer 118 on the top surface of the lowest sacrificial semiconductor layer 120. A third epitaxial growth process results in the formation of the second lowest sacrificial semiconductor layer 120 on top of the lowest semiconductor layer 118. Alternating epitaxial growth processes are performed until a selected number of semiconductor layers 118 and sacrificial semiconductor layers 120 have been formed.

In some embodiments, the vertical thickness of the semiconductor layers 118 may be between 2 nm and 15 nm. Similarly, in some embodiments, the vertical thickness of the sacrificial semiconductor layers 120 may be between 5 nm and 15 nm. Other thicknesses and materials can be utilized for the semiconductor layers 118 and the sacrificial semiconductor layers 120 without departing from the scope of the present disclosure.

As will be set forth in more detail below, the sacrificial semiconductor layers 120 will be patterned to become semiconductor nanostructures of gate all around transistors. The semiconductor nanostructures will correspond to channel regions of the gate all around transistors.

In one embodiment, the sacrificial semiconductor layers 120 correspond to a first sacrificial epitaxial semiconductor region having a first semiconductor composition. In subsequent steps, the sacrificial semiconductor layers 120 will be removed and replaced with other materials and structures. For this reason, the semiconductor layers 120 are described as sacrificial.

As shown in FIG. 2A, an oxide layer 117 is formed on an uppermost one of the semiconductor layers 118. In various embodiments, the oxide layer 117 may be formed of any oxide material. In some embodiments, the oxide layer 117 includes silicon oxide. The oxide layer 117 may have any suitable thickness. In some embodiments, the thickness of the oxide layer 117 is less than 50 nm. In some embodiments, the thickness of the oxide layer 117 is less than 20 nm. In some embodiments, the thickness of the oxide layer 117 is between 1 nm and 5 nm.

An upper semiconductor layer 119 is formed on the oxide layer 117. The upper semiconductor layer 119 may be formed of any suitable semiconductor material. In some embodiments, the upper semiconductor layer 119 is formed of a same material as the semiconductor layers 118 or the substrate 102. Other semiconductor materials can be utilized for the upper semiconductor layer 119 without departing from the scope of the present disclosure. In some embodiments, the upper semiconductor layer 119, the semiconductor layers 118, and the substrate 102 are formed of silicon.

As shown in FIG. 2B, trenches 121 are formed in the structure shown in FIG. 2A. More particularly, the trenches 121 are formed to extend through the upper semiconductor layer 119, the oxide layer 117, the semiconductor layers 118, the sacrificial semiconductor layers 120, and at least partially into the substrate 102. The trenches 121 may be formed by any suitable technique, including, for example, by patterning and etching the trenches. In some embodiments, the trenches 121 may be formed by depositing a hard mask layer (not shown) on the upper semiconductor layer 121 and patterning and etching the hard mask using standard photolithography processes. The hard mask layer may include one or more of aluminum, AlO, SiN, or other suitable materials. The hard mask layer may have a thickness between 5 nm and 50 nm, in some embodiments. The hard mask layer may be deposited by a PVD process, an ALD process, a CVD process, or other suitable deposition processes. The hard mask layer may have other thicknesses, materials, and deposition processes without departing from the scope of the present disclosure.

After the hard mask layer has been patterned and etched, the upper semiconductor layer 119, the oxide layer 117, the semiconductor layers 118, the sacrificial semiconductor layers 120, and the substrate 102 may be etched at the locations that are not covered by the hard mask layer. The etching process results in formation of the trenches 121. The etching process can include multiple etching steps. For example, a first etching step may be implemented to etch the upper semiconductor layer 119. A second etching step may be implemented to etch the oxide layer 117. A third etching step may be implemented to etch the top semiconductor layer 118, and a fourth etching step may be implemented to etch the top sacrificial semiconductor layer 120. The etching steps may be alternately performed until the upper semiconductor layer 119, the oxide layer 117, the semiconductor layers 118, the sacrificial semiconductor layers 120, and the substrate 102 have been suitably etched at the exposed regions. In other embodiments, the trenches 121 may be formed in a single etching process.

The trenches 121 define a plurality of fins 124, each of which includes respective portions of the upper semiconductor layer 119, the oxide layer 117, the semiconductor layers 118, and the sacrificial semiconductor layers 120. Each of the fins 124 corresponds to a separate gate all around transistor that will eventually result from further processing steps described herein. In particular, the semiconductor layers 118 in each column or stack will correspond to the channel regions of a particular gate all around nanosheet transistor.

While FIG. 2B illustrates the formation of three fins 124, it will be readily appreciated that in various embodiments, fewer or more than three fins 124 may be formed in the semiconductor device 100.

As shown in FIG. 2B, shallow trench isolation structures 126 are formed in the trenches 121. The shallow trench isolation structures 126 may be formed by any suitable technique. In some embodiments, the shallow trench isolation structures 126 may be formed by depositing a dielectric material in the trenches 121 and by recessing the deposited dielectric material so that a top surface of the dielectric material is below a level of the lowest sacrificial semiconductor layer 120. The hard mask may be removed, for example, after formation of the shallow trench isolation structures 126.

The shallow trench isolation structures 126 may be utilized to separate individual transistors or groups of transistors groups of transistors formed in conjunction with the semiconductor substrate 102. The dielectric material for the shallow trench isolation structures 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation structures 126 without departing from the scope of the present disclosure.

As shown in FIG. 2C, a polysilicon layer 138 has been formed on the top surfaces of the upper semiconductor layer 119 and the shallow trench isolation structures 126. Moreover, the polysilicon layer 138 may extend at least partially into the trench and contact side surfaces of the upper semiconductor layer 119, the oxide layer 117, the semiconductor layers 118, and the sacrificial semiconductor layers 120. In some embodiments, the polysilicon layer 138 may have a thickness between 20 nm and 100 nm. The polysilicon layer 138 may be formed by any suitable technique, including, for example, by deposition, epitaxial growth, a CVD process, a physical vapor deposition (PVD) process, or an ALD process. Other thicknesses and processes can be used for forming the polysilicon layer 138 without departing from the scope of the present disclosure.

A dielectric layer 140 is formed on the polysilicon layer 138, and a dielectric layer 142 is formed on the dielectric layer 140. In one example, the dielectric layer 142 includes silicon nitride. In one example, the dielectric layer 140 includes silicon oxide. In some embodiments, the dielectric layers 140 and 142 may be deposited by CVD. In some embodiments, the dielectric layer 140 may have a thickness between 5 nm and 15 nm. In some embodiments, the dielectric layer 142 may have a thickness between 15 nm and 50 nm. Other thicknesses, materials, and deposition processes may be utilized for the dielectric layers 140 and 142 without departing from the scope of the present disclosure.

In some embodiments, the dielectric layers 140 and 142 may be patterned and etched to form a hard mask for the polysilicon layer 138. The dielectric layers 140 and 142 may be patterned and etched, for example, using standard photolithography processes. After the dielectric layers 140 and 142 have been patterned and etched to form the hard mask, the polysilicon layer 138 may be etched so that only the portions of the polysilicon layer 138 directly below the dielectric layers 140 and 142 remains.

In some embodiments, a thin dielectric layer 143 may be formed, e.g., by deposition or any other suitable technique, prior to formation of the polysilicon layer 138. In such embodiments, the thin dielectric layer 143 may be formed on the top surfaces of the upper semiconductor layer 119 and the shallow trench isolation structures 126, and the thin dielectric layer 143 may extend at least partially into the trench and contact side surfaces of the upper semiconductor layer 119, the oxide layer 117, the semiconductor layers 118, and the sacrificial semiconductor layers 120. The thin dielectric layer 143 may have a thickness between 1 nm and 5 nm, in some embodiments. In some embodiments, the thin dielectric layer 143 may include or be formed of silicon oxide. Other materials, deposition processes, and thicknesses may be utilized for the thin dielectric layer 143 without departing from the scope of the present disclosure.

As shown in FIG. 2D, a first hybrid fin dielectric layer 172 is formed on the structure of the semiconductor device 100 resulting from the process shown with respect to FIG. 2C. The first hybrid fin dielectric layer 172 may be formed by any suitable technique, and in some embodiments, the first hybrid fin dielectric layer 172 is formed by deposition. The first hybrid fin dielectric layer 172 may be formed on and in contact with an upper surface of the dielectric layer 142, and on side surfaces of each of the dielectric layer 142, the dielectric layer 140, the polysilicon layer 138, and the thin dielectric layer 143. Moreover, the first hybrid fin dielectric layer 172 may extend over the upper surface of the upper semiconductor layer 119 and on side surfaces of the upper semiconductor layer 119, the oxide layer 117, the semiconductor layers 118, and the sacrificial semiconductor layers 118 in the trench 124. In some embodiments, the first hybrid fin dielectric layer 172 contacts an upper surface of the shallow trench isolation structure 126 in the trench 124.

The first hybrid fin dielectric layer 172 may be formed of any suitable dielectric material. In some embodiments, the first hybrid fin dielectric layer 172 is formed of a silicon-based low-K dielectric material. In some embodiments, the first hybrid fin dielectric layer 172 includes silicon (Si), oxygen (O), carbon (C) and nitrogen (N). In some embodiments, the first hybrid fin dielectric layer 172 is a silicon oxycarbonitride (SiOCN) layer. In some embodiments, the first hybrid fin dielectric layer 172 may be deposited by CVD, ALD, or other suitable processes. Other materials and processes can be utilized for the first hybrid fin dielectric layer 172 without departing from the scope of the present disclosure.

The first hybrid fin dielectric layer 172 may have a thickness of less than 50 nm in some embodiments. In some embodiments, the first hybrid fin dielectric layer 172 has a thickness that is less than 30 nm. In some embodiments, the first hybrid fin dielectric layer 172 has a thickness that is less than 10 nm. In some embodiments, the first hybrid fin dielectric layer 172 has a thickness between 1 nm and 5 nm.

A second hybrid fin dielectric layer 174 is formed on the first hybrid fin dielectric layer 172. For example, as shown in FIG. 2D, the second hybrid fin dielectric layer 174 may cover the first hybrid fin dielectric layer 172 and may extend into the trench 124.

The second hybrid fin dielectric layer 174 may be formed of any suitable dielectric material. In some embodiments, the second hybrid fin dielectric layer 174 is formed of a silicon-based low-K dielectric material that is different from the dielectric material of the first hybrid fin dielectric layer 172. In some embodiments, the second hybrid fin dielectric layer 174 includes silicon (Si), oxygen (O), carbon (C) and nitrogen (N). In some embodiments, the first hybrid fin dielectric layer 172 is a SiOCN layer, and the second hybrid fin dielectric layer 174 is a SiOCN layer having a different ratio or a different concentration of at least one of Si, O, C, or N than that of the first hybrid fin dielectric layer 172. In some embodiments, the second hybrid fin dielectric layer 174 may be deposited by CVD, ALD, or other suitable processes. Other materials and processes can be utilized for the second hybrid fin dielectric layer 174 without departing from the scope of the present disclosure.

The second hybrid fin dielectric layer 174 may have a thickness of less than 50 nm in some embodiments. In some embodiments, the second hybrid fin dielectric layer 174 has a thickness that is less than 30 nm. In some embodiments, the second hybrid fin dielectric layer 174 has a thickness that is less than 10 nm. In some embodiments, the second hybrid fin dielectric layer 174 has a thickness between 1 nm and 5 nm. In some embodiments, the second hybrid fin dielectric layer 174 has a thickness that is greater than a thickness of the first hybrid fin dielectric layer 172.

The second hybrid fin dielectric layer 174 may define gaps 175 within regions of the trenches 124 where the second hybrid fin dielectric layer 174 is formed on the first hybrid fin dielectric layer 172, as shown in FIG. 2D.

As shown in FIG. 2E, an oxide layer 176 is formed on the second hybrid fin dielectric layer 174. The oxide layer 176 may be formed to extend into the gaps 175. In some embodiments, the oxide layer 176 substantially fills the gaps 175 and extends over an upper edge or upper surface of the second hybrid fin dielectric layer 174. In some embodiments, portions of the oxide layer 176 are selectively removed, resulting in the structure shown in FIG. 2E with the upper surface of the oxide layer 176 being at a level that is below a level of the upper surface of the second hybrid fin dielectric layer 174 adjacent to the gaps 175. In some embodiments, the upper surface of the oxide layer 176 is substantially coplanar with the upper surface of the upper semiconductor layer 119. The portions of the oxide layer 176 may be selectively removed by any suitable technique. In some embodiments, the portions of the oxide layer 176 are selectively removed by an etching process, which may include an isotropic dry etching process or a wet etching process that selectively removes the portions of the oxide layer 176 while retaining the surrounding regions of the second hybrid fin dielectric layer 174.

As shown in FIG. 2F, portions of the second hybrid fin dielectric layer 174 are selectively removed. In particular, portions of the second hybrid fin dielectric layer 174 are removed that were previously disposed on and in contact with the first hybrid fin dielectric layer 172 (e.g., over the dielectric layer 142, the dielectric layer 140, the polysilicon layer 138, and the thin dielectric layer 143). The selective removal of portions of the second hybrid fin dielectric layer 174 exposes the underlying first hybrid fin dielectric layer 172 and defines an upper surface 174a of the second hybrid fin dielectric layer 174. The upper surface 174a of the second hybrid fin dielectric layer 174 may be substantially coplanar with the upper surface of the oxide layer 176, as shown in FIG. 2F. The portions of the second hybrid fin dielectric layer 174 may be selectively removed by any suitable technique. In some embodiments, the portions of the second hybrid fin dielectric layer 174 are selectively removed by an etching process, which may include an isotropic dry etching process or a wet etching process that selectively removes the portions of the second hybrid fin dielectric layer 174 while retaining the neighboring portions of the first hybrid fin dielectric layer 172 and the oxide layer 176. For example, an etchant used in the etching process may selectively etch the second hybrid fin dielectric layer 174 with respect to the materials of the first hybrid fin dielectric layer 172 and the oxide layer 176.

As shown in FIG. 2G, the oxide layer 176 is recessed with respect to the upper surface 174a of the second hybrid fin dielectric layer 174. The oxide layer 176 may be recessed by selectively removing portions of the oxide layer 176, for example, by an etching process which may include an isotropic dry etching process or a wet etching process. For example, an etchant used in the etching process may selectively etch the oxide layer 176 with respect to the materials of the first and second hybrid fin dielectric layers 172, 174.

The selective removal of the oxide layer 176 forms recesses 177 and results in the oxide layer 176 having an upper surface 176a that is recessed with respect to the upper surface of the upper semiconductor layer 119, as shown. In some embodiments, the recesses 177 may have a height (e.g., a vertical distance between the upper surface 176a of the oxide and the upper surface 174a of the second hybrid fin dielectric layer 174) that is less than 50 nm. In some embodiments, the recesses 177 may have a height that is less than 30 nm.

As shown in FIG. 2H, a third hybrid fin dielectric layer 178 is formed on the structure of the semiconductor device 100 resulting from the process shown with respect to FIG. 2G. The third hybrid fin dielectric layer 178 may be formed by any suitable technique, and in some embodiments, the third hybrid fin dielectric layer 178 is formed by deposition.

The third hybrid fin dielectric layer 178 may be formed of any suitable dielectric material. In some embodiments, the third hybrid fin dielectric layer 178 is formed of a silicon-based low-K dielectric material that is different from the dielectric material of both the first hybrid fin dielectric layer 172 and the second hybrid fin dielectric layer 174. In some embodiments, the third hybrid fin dielectric layer 178 includes silicon (Si), oxygen (O), carbon (C) and nitrogen (N). In some embodiments, the first, second, and third hybrid fin dielectric layers 172, 174, 178 are SiOCN layers, with each of the first, second, and third hybrid fin dielectric layers 172, 174, 178 having different ratios or different concentrations of at least one of Si, O, C, or N with respect to one another. In some embodiments, the third hybrid fin dielectric layer 178 may be deposited by CVD, ALD, or other suitable processes. Other materials and processes can be utilized for the third hybrid fin dielectric layer 178 without departing from the scope of the present disclosure.

As shown in FIG. 2H, the third hybrid fin dielectric layer 178 may contact the upper surface 176a of the oxide layer 176 and may fill or substantially fill the recesses 177.

As shown in FIG. 2I, portions of the third hybrid fin dielectric layer 178 are selectively removed. In particular, portions of the third hybrid fin dielectric layer 178 are removed that were previously disposed on and in contact with the first hybrid fin dielectric layer 172. That is, the third hybrid fin dielectric layer 178 is removed except for portions of the third hybrid fin dielectric layer 178 which fill the recesses 177. The selective removal of portions of the third hybrid fin dielectric layer 178 exposes the upper surface 174a of the second hybrid fin dielectric layer 174 and defines an upper surface 178a of the third hybrid fin dielectric layer 178. The upper surface 178a of the third hybrid fin dielectric layer 178 may be substantially coplanar with the upper surface 174a of the second hybrid fin dielectric layer 174, as shown in FIG. 2I.

The portions of the third hybrid fin dielectric layer 178 may be selectively removed by any suitable technique. In some embodiments, the portions of the third hybrid fin dielectric layer 178 are selectively removed by an etching process, which may include an isotropic dry etching process or a wet etching process that selectively removes the portions of the third hybrid fin dielectric layer 178 while retaining the neighboring portions of the first and second hybrid fin dielectric layers 172, 174. For example, an etchant used in the etching process may selectively etch the third hybrid fin dielectric layer 178 with respect to the materials of the first and second hybrid fin dielectric layers 172, 174.

As shown in FIG. 2J, hybrid fin structures 182 are formed by selectively removing portions of the first hybrid fin dielectric layer 172 that were previously disposed on and in contact with the upper surface of the dielectric layer 142, the upper surface of the upper semiconductor layer 119, and on and in contact with side surfaces of each of the dielectric layer 142, the dielectric layer 140, the polysilicon layer 138, and the thin dielectric layer 143. The selective removal of portions of the first hybrid fin dielectric layer 172 exposes the upper surface of the upper semiconductor layer 119 and defines an upper surface 172a of the first hybrid fin dielectric layer 172 at the top of the hybrid fin structures 182.

In some embodiments, the portions of the first hybrid fin dielectric layer 172 are selectively removed by an etching process that selectively removes the portions of the first hybrid fin dielectric layer 172 while retaining the underlying layers (e.g., the upper semiconductor layer 119, the dielectric layer 142, the dielectric layer 140, the polysilicon layer 138, the thin dielectric layer 143, and the first and second hybrid fin dielectric layers 172, 174).

As shown in FIG. 2K, recesses 184 are formed by selectively removing portions of the upper semiconductor layer 119 and the oxide layer 117. The portions of the upper semiconductor layer 119 and the oxide layer 117 may be selectively removed by any suitable technique. In some embodiments, the portions of the upper semiconductor layer 119 and the oxide layer 117 are selectively removed by an etching process that selectively removes the portions of the upper semiconductor layer 119 and the oxide layer 117 while retaining the neighboring portions of the first, second, and third hybrid fin dielectric layers 172, 174, 178 at the top of the hybrid fin structures 182. For example, an etchant used in the etching process may selectively etch the upper semiconductor layer 119 and the oxide layer 117 with respect to the materials of the first, second, and third hybrid fin dielectric layers 172, 174, 178.

The selective removal of the portions of the upper semiconductor layer 119 and the oxide layer 117 exposes an upper surface of the uppermost one of the semiconductor layers 118, which defines a floor of the recesses 184 as shown in FIG. 2K.

As shown in FIG. 2L, a dielectric spacer layer 186 is formed over the structure of the semiconductor device 100 resulting from the process shown with respect to FIG. 2K. The dielectric spacer layer 186 may be formed by any suitable technique, and in some embodiments, the dielectric spacer layer 186 is formed by deposition. The dielectric spacer layer 186 may be formed on and in contact with an upper surface of the dielectric layer 142, and on side surfaces of each of the dielectric layer 142, the dielectric layer 140, the polysilicon layer 138, the thin dielectric layer 143, the upper semiconductor layer 119, and the oxide layer 117. Moreover, the dielectric spacer layer 186 may extend over the upper surface of the uppermost one of the semiconductor layers 118 and on the hybrid fin structure 182.

The dielectric spacer layer 186 may be formed of any suitable dielectric material. In various embodiments, the dielectric material for the dielectric spacer layer 186 may include silicon oxide, silicon nitride, silicon oxynitride (SiON), SiOCN, SiCN, or any other suitable dielectric material.

As shown in FIG. 2M, source/drain recesses 188 are formed by selectively removing portions of the dielectric spacer layer 186, as well as portions of the semiconductor layers 118 and the sacrificial semiconductor layers 120 directly underlying the dielectric spacer layer 186. The formation of the source/drain recesses 188 also defines semiconductor nanostructures or nanosheets, which are the remaining portions of the semiconductor layers 118 between neighboring source/drain recesses 188.

The portions of the portions of the dielectric spacer layer 186, the semiconductor layers 118, and the sacrificial semiconductor layers 120 may be selectively removed by any suitable technique. In some embodiments, the portions of the dielectric spacer layer 186, the semiconductor layers 118, and the sacrificial semiconductor layers 120 are selectively removed by an etching process that selectively removes the portions of the dielectric spacer layer 186, the semiconductor layers 118, and the sacrificial semiconductor layers 120 while retaining the neighboring portions of the first, second, and third hybrid fin dielectric layers 172, 174, 178 at the top and sides of the hybrid fin structures 182. For example, an etchant used in the etching process may selectively etch the dielectric spacer layer 186, the semiconductor layers 118, and the sacrificial semiconductor layers 120 with respect to the materials of the first, second, and third hybrid fin dielectric layers 172, 174, 178. In some embodiments, a plurality of etching steps may be performed to successively remove the portions of the dielectric spacer layer 186, the semiconductor layers 118, and the sacrificial semiconductor layers 120.

As shown in FIG. 2N, inner spacers 192 are formed on lateral side surfaces of the sacrificial semiconductor layers 120 and between the semiconductor layers 118. The inner spacers 192 may be formed by any suitable technique. In some embodiments, the side surfaces of the sacrificial semiconductor layers 120 are laterally recessed, for example, by an etching process that forms lateral recesses in the sacrificial semiconductor layers 120 by selectively removing lateral side portions of the sacrificial semiconductor layers 120, while retaining the lateral side edges of the semiconductor layers 118. An inner spacer dielectric layer may then be formed on the recessed side surfaces of the sacrificial semiconductor layers 120 and on side surfaces of the semiconductor layers 118. The inner spacer dielectric layer may then be removed from the side surfaces of the semiconductor layers 118, while portions of the inner spacer dielectric layer remain in the lateral recesses, thus forming the inner spacers 192. The inner spacer dielectric layer may be removed by any suitable technique, such as by an etching process which may selectively etch the inner spacer dielectric layer.

The inner spacers 192 may be formed of any suitable material. In some embodiments, the inner spacers 192 are formed of a dielectric material. In some embodiments, the inner spacers 192 include silicon nitride.

As shown in FIG. 2O, source/drain regions 194 are formed in the source/drain recesses 188 and contact the side surfaces of the semiconductor layers 118 and of the inner spacers 192.

The source/drain regions 194 include semiconductor material. In some embodiments, the source/drain regions 194 may be grown epitaxially, e.g., from the semiconductor layers 118 or the substrate 102. The source/drain regions 194 can be doped with N-type dopants species in the case of N-type transistors. The source/drain regions 194 can be doped with P-type dopant species in the case of P-type transistors. The doping can be performed in-situ during the epitaxial growth.

The source/drain regions 194 may extend between and contact side surfaces of the semiconductor layers 118 of adjacent stacks of semiconductor nanostructures along a first direction (e.g., the Y-axis direction), and may extend between and contact side surfaces of adjacent hybrid fin structures 182 along a second direction (e.g., the X-axis direction) that is transverse to the first direction, as shown in FIG. 2O.

Figure 2P:
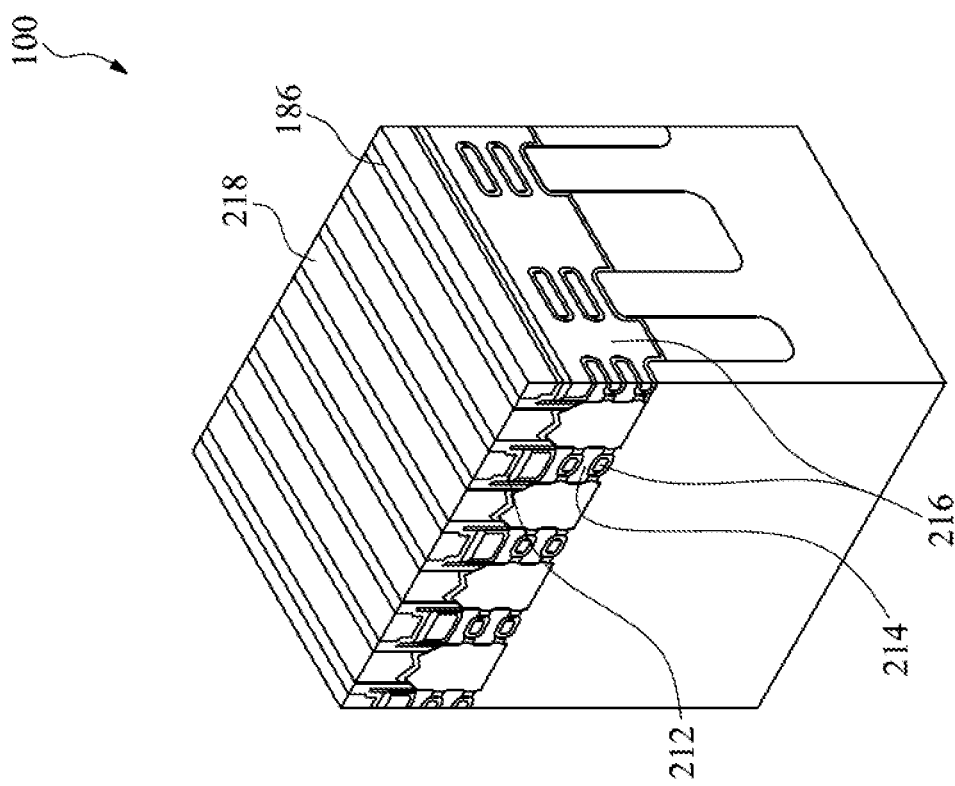

As shown in FIG. 2P, portions of the dielectric spacer layer 186 are removed, as well as corresponding materials disposed between the dielectric spacer layers 186. In some embodiments, the portions of the dielectric spacer layer 186 and the corresponding materials disposed between the dielectric spacer layers 186 are removed by a cutting process, which may include one or more of a dry etching process, a wet etching process, and a chemical mechanical planarization (CMP) process.

As shown in FIG. 2P, the remainder of the polysilicon 138, the dielectric layers 140, 142, 143, the oxide layer 117, and the upper semiconductor layer 119 have been removed. Additionally, the sacrificial semiconductor layers 120 have been removed. The sacrificial semiconductor layers 120 can be removed with an etching process that selectively etches the sacrificial semiconductor layers 120 with respect to the material of the semiconductor layers 118. After the etching process, the semiconductor layers 118 are no longer covered by sacrificial semiconductor structures.

As shown in FIG. 2P, a gate dielectric 214 is formed on the exposed surfaces of the semiconductor layers 118. The gate dielectric 214 is shown as only a single layer. However, in practice, the gate dielectric 214 may include multiple dielectric layers. For example, the gate dielectric 214 may include an interfacial dielectric layer that is in direct contact with the semiconductor layers 118. The gate dielectric 214 may include a high-K gate dielectric layer positioned on the interfacial dielectric layer. Together, the interfacial dielectric layer and the high-K gate dielectric layer form a gate dielectric 214 for the transistors of the semiconductor device 100.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. In some embodiments, the interfacial dielectric layer can have a thickness between 0.5 nm and 2 nm. Other materials, deposition processes, and thicknesses can be utilized for the interfacial dielectric layer without departing from the scope of the present disclosure.

The high-K gate dielectric layer and the interfacial dielectric layer physically separate the semiconductor layers 118 from the gate metals that will be deposited in subsequent steps. The high-K gate dielectric layer and the interfacial dielectric layer isolate the gate metals from the semiconductor layers 118 that correspond to the channel regions of the transistors.

The high-K gate dielectric layer includes one or more layers of a dielectric material, such as HfO2, HfSiO, HfSiON, HMO, HfTiO, HfZrO, zirconium oxide, aluminum oxide, titanium oxide, hafnium dioxide-alumina (HfO2—Al2O3) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor layer 118. In one embodiment, the thickness of the high-K dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

After formation of the gate dielectric 214, e.g., by deposition, a gate metal is deposited. The gate metal forms a gate electrode 216 around the semiconductor nanostructures or layers 118. The gate metal is in contact with the gate dielectric 214. The gate metal is positioned between semiconductor layers 118. In other words, the gate metal is positioned all around the semiconductor nanostructures or layers 118. For this reason, the transistors of the semiconductor device 100, e.g., the first transistor 104, formed in relation to the semiconductor nanostructures 106 and 114 are called gate all around transistors.

Although the gate electrodes 216 are each shown as a single metal layer, in practice, the gate electrodes 216 may each include multiple metal layers. For example, the gate electrodes 216 may include one or more very thin work function layers in contact with the gate dielectric 214. The thin work function layers can include titanium nitride, tantalum nitride, or other conductive materials suitable for providing a selected work function for the transistors. The gate electrodes 216 can further include a gate fill material that corresponds to the majority of the gate electrodes 216. The gate fill material can include cobalt, tungsten, aluminum, or other suitable conductive materials. The layers of the gate electrodes 216 can be deposited by PVD, ALD, CVD, or other suitable deposition processes. In some embodiments, the gate electrodes 216 are formed of one or more of titanium (Ti), titanium nitride (TiN), or tungsten (W), and in some embodiments, the gate electrodes 216 may include one or more dopant materials, such as lanthanum (La), zirconium (Zr), or hafnium (Hf).

In some embodiments, a dielectric liner layer 212 is formed on the exposed top portions of the gate electrodes 216. A dielectric cap layer 218 is formed on the dielectric liner layer 212. The dielectric cap layer 218 may include silicon oxide or other suitable dielectric materials. As shown in FIG. 2P, the dielectric cap layer 218 may include a plurality of dielectric strips generally extending along a same direction and substantially parallel to one another. The dielectric strips may extend over the gate electrodes 216, the source/drain regions 194, as well as the hybrid fin structures 182.

In some embodiments, a silicide layer may be formed on the top surfaces of the source/drain regions 194. The silicide layer may include titanium silicide, aluminum silicide, nickel silicide, tungsten silicide, or other suitable silicides.

As shown in FIG. 2Q, source/drain contacts 220 are formed on the on the source/drain regions 194, and in some embodiments, may be formed on any silicide layer which may be present on the source/drain regions 194. The source/drain contacts 220 can include a conductive material such as tungsten, titanium, aluminum, tantalum, or other suitable conductive materials.

Dielectric breaks 223 may be inserted into the source/drain contacts 220 selectively in order to isolate some transistors from others. The dielectric breaks 223 can include an oxide such as silicon oxide, a nitride such as silicon nitride, or other dielectric materials. In some embodiments, the dielectric breaks 223 are formed over one or more of the hybrid fin structures 223.

The semiconductor device 100 shown in FIGS. 1A through 1C is complete at the completion of the process shown in FIG. 2Q.

Some embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes a gate electrode over the channel region. When the gate metals of the gate electrodes are initially deposited, all of the gate electrodes may initially be electrically shorted together. Embodiments of the present disclosure advantageously electrically isolate the individual gate electrodes by utilizing gate isolation structures to cut the gate metals. The gate isolation structures are formed by forming trenches via the backside of the substrate and filling the trenches with one or more dielectric materials. The trenches cut through the gate metals between the transistors and thereby remove conductive materials that would otherwise electrically short the gate electrodes of adjacent transistors. The gate isolation structures isolate the gate electrodes from each other.

This process provides many benefits. Gate metals can be cut and hybrid fins that separate adjacent transistors can be removed in a self-aligned process. This can avoid utilizing a separate photolithography process to cut the gate metals. Furthermore, an isolation wall can replace the hybrid fin within a narrower space, thereby allowing high-density formation of transistors. Alternatively, a wider isolation wall can be utilized and achieve better isolation capability. Furthermore, transistor heights can be reduced utilizing this process. All of this results in more cost-effective and efficient formation of transistors, better functioning transistors, and higher wafer yields.

Figure 3:
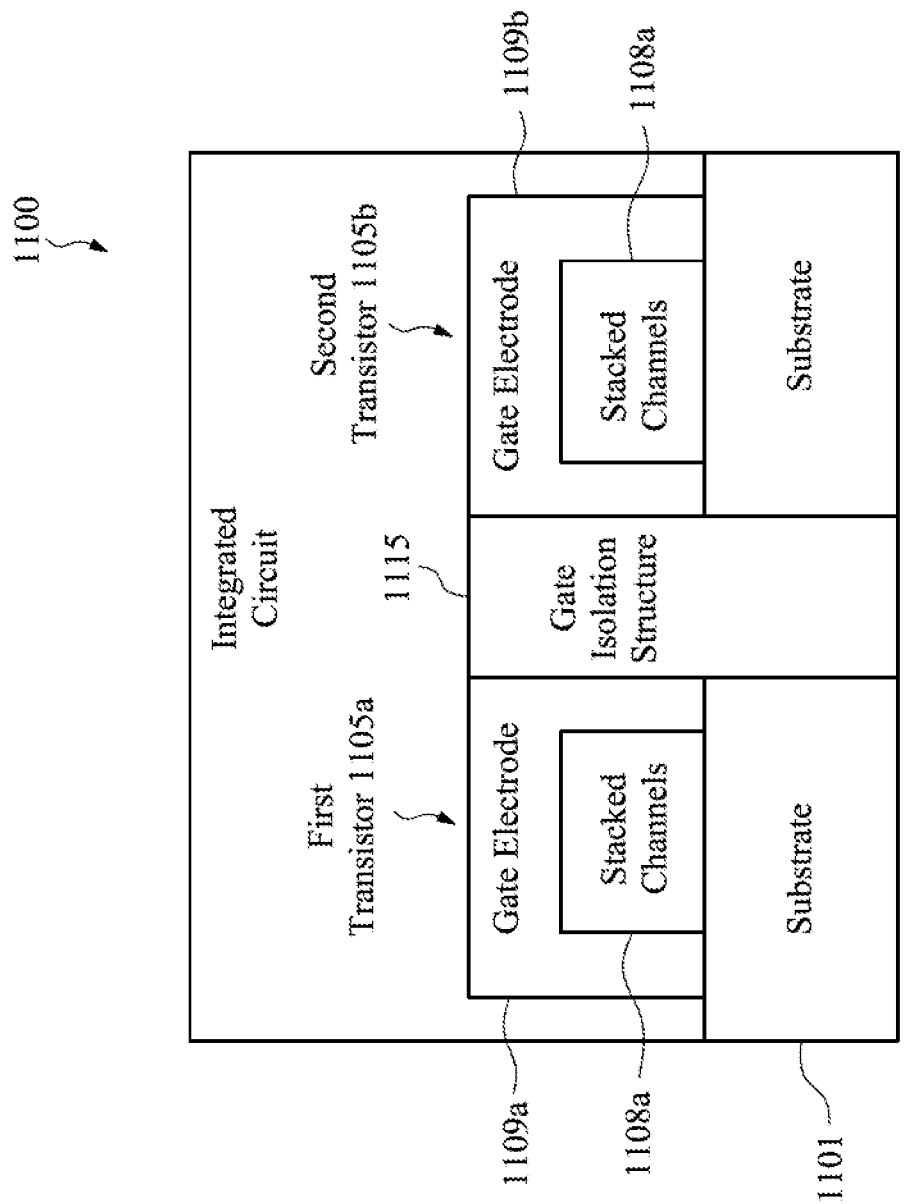
FIG. 3 is a block diagram of an integrated circuit, in accordance with some embodiments.

FIG. 3 is a block diagram of an integrated circuit 1100, in accordance with some embodiments. The integrated circuit 1100 includes a substrate 1101. The integrated circuit also includes a first transistor 1105a and a second transistor 1105b above the substrate 1101. As set forth in more detail below, the integrated circuit 1100 selectively utilizes gate isolation structures 1115 to electrically isolate the gate electrodes of the first transistor 1105a and the second transistor 1105b.

The first transistor 1105 includes a plurality of stacked channels 1108a and a gate electrode 1109a. The second transistor 1105b includes a plurality of stacked channels 108b and a gate electrode 1109b. The first transistor 1105a can be operated by applying a voltage to the gate electrode 1109a. This can prevent or enable current to flow between the source/drain regions (not shown) of the transistor 105a through the stacked channels 1108a. The second transistor 1105b can be operated by applying a voltage to the gate electrode 1109b. This can prevent or enable current to flow between the source/drain regions (not shown) of the transistor 1105b through the stacked channels 1108b of the second transistor 1105b.

The integrated circuit 1100 includes a gate isolation structure 1115. The gate isolation structure 1115 extends from a backside of the substrate 1101 between the gate electrodes 1109a and 1109b of the transistors 1105a and 1105b. The gate isolation structure 1115 physically separates the gate electrode 1109a from the gate electrode 1109b. This physical separation also corresponds to electrical isolation of the gate electrode 1109a and the gate electrode 1109b. This electrical isolation enables the first and second transistors 1105a and 1105b to be operated independently of each other.

The gate isolation structure 1115 may be filled with a dielectric material. The dielectric material contributes to the electrical isolation of the gate electrodes 1109a and 1109b. The dielectric material may be a low K dielectric material such as SiCN, silicon oxide, or silicon nitride. Other materials can be utilized without departing from the scope of the present disclosure. Accordingly, the gate isolation structure 1115 filled with the dielectric material corresponds to a gate isolation structure.

The process of forming the gate isolation structure 1115 can be performed in conjunction with thinning of the substrate 1101. After front side processing to substantially form the transistors 1105a and 1105b, it may be beneficial to reduce the thickness of the substrate 1101. Typically this involves attaching a carrier wafer to the front side of the integrated circuit 1100 and flipping the integrated circuit 1100 so the back surface of the substrate 1101 is exposed and facing upward. Various etching processes are then utilized to remove portions of the substrate 1101 in order to reduce the thickness of the substrate 1101.

After reduction of the thickness of the substrate 1101, the gate isolation structure 1115 can be formed. Prior to formation of the gate isolation structure 1115, the gate electrode 1109a and the gate electrode 1109b may be a single contiguous metal gate. The gate isolation structure 1115 is formed through the substrate 1101 via the backside of the substrate 1101 and through the contiguous metal gate structure that forms the gate electrodes 1109a and 1109b. The trench etches away a portion of the metal gate structure between the first and second transistors 1105a and 1105b, thereby electrically isolating the gate electrode 1109a from the gate electrode 1109b.

In some embodiments, the first and second transistors 1105a and 1105b are nanostructure transistors. In this case, the stacked channels 1108a and 1108b are each made of a plurality of semiconductor channels extending between the source/drain regions of the first transistor 1105a, and between the source/drain regions of the second transistor 1105b. The semiconductor channels may include nanosheets, nanowires, or other types of nanostructures. The channel regions 1108a and 1108b may be part of respective fin structures extending above the semiconductor substrate 1101. Other types of transistors may be utilized without departing from the scope of the present disclosure.

Figure 4B:
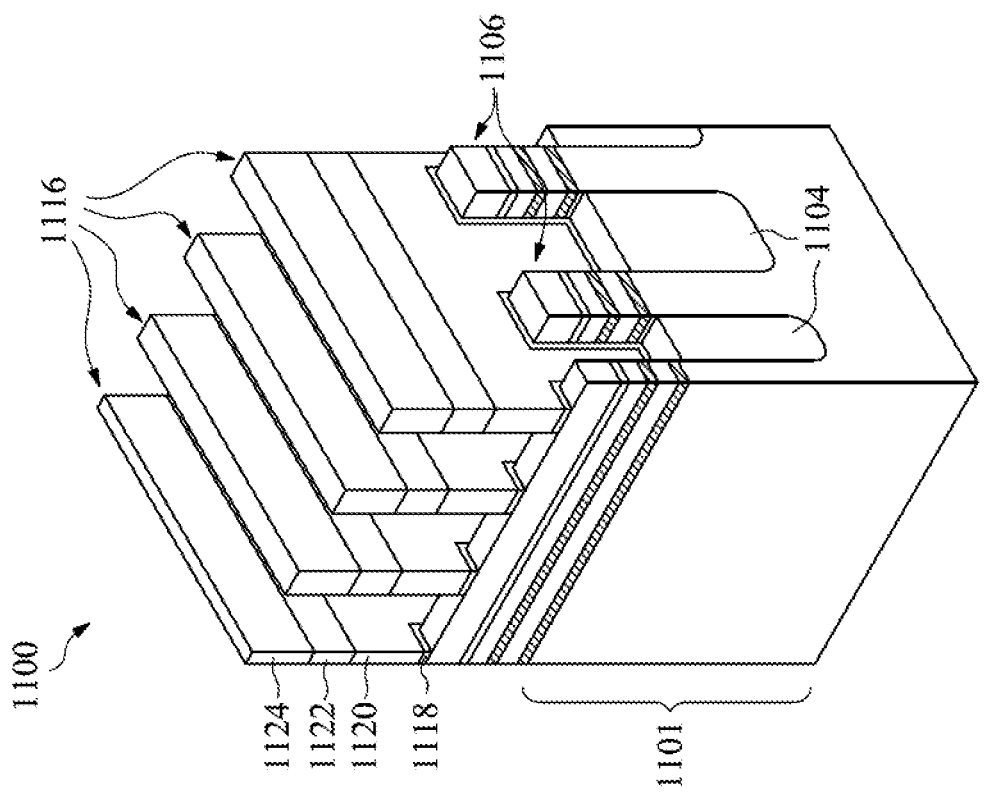
Figure 4A:
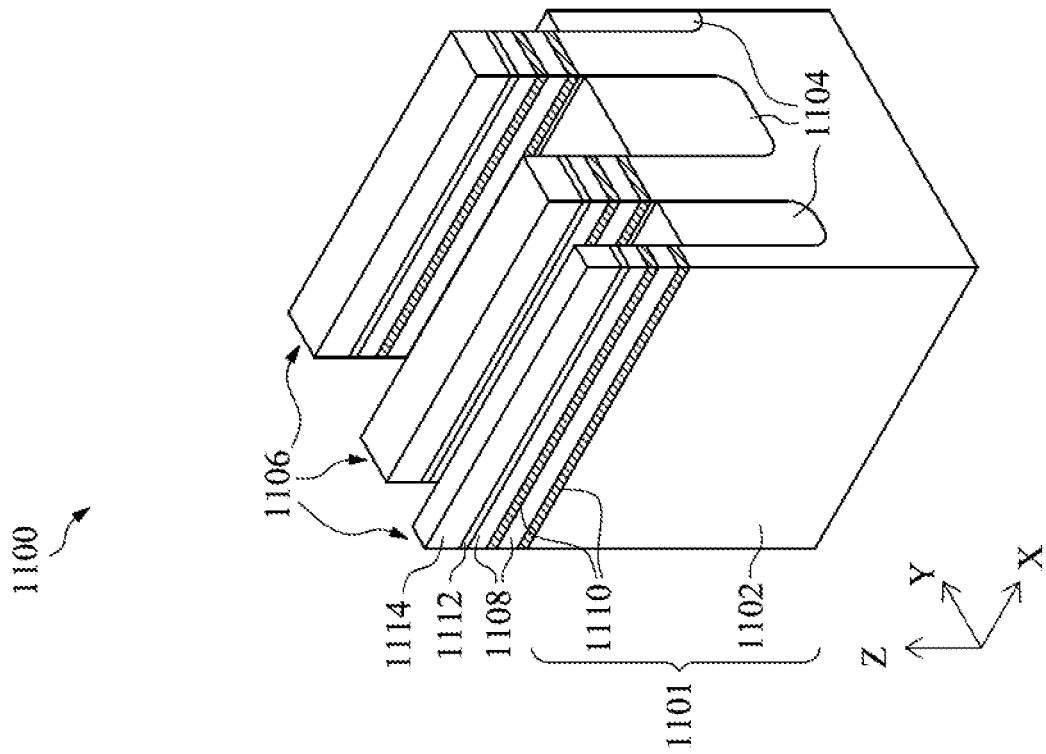

FIGS. 4A-5 illustrate an example process for forming nanostructure transistors. Each nanostructure transistor may include a plurality of stacked channels. The channels may be semiconductor nanosheets, nanowires, or other semiconductor nanostructures.

The nanostructure transistors may include gate all around (GAA) transistor structures that may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In FIG. 4A, the integrated circuit 1100 includes a substrate 1101. In one embodiment, the substrate 1101 includes a first semiconductor material 1102. The semiconductor material 1102 may include a single crystalline semiconductor layer on at least a surface portion. The substrate 1101 may include a single crystalline semiconductor material such as, but not limited to Si, Ge, SiGe, GaAs, InSb, GaP, GaSb, InAlAs, InGaAs, GaSbP, GaAsSb and InP. In an example process described herein, the first semiconductor material 1102 includes Si, though other semiconductor materials can be utilized without departing from the scope of the present disclosure.

The substrate 1101 may include in its surface region one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 1101 may include various regions that have been suitably doped with impurities (e.g., p-type or n-type conductivity). The dopants are, for example boron ($BF_2$) for an n-type transistor and phosphorus for a p-type transistor.

The integrated circuit 1100 includes fin structures 1106 protruding from the substrate 1101. The fins 106 extend in the X direction. Each fin 1106 includes a plurality of stacked channels 1108 and a plurality of sacrificial semiconductor layers 1110. The stacked channels 1108 are layers of semiconductor material. The sacrificial semiconductor layers 1110 are also layers of semiconductor material. The semiconductor material of the sacrificial semiconductor layers 1110 is selectively etchable with respect to the semiconductor material of the stacked channels 1108. As will be set forth in more detail below, each of the fins 1106 will be patterned to form a plurality of distinct sets of stacked channels 1108. Each distinct set of stacked channels 1108 will correspond to the stacked channels of a nanostructure transistor. The sacrificial semiconductor layers 1110 will eventually be removed so that gate dielectric materials and gate metal materials may surround each individual stacked channel 1108.

The stacked channels 1108 may include one or more layers of Si, Ge, SiGe, GaAs, InSb, GaP, GaSb, InAlAs, InGaAs, GaSbP, GaAsSb or InP. In one example, the stacked channels 1108 are the same semiconductor material as the semiconductor material 1102. Other semiconductor materials can be utilized for the stacked channels 1108 without departing from the scope of the present disclosure. In a non-limiting example described herein, the stacked channels 1108 and the semiconductor material 1102 are silicon.

The sacrificial semiconductor layers 1110 include a different semiconductor material than the stacked channels 1108. In an example in which the stacked channels 1108 include silicon, the sacrificial semiconductor layers 1110 may include SiGe. In one example, the silicon germanium sacrificial semiconductor layers 1110 may include between 20% and 30% germanium, though other concentrations of germanium can be utilized without departing from the scope of the present disclosure.

In one embodiment, the stacked channels 1108 and the sacrificial semiconductor layers 1110 are formed by alternating epitaxial growth processes from the semiconductor substrate 1101. For example, a first epitaxial growth process may result in the formation of the lowest sacrificial semiconductor layer 1110 on the top surface of the substrate 1101. A second epitaxial growth process may result in the formation of the lowest stacked channel 1108 on the top surface of the lowest sacrificial semiconductor layer 1110. Alternating epitaxial growth processes are performed until a selected number of stacked channels 1108 and sacrificial semiconductor layers 1110 have been formed. While FIG. 4A illustrates two stacked channels 1108 and two sacrificial semiconductor layers 1110 in each fin, in practice, there may be more than two stacked channels 1108 and sacrificial semiconductor layers 1110.

The vertical thickness of the stacked channels 1108 can be between 2 nm and 15 nm, in some embodiments. The thickness of the sacrificial semiconductor layers 1110 can be between 5 nm and 15 nm, in some embodiments. Other thicknesses and materials can be utilized for the stacked channels 1108 and the sacrificial semiconductor layers 1110 without departing from the scope of the present disclosure.

Each fin 1106 may include a dielectric layer 1112 on the highest of the stacked channels 1108. In one example, the dielectric layer 1112 includes silicon oxide. However, the dielectric layer 1112 can include silicon oxynitride (SiON), SiOCN, SiCN, fluorine-doped silicate glass (FSG), a low-K dielectric material, or other suitable dielectric materials without departing from the scope of the present disclosure.

In some embodiments, each fin 1106 includes a semiconductor layer 1114 on the dielectric layer 1112. In one example, the semiconductor layer 1114 includes a same semiconductor material as the semiconductor material of the stacked channels 1108. However, the semiconductor layer 1114 can include other semiconductor materials without departing from the scope of the present disclosure.

In some embodiments, the substrate 1101 includes shallow trench isolation regions 1104. In one example, the trench isolation regions 1104 includes silicon oxide. However, the shallow trench isolation regions 1104 can include silicon nitride, silicon oxynitride (SiON), SiOCN, SiCN, fluorine-doped silicate glass (FSG), or a low-K dielectric material. The shallow trench isolation regions 1104 can be formed in conjunction with formation of the fins 1106. For example, the fins 1106 may be formed by foaming the various layers of the fins 1106, forming a mask on the semiconductor layer 1114, and then performing an etching process in the presence of the mask that defines the fins 1106 and etches away a portion of the semiconductor material 1102 of the substrate 1101. The portions of the material 1102 can then be replaced by depositing the material of the shallow trench isolation regions 1104. Other materials and structures can be utilized for the shallow trench isolation regions 1104 without departing from the scope of the present disclosure.

In FIG. 4B, fin structures 1116 have been formed. The fin structures 1116 are formed over the fin structures 1106 and on the shallow trench isolation regions between the fin structures 1106. The fin structures 1116 extend in the Y direction. Accordingly, the fin structures 1116 extend in a direction substantially perpendicular to the direction of the fin structures 1106.

In some embodiments, each fin structure 1116 includes a dielectric layer 1118. In one example, the dielectric layer 1118 includes silicon oxide. However, the dielectric layer 1118 can include silicon nitride, silicon oxynitride (SiON), SiOCN, SiCN, fluorine-doped silicate glass (FSG), a low-K dielectric material, or other suitable dielectric materials without departing from the scope of the present disclosure. The dielectric layer 1118 can be deposited by chemical vapor deposition (CVD), physical vapor deposition (PVD), atomic layer deposition (ALD), or by other suitable deposition processes.

In some embodiments, each fin structure 1116 includes a polysilicon layer 1120 on the dielectric layer 1118. In other cases, the materials of the polysilicon can be utilized in place of the polysilicon layer 1120 without departing from the scope of the present disclosure. The polysilicon layer 1120 can be formed by CVD, PVD, ALD, or other suitable deposition processes. The dielectric layer 1120 can be formed by CVD, PVD, ALD, or other suitable deposition processes.

In some embodiments, each fin structure 1116 includes a dielectric layer 1122 on the polysilicon 1120. In one example, the dielectric layer 1122 includes silicon nitride. However, the dielectric layer 1122 can include silicon oxide, silicon oxynitride (SiON), SiOCN, SiCN, fluorine-doped silicate glass (FSG), a low-K dielectric material, or other suitable dielectric materials without departing from the scope of the present disclosure. The dielectric layer 1122 can be formed by CVD, PVD, ALD, or other suitable deposition processes.

In some embodiments, each fin structure 1116 includes a dielectric layer 1124 on the dielectric layer 1122. In one example, the dielectric layer 1124 includes silicon oxide. However, the dielectric layer 1124 can include silicon nitride, silicon oxynitride (SiON), SiCN, fluorine-doped silicate glass (FSG), low-K dielectric material or other dielectric materials without departing from the scope of the present disclosure. The dielectric layer 1124 can be formed by CND, PVD, ALD, or other suitable deposition processes.

The fins 1116 can be formed by performing blanket depositions of the various materials of the fin structures 1116 as described above. A mask can then be formed and patterned on the dielectric layer 1124. The fins 1116 can be formed by performing an etching process in the presence of the mask. The etching process defines the fins 1116 by etching the various layers 1118, 1120, 1122, and 1124 in the presence of the mask. In some embodiments, the fin structures 1116 may be termed "dummy gates" or "dummy gate fins" because, as will be set forth in more detail below, gate electrodes will eventually be formed in place of the fin structures 1116.

Figure 4D:
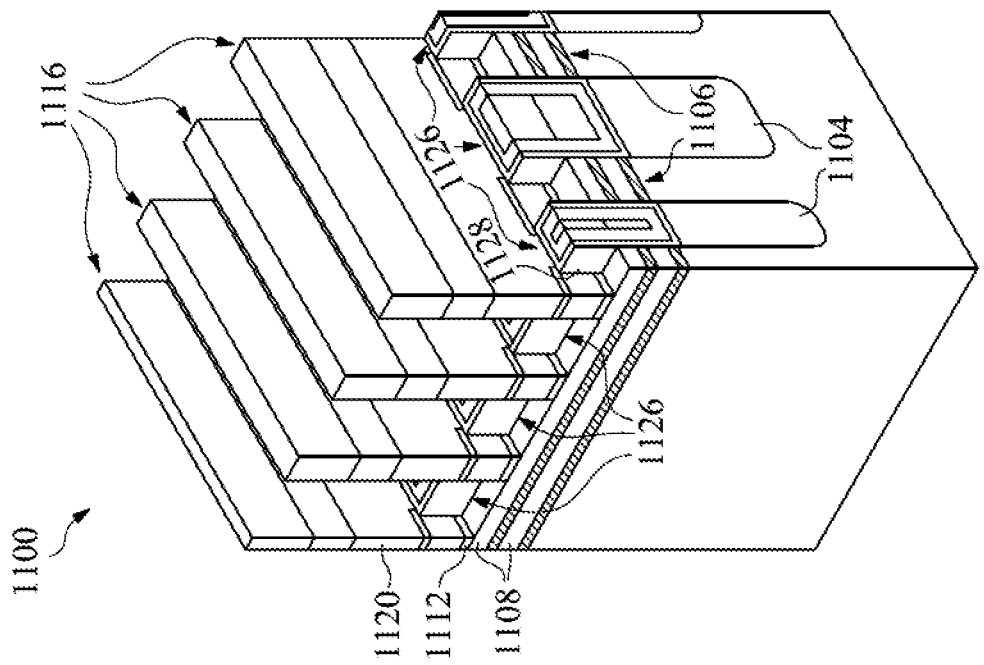
Figure 4C:
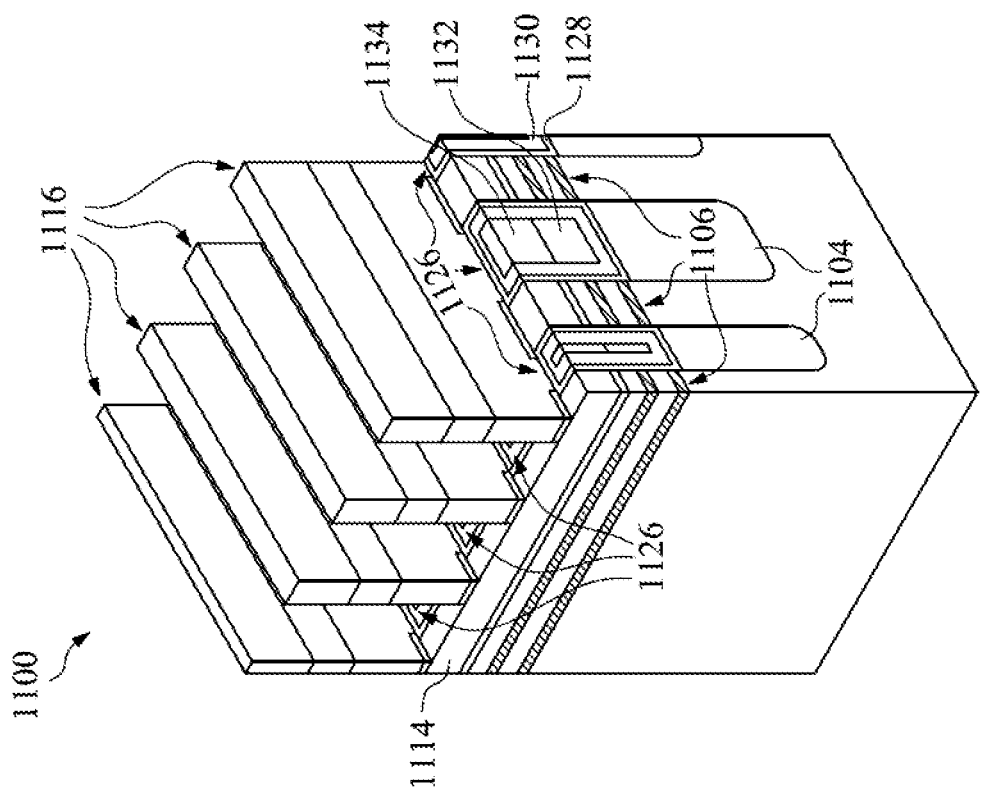

In FIG. 4C, hybrid fin structures 1126 have been formed. The hybrid fin structures 1126 are formed in the spaces between the fin structures 1106 and the fin structures 1116. The hybrid fin structures 1116 will eventually separate source/drain regions of adjacent transistors, as will be set forth in more detail below.

The hybrid fin structures 1126 include a dielectric layer 1128. In one example, the dielectric layer 1128 includes SiOCN. However, the dielectric layer 1128 can include silicon oxide, silicon nitride, silicon oxynitride (SiON), SiCN, fluorine-doped silicate glass (FSG), a low-K dielectric material or other dielectric materials without departing from the scope of the present disclosure. The dielectric layer 1128 may initially be deposited in a blanket deposition on all of the exposed surfaces of the gate isolation regions 1104, the fin structures 1106, and the fin structures 1116. The dielectric layer 1128 can be formed by CVD, PVD, ALD, or other suitable deposition processes.

The hybrid fin structures 1126 include a dielectric layer 1130 on the dielectric layer 1128. In one example, the dielectric layer 1130 includes SiOCN. However, the dielectric layer 1130 can include silicon oxide, silicon nitride, silicon oxynitride (SiON), SiCN, fluorine-doped silicate glass (FSG), a low-1K dielectric material or other dielectric materials without departing from the scope of the present disclosure. The dielectric layer 1130 may initially be deposited in a blanket deposition on the dielectric layer 1128 prior to patterning of the dielectric layer 1128. The dielectric layer 1130 can be formed by CVD, PVD, ALD, or other suitable deposition processes.

The hybrid fin structures 1126 include a dielectric layer 1132 on the dielectric layer 1130. In one example, the dielectric layer 1132 includes silicon oxide. However, the dielectric layer 1132 can include, silicon nitride, silicon oxynitride (SiON), SiOCN, SiCN, fluorine-doped silicate glass (FSG), a low-K dielectric material or other dielectric materials without departing from the scope of the present disclosure. The dielectric layer 1132 may initially be deposited in a blanket deposition on the dielectric layer 1130 prior to patterning of the dielectric layer 1130. The dielectric layer 1132 can be formed by CVD, PVD, ALD, or other suitable deposition processes. After deposition of the dielectric layer 1132, an etch-back or recessing process may he performed to recess the dielectric layer 1132 to a level substantially even with a level of the tops of the fin structures 1106. The recessing of the dielectric layer 1132 may be performed prior to patterning of the dielectric layers 1128 and 1130, in some embodiments.

After deposition and initial recessing of the dielectric layer 1132, an etch-back process may be performed to recess the dielectric layer 1130 to the level shown in FIG. 4C. The etch-back process etches the dielectric layer 1130 selectively with respect to the dielectric layer 1128. Accordingly, after the etch-back process for the dielectric layer 1130, the dielectric layer 1128 remains in substantial blanket coverage of the integrated circuit 1100. The etch-back process can include an isotropic dry etch or wet etch, or other types of etching processes.

In some embodiments, while the dielectric layers 1128 and 1130 are both SiOCN, the dielectric layer 1130 may nevertheless be selectively etchable with respect to the dielectric layer 1128. This may be accomplished, in some embodiments, by ensuring different concentrations of oxygen, carbon, and nitrogen in the dielectric layers 1128 and 1130. For example, SiOCN may also be written as $SiO_iC_jN_k$, where i, j, and k are relative concentrations of the corresponding elements in the dielectric material SiOCN. Accordingly, the concentrations or ratios of the various elements and the dielectric layer 1128 and 1130 can be selected so that the dielectric layer 1130 is selectively etchable with respect to the dielectric layer 1128. Alternatively, the dielectric layers 1128 and 1130 can include entirely different materials that are selectively etchable with respect to each other.

After the dielectric layer 1130 has been etched back, the dielectric layer 1132 may recessed a second time. The second etch-back process of the dielectric layer 1132 can include, an isotropic dry etch or wet etch that selectively etches the dielectric layer 1132 with respect to the dielectric layers 1130 and 1128. Other types of etching processes can be utilized to recess the dielectric layer 1132. The etch-hack process reduces the height of the dielectric layer 1132 with respect to the dielectric layer 1130. After the second etch-back process of the dielectric layer 1132, the dielectric layer 1132 has the form shown in FIG. 4C.

The hybrid fin structures 1126 include a dielectric layer 1134 on the dielectric layer 1132. In one example, the dielectric layer 1134 includes SiOCN. However, the dielectric layer 1134 can include silicon oxide, silicon nitride, silicon oxynitride (SiON), SiCN, fluorine-doped silicate glass (PSG), low-K dielectric material or other dielectric materials without departing from the scope of the present disclosure. The dielectric layer 1134 may initially be deposited in a blanket deposition on the dielectric layers 1128, 1130, and 1132 prior to patterning of the dielectric layer 1128. The dielectric layer 1130 can be formed by CND, PVD, ALD, or other suitable deposition processes.

In some embodiments, the dielectric layer 1134 is selectively etchable with respect to the dielectric layers 1128 and 1130. In an example in which the dielectric layer 1134 is SiOCN, the concentration of the various elements SiOCN can be selected so that the dielectric layer 1134 is selectively etchable with respect to the dielectric layers 1128 and 1130. Accordingly, in some embodiments, the dielectric layers 1128, 1130, and 1134 each include SiOCN with different concentrations of elements so that they are each selectively etchable with respect to the others. After deposition of the dielectric layer 1134, an etch-back process is performed to etch-back the dielectric layer 1134 to the position shown in FIG. 4C. In particular, the top surfaces of the dielectric layers 1134, 1130, and 1128 are substantially coplanar. The dielectric layer 1134 is positioned over the dielectric layer 1132. The etch-back process for the dielectric layer 1134 can include an isotropic dry etch or wet etch that selectively etches the dielectric layer 1134 with respect to the dielectric layers 1128 and 1130.

After the etch-back process of the dielectric layer 1134, an etching process is performed to remove the dielectric layer 1128 from the top surfaces of the fin structures 1106 and from the top and side surfaces of the fin structures 1116. After the etching process of the dielectric layer 1128, the hybrid fin structures 1126 have the structure shown in FIG. 4C. Other processes and materials can be utilized to form hybrid fin structures 1126 without departing from the scope of the present disclosure. As will be set forth in more detail below, the hybrid fin structures are positioned to isolate the source/drain regions of adjacent transistors.

In FIG. 4D, an etching process has been performed to remove the layer 1114. The etching process can include an anisotropic etch that selectively etches in the downward direction. The etching process removes layer 1114 and the portions of the layer 1112 that are not covered by the fin structures 1116. Accordingly, the etching process exposes the top surface of the top stacked channel 1108. The etching process also exposes side surfaces of the dielectric layer 1128 of the hybrid fin structures 1126. In an example in which the layer 1114 includes polysilicon, the polysilicon layer 1120 is not etched because the polysilicon layer 1120 is covered by the dielectric layers 1122 and 1124 and the etching process etches in the downward direction.

Figure 4F:
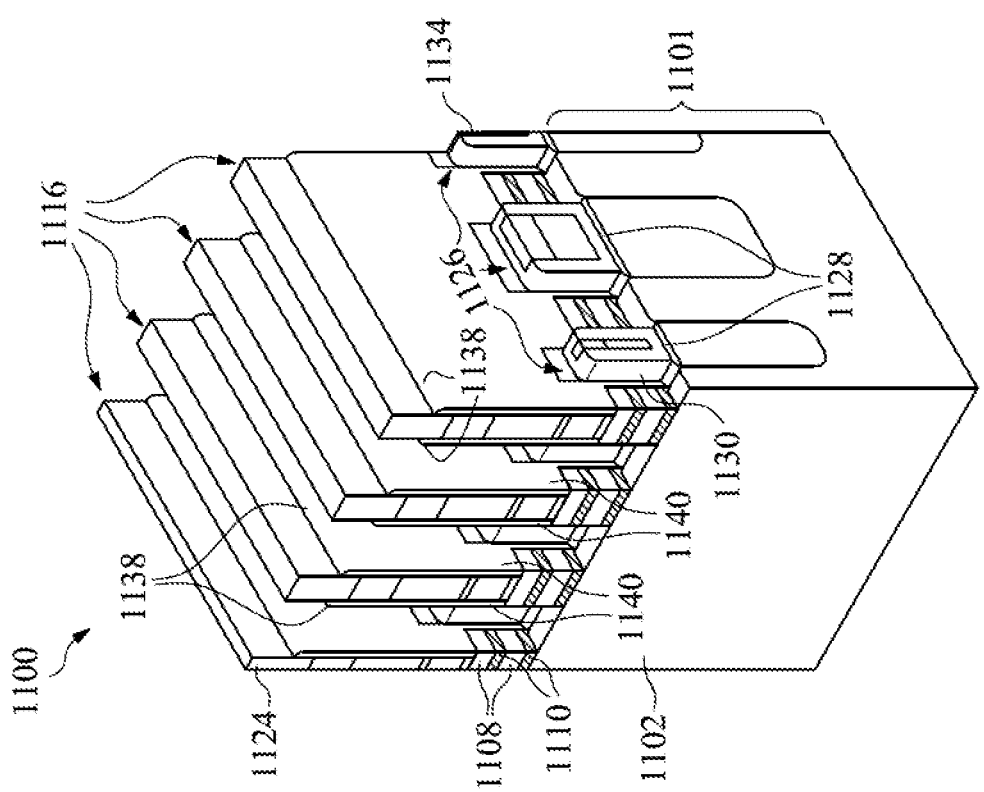
Figure 4E:
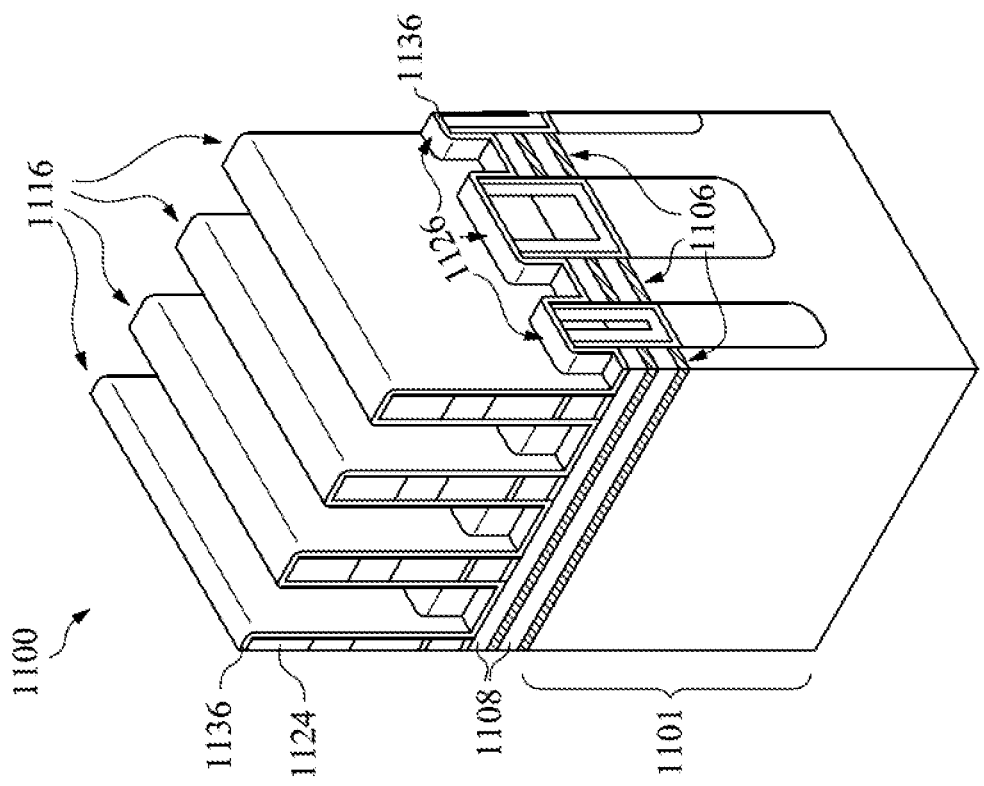

In FIG. 4E, a dielectric layer 1136 has been formed on the exposed surfaces of the fin structures 1116, on the exposed surfaces of the fin structures 1106, and on the exposed surfaces of the hybrid fin structures 1126. In some embodiments, the dielectric layer 1136 includes silicon nitride. However, the dielectric layer 1136 may include silicon oxide, silicon oxynitride (SiON), SiOCN, SiCN, fluorine-doped silicate glass (FSG), a low-K dielectric material or other dielectric materials without departing from the scope of the present disclosure. The dielectric layer 1136 can be formed by CVD, PVD, ALD, or other suitable deposition processes.

In FIG. 4F, an etching process has been performed. The etching process includes an anisotropic etching process that etches in the downward direction. The etching process etches the material of the dielectric layer 1136, the material of the stack channels 1108, and the material of the sacrificial semiconductor layers 1110. The etching process removes the dielectric layer 1136 from on top of the top of the fin structures 1106, the fin structures 1116, and the fin structures 1126. Because the etching process etches in the downward direction, the duration of the etching process is selected so that only relatively small portion of the dielectric layer 1136 is removed from the sidewalls of the fin structures 1116.

The remaining portion of the dielectric layer 1136 on the sidewalls of the fin structures 1116 corresponds to spacers 1138. In particular, the spacers 1138 are on the sidewalls of the fin structures 1116. The etching process does not etch the dielectric layer 1124.

The etching process entirely removes those portions of the stack channels 1108 and semiconductor layers 1110 that are not positioned directly below the fin structures 1116 and the spacers 1138. Accordingly, a portion of the semiconductor layer 1102 of the substrate 1101 is exposed by the etching process.

The etching process also removes the dielectric layer 1128 from the sidewalls of the hybrid fin structure 1126. The dielectric layer 1128 only remains directly below the hybrid fin structures 1126. While a single etching process has been described in relation to FIG. 4F, in some embodiments the etching process may include multiple etching steps to remove portions of the dielectric layer 1136, the dielectric layer 1128, the stack channels 1108, and the sacrificial semiconductor layers 1110.

Figure 4H:
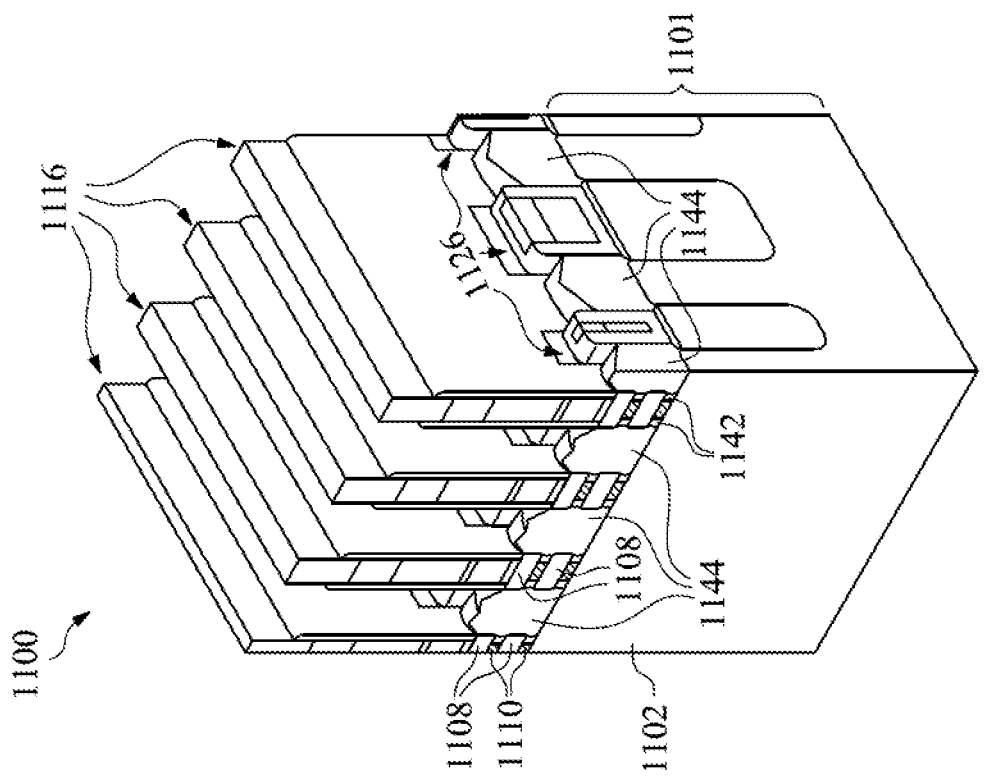
Figure 4G:
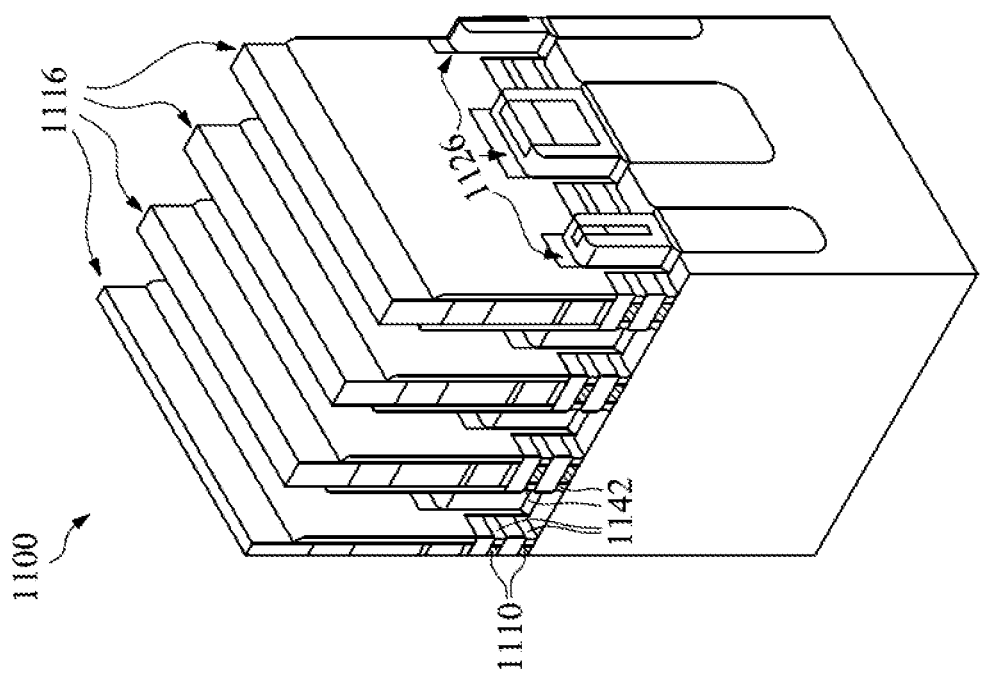

In FIG. 4G, an etching process has been performed to laterally recess the sacrificial semiconductor layers 1110 relative to the stacked channels 1108. The etching process can include an isotropic etch or other types of etching processes. After the etching process has been performed, inner spacers 1142 have been formed in the recesses of the sacrificial semiconductor layers 1110. In some embodiments, the inner spacers 1142 include silicon nitride. However, the inner spacers 1142 can include silicon oxide, silicon oxynitride (SiON), SiOCN, SiCN, fluorine-doped silicate glass (FSG), a low-K dielectric material or other dielectric materials without departing from the scope of the present disclosure. The inner spacers 1142 can be formed by CVD, PVD, ALD, or other suitable deposition processes. As will be set forth in more detail below, the inner spacers 1142 help prevent short circuits between source/drain regions and gate electrodes of the transistors formed in the integrated circuit 1100.

In FIG. 4H, source/drain regions 1144 have been formed. The source/drain regions 1144 includes semiconductor material. The source/drain regions 1144 are each formed in contact with adjacent stacked channels 1108 and inner spacers 1142. The source/drain regions 1144 are also delimited by the hybrid fin structures 1126. The source/drain regions 1144 can be epitaxially grown from one or both of the stack channels 1108 and the semiconductor layer 1102 of the substrate 1101. The source/drain regions 1144 can be doped with N-type dopants species in the case of N-type transistors. The source/drain regions 1144 can be doped with P-type dopant species in the case of P-type transistors. The doping can be performed in-situ during the epitaxial growth. The hybrid fin structures 1126 can act as electrical isolation between the source/drain regions 1144 of adjacent transistors.

Figures 4I, 4J:
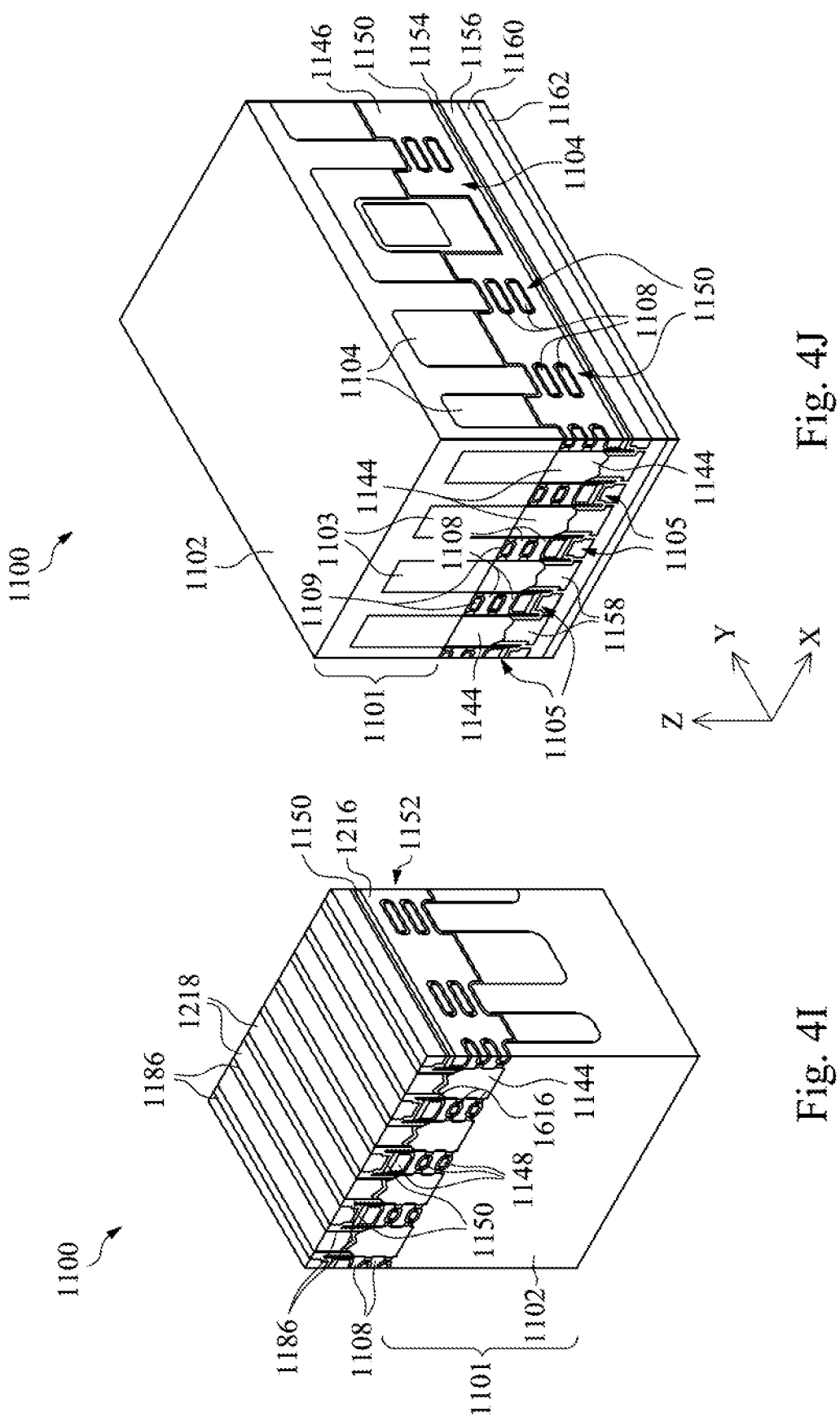

In FIG. 4I, the fins structure 1116 have been removed. This can be accomplished by performing one or more etching processes that stop at the dielectric layer 1118. The dielectric layer acts as an etch stop layer. Accordingly, the dielectric layers 1124 and 1122, and the polysilicon layer 1120 are removed. The lower portions of the spacers 1138 remain. Afterward, the dielectric layer 1118, the polysilicon 1114, and the dielectric layer 1112 are selectively etched with respect to the spacers 1138. This exposes the side surfaces of the sacrificial semiconductor layers 1110.

After the sacrificial semiconductor layers 1110 of the exposed by the previously described etching processes, the sacrificial semiconductor layers 1110 are removed. The sacrificial semiconductor layers 1110 can be removed with an etching process that selectively etches the sacrificial semiconductor layers 1110 with respect to the material of the stacked channels 1108. After the etching process, the stacked channels 1108 are no longer covered by sacrificial semiconductor layers 1110. Accordingly, immediately after removal of the sacrificial semiconductor layers 1110, the there is a void surrounding the stacked channels 1108.

After removal of the sacrificial semiconductor layers 1110, a gate dielectric 1146 has been deposited on the exposed surfaces of the channels 1108. The gate dielectric 1146 is shown as only a single layer. However, in practice, the gate dielectric 1146 may include multiple dielectric layers. For example, the gate dielectric 1146 may include an interfacial dielectric layer that is in direct contact with the channels 1108. The gate dielectric 1146 may include a high-K gate dielectric layer positioned on the interfacial dielectric layer. Together, the interfacial dielectric layer and the high-K gate dielectric layer form a gate dielectric 1146 for the transistors that will be formed with the channels 1108.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the channels 1108 for gate metals, as will be explained in more detail below. Other materials, deposition processes, and thicknesses can be utilized for the interfacial dielectric layer without departing from the scope of the present disclosure.

The high-K gate dielectric layer and the interfacial dielectric layer physically separate the channels 1108 from the gate metals that will be deposited in subsequent steps. The high-K gate dielectric layer and the interfacial dielectric layer isolate the gate metals from the channels 1108 that correspond to the channel regions of the transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor nanostructure 1106 and 1114. In one embodiment, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

After deposition of the gate dielectric 1146, a gate metal 1148 is deposited. The gate metal forms a gate electrode 1109 around the semiconductor nanostructures 1106 of the transistor 1102. The gate metal 1148 is in contact with the gate dielectric 1146. The gate metal 1148 is positioned between channels 1108. In other words, the gate metal 1148 is positioned all around the channels 1108. For this reason, the transistors formed in relation to the channels 1108 may be called gate all around transistors. The gate metal 1148 can include one or more of titanium nitride, tungsten, tantalum, tantalum nitride, ruthenium, cobalt, aluminum, titanium, or other suitable conductive materials. The gate metal 1148 can be deposited by PVD, CVD, or ALD.

After deposition of the gate metal 1148, a gate metal 1150 is deposited on the gate metal 1148. The gate metal 1150 can include one or more of tungsten, titanium nitride, tantalum, tantalum nitride, cobalt, aluminum, or other suitable conductive materials. The gate metal 1150 can be deposited by PVD, CVD, or ALD. The gate metals 1148 and 1150 collectively make up the gate electrodes 1109 of the various transistors 1105 that will be formed.

Although the gate metal 1148 is shown as a single metal layer, in practice, the gate metal 1148 may include multiple metal layers. For example, the gate metal 1148 may include one or more very thin work function layers in contact with the gate dielectric 1146. The thin work function layers can include titanium nitride, tantalum nitride, or other conductive materials suitable for providing a selected work function for the transistors. The gate metal 1148 can further include a gate fill material that corresponds to the majority of the gate electrodes 1109. The gate fill material can include cobalt, tungsten, aluminum, or other suitable conductive materials.

A dielectric layer 1156 and a dielectric layer 1158 have been formed on the exposed portions of the gate electrodes 1109 at the top of the integrated circuit 1100. In one example, the dielectric layer 1156 includes silicon oxide. However, the dielectric layer 1156 can include silicon nitride, silicon oxynitride (SiON), SiOCN, SiCN, fluorine-doped silicate glass (FSG), a low-K dielectric material or other dielectric materials without departing from the scope of the present disclosure. In one example, the dielectric layer 1158 includes silicon nitride. However, the dielectric layer 1158 can include silicon oxide, silicon oxynitride (SiON), SiOCN, SiCN, fluorine-doped silicate glass (FSG), a low-K dielectric material or other dielectric materials without departing from the scope of the present disclosure. A CMP process is performed to reduce the height and planarize the top surface of the dielectric layers 1154 and 1156.

In FIG. 4J, the integrated circuit 1100 has been flipped. However, prior to flipping the integrated circuit 1100, the dielectric layers 1154 and 1156 are patterned to expose the top surfaces of the source/drain regions 1144. After patterning of the dielectric layers 1154 and 1156, a silicide layer (not shown) may be formed on the top surfaces of the source/drain regions 1144. The silicide layer can include titanium silicide, aluminum silicide, nickel silicide, tungsten silicide, or other suitable silicides.

After formation of the silicide, source/drain contacts 1158 have been formed on the silicide. The source/drain contacts 1158 can include a conductive material such as tungsten, titanium, aluminum, tantalum, or other suitable conductive materials. The source/drain contacts 1158 provide electrical connections to the source/drain regions 1144. Voltages can be applied to the source/drain regions 1144 via the source/drain contacts 1158.

At the stage of processing shown in FIG. 4J, processing of the transistors 1105 is substantially complete. Each transistor 1105 includes a gate electrode 1109 surrounding channels 1108. Each transistor 1105 includes source/drain regions 1144 in contact with the channels 1108 and isolated from the gate electrodes 1109 by the inner spacers 1142. The transistors 1105 can be operated by applying voltages between the gate electrodes 1109 and the source/drain regions 1144.

At the stage of processing shown in FIG. 4J, the gate electrodes 1109 of groups of transistors 1105 grouped in the Y direction are shorted together. This is apparent from the cut that exposes the surface of the integrated circuit 1100 facing the X direction. In order to electrically isolate the gate electrodes 1109 of various transistors, the integrated circuit 1100 is flipped so that gate isolation structures can be formed from the backside of the substrate 1101 as will be set forth in more detail below.

Prior to flipping the integrated circuit 1100, dielectric layers 1160 and 1162 are formed on the dielectric layers 1154 and 1156. In one example, the dielectric layer 1160 includes silicon oxide. However, the dielectric layer 1160 can include silicon nitride, silicon oxynitride (SiON), SiOCN, SiCN, fluorine-doped silicate glass (FSG), a low-K dielectric material or other dielectric materials without departing from the scope of the present disclosure. In one example, the dielectric layer 1162 includes silicon nitride. However, the dielectric layer 1162 can include silicon oxide, silicon oxynitride (SiON), SiOCN, SiCN, fluorine-doped silicate glass (FSG), a low-K dielectric material or other dielectric materials without departing from the scope of the present disclosure.

In FIG. 4J, the substrate 1101 includes semiconductor material 1103. The regions of the semiconductor material 1103 are positioned directly below and in contact with the source/drain regions 1144 (in the orientation prior to flipping the integrated circuit 100). The semiconductor material 1103 can be formed at a stage of processing between the stages of processing shown in FIGS. 4G and 4H. In particular, after forming the inner spacers 1142, an anisotropic etching process can be performed to etch the semiconductor layer 1102 downward. An epitaxial growth process can then be performed to grow the semiconductor material 1103 and locations where the material of the semiconductor layer 1102 was removed. The semiconductor material 1103 can include a material that is selectively etchable with respect to the semiconductor layer 1102. In an example in which the semiconductor layer 1102 includes silicon, the semiconductor material 1103 can include silicon germanium. However, the semiconductor material 1103 can include other without departing from the scope of the present disclosure. After the semiconductor material 1103 has been formed, grown, or deposited, the source/drain regions 1144 can be formed as shown in FIG. 4H.

In FIG. 2J, the thickness of the semiconductor layer 1102 has been reduced. This can be accomplished by performing one or more an etching process, a grinding process, or a CMP process. The result is that the thickness of the substrate 1101 is significantly reduced with respect to the thickness of the substrate in FIG. 4I.

In FIG. 4K, a hard mask layer 1162 has been formed on the backside of the semiconductor layer 1102 of the substrate 1101. A photoresist layer 1164 has been formed on the hard mask layer 1162. The photoresist layer 1164 has been patterned by a photolithography process. After patterning of the photoresist layer 1164 an etching processes may be performed to etch the hard mask 1162 in the pattern of the photoresist layer 1164. The hard mask layer 1162 can include a dielectric material, a metal, or another type of material.

After patterning of the hard mask 1162, trenches 1166 are opened in the semiconductor material 1102 of the substrate 1101. An initial etching process may etch the semiconductor material 1102 to a level of the semiconductor material 1103. A second etching process is then performed to remove the semiconductor material 1103 exposed by the trenches 1166. The source/drain regions 1144 are exposed by the trenches 1166. The second etching process can selectively etch the semiconductor material 1103 with respect to the semiconductor material 1102.

In FIG. 4L, the hard mask layer 1162 and the photoresist layer 1164 have been removed. A dielectric layer 1168 has been deposited on the exposed surfaces of the integrated circuit 1100. In one example, the dielectric layer 1168 includes silicon nitride. However, the dielectric layer 1168 can include silicon oxide, silicon oxynitride (SiON), SiOCN, SiCN, fluorine-doped silicate glass (FSG), a low-K dielectric material or other dielectric materials without departing from the scope of the present disclosure.

After deposition of the dielectric layer 1168, an etching process is performed to remove the portions of the dielectric layer 1168 from horizontal surfaces. The etching process can include an anisotropic etch that etches downward. The timing of the etching process can have a duration selected so that the dielectric layer 1160 is removed from horizontal surfaces that have a low thickness in the Z direction. The duration is short enough so that the dielectric layer 1160 is not substantially removed from the vertical surfaces within the trench 1166.

Figure 4N:
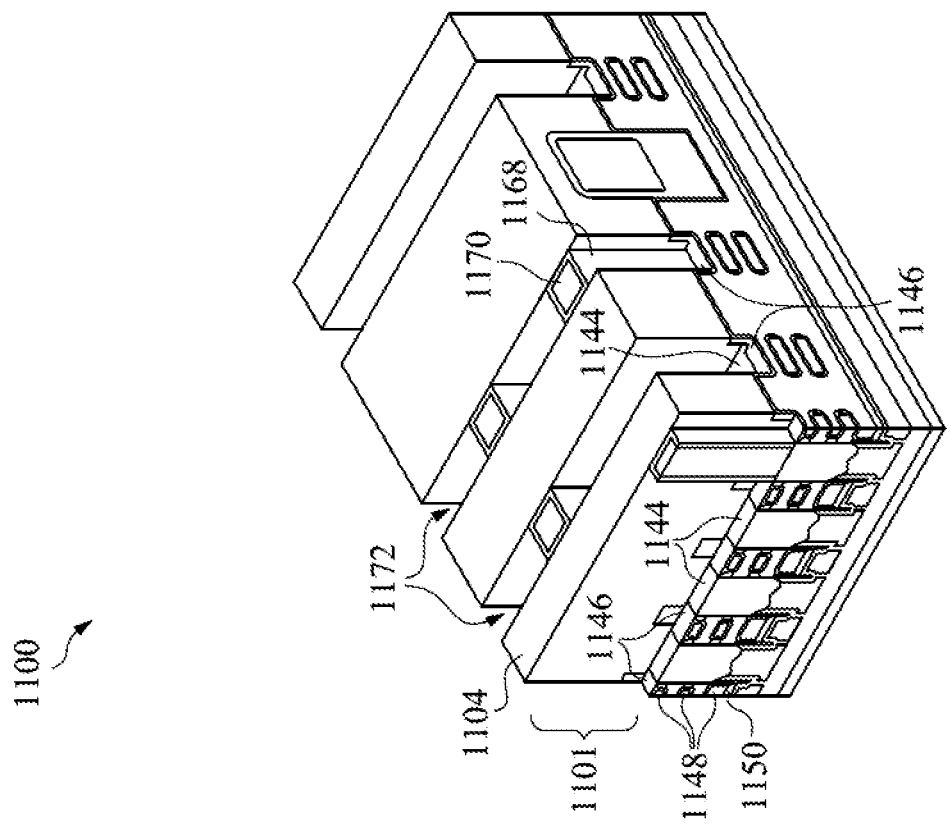
Figure 4M:
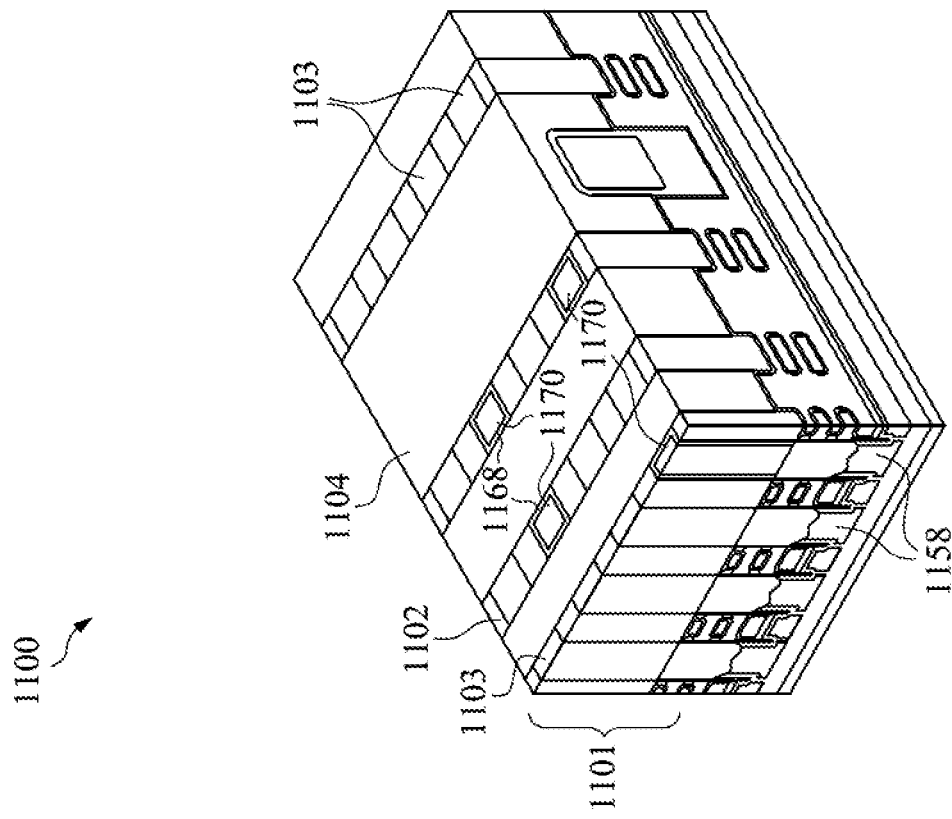

In FIG. 4M, backside source/drain contacts 1170 have been formed in the trenches 1166. The backside source/drain contacts 1170 can include the same material as the source/drain contacts 1158. Alternatively, the source/drain contacts 1170 can have the conductive material other than the material used for the source/drain contacts 1158.

In FIG. 4M, an etching and planarization process has been performed to reduce the thickness of the semiconductor material 1102 of the substrate 1101. The etching and planarization process expose the bottoms of the shallow trench isolation regions 1104 and the regions of the semiconductor material 1102 and the semiconductor material 1103.

In FIG. 4N, the semiconductor materials 1102 and 1103 have been entirely removed from the substrate 1101. This can be accomplished by etching process that selectively etches the semiconductor materials 1102 and 1103 with respect to the materials of the shallow trench isolation regions 1104, the backside source/drain contacts 1170, and the dielectric layer 1168. The etching process can include an anisotropic etch that etches in the downward direction. After removal of the semiconductor materials 1102 and 1103, the source/drain regions 1144 and the gate dielectric 1146 are exposed.

Figures 4O, 4P:
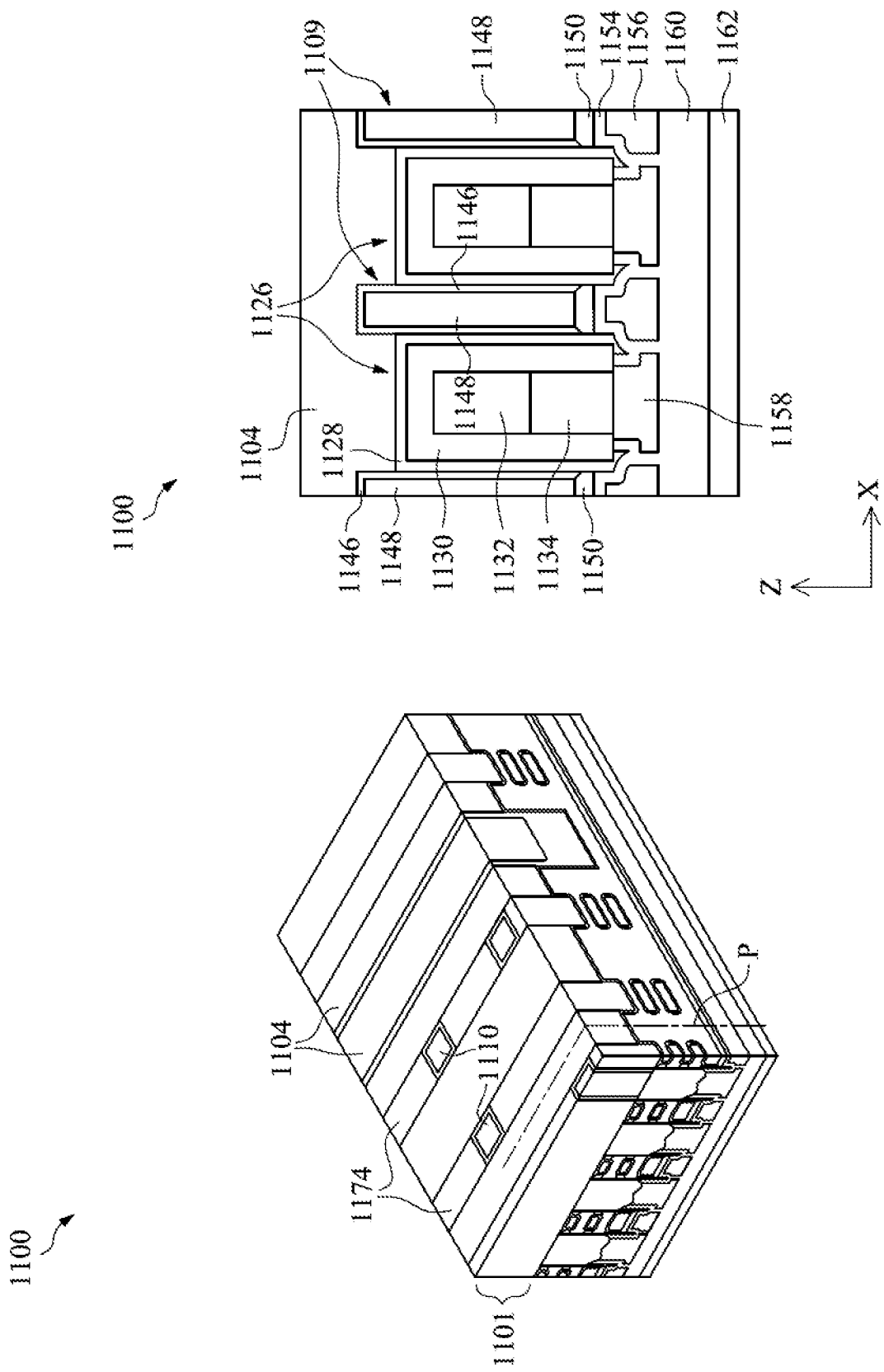

In FIG. 4O, the dielectric fin structures 1174 have been formed in place of the semiconductor materials 1102 and 1103. Etching and planarization processes have been performed to reduce the thickness of the substrate 1101. Accordingly, at the stage of processing shown in FIG. 4O, the substrate 1101 includes the dielectric fin structures 1174 and the shallow trench isolation regions 1104. Backside source/drain contacts 1170 are embedded in the substrate 1101.

In one example, the dielectric fin structures 1174 include silicon nitride. However, the dielectric fin structures 1174 can include the dielectric layer 1156 can include silicon oxide, silicon oxynitride (SiON), SiOCN, SiCN, fluorine-doped silicate glass (FSG), a low-K dielectric material or other dielectric materials without departing from the scope of the present disclosure.

FIG. 4P is a cross-sectional view of the integrated circuit 1100 at the stage of processing shown in FIG. 4O, taken along cut lines P. The cross-sectional view illustrates that there are several gate electrodes 1109 extending into and out of the drawing sheet in the Y direction. The hybrid fin structures 1126 are positioned between the gate electrodes 1109. Though not shown in the view of FIG. 4P, the hybrid fin structures 1126 also separate source/drain regions 1144 of adjacent transistors 1105 from each other.

The hybrid fin structures include the dielectric layers 1128, 1130, 1132, and 1134. The hybrid fin structures are also in contact with portions of the source/drain contacts 1158. The gate electrodes 1109 include the gate metals 1148 and 1150. The gate dielectric 1146 is positioned on the gate metal 1148. The shallow trench isolation region 1104 covers the gate electrodes 1109 and the hybrid fin structures 1126. As described previously, the dielectric layers 1128, 1130, and 1134 of the hybrid fin structures may each include SiOCN, but with different concentrations of elements such that the dielectric layers 1128, 1130, and 1134 are selectively etchable with respect to each other, or can be etched at different rates by various etchants.

Figures 4Q, 4R:
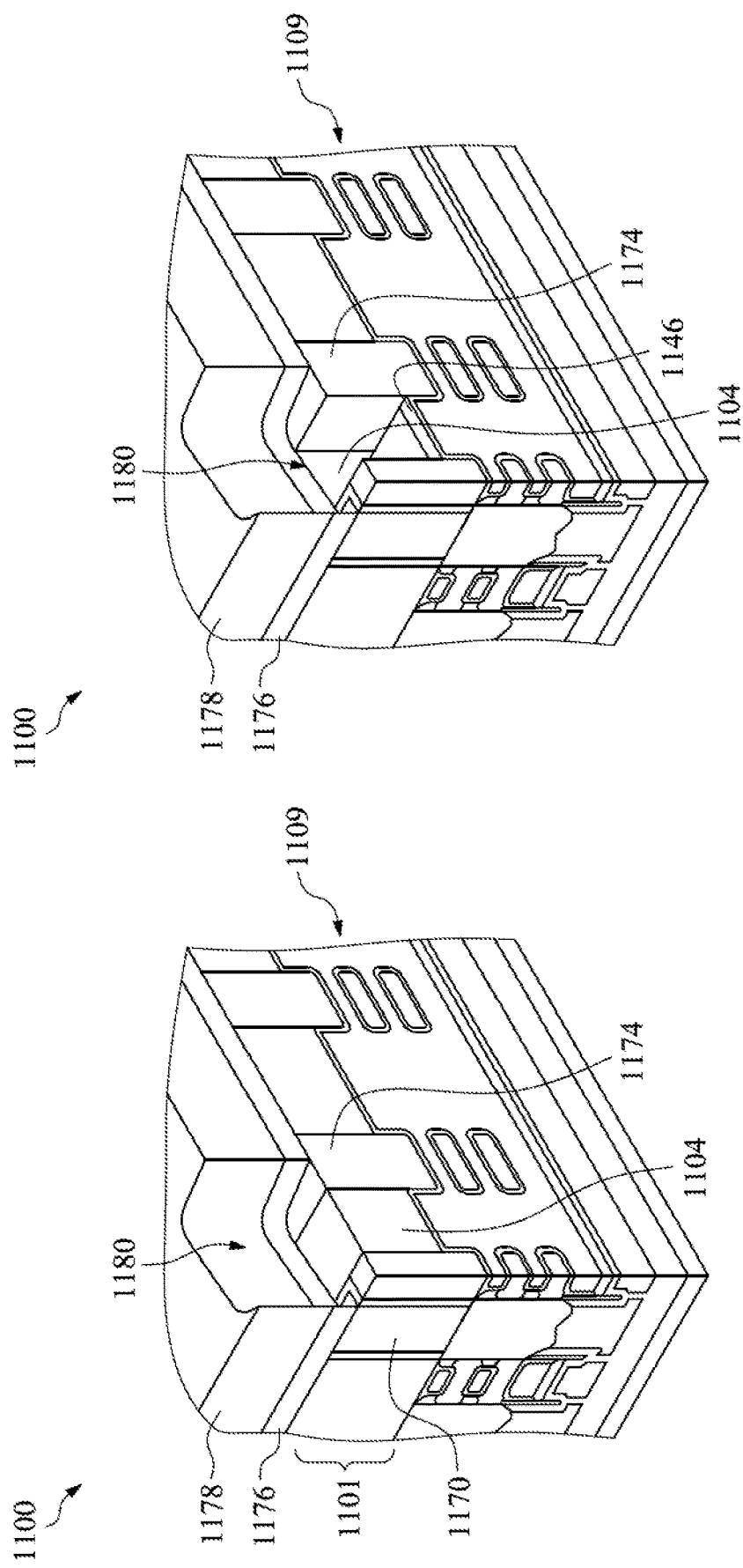

In FIG. 4Q, a hard mask 1176 and the photoresist 1178 have been formed on the backside of the substrate 1101 of the integrated circuit 1100. The hard mask 1176 and the photoresist 1170 have been patterned to include trenches 1180. Because the view of FIG. 4Q is a close-up view, only a single trench 1180 is shown in FIG. 4Q. The trench 1180 exposes a portion of the surfaces of the shallow trench isolation regions 1104, the dielectric fin structures 1174, and the backside source/drain contacts 1170. Though not apparent in the view of FIG. 4Q, the trenches 1180 are vertically above both a gate electrode 1109 and a hybrid fin structure 1126.

In FIG. 4R, an etching process has been performed to remove a portion of the shallow trench isolation region 1104 exposed by the hard mask 1176 and the photoresist 1178. The trench 1180 also exposes a portion of the gate dielectric 1146 on the gate electrode 1109. The etching process selectively etches the material of the shallow trench isolation region 1104 with respect to the material of the dielectric fin structures 1174.

Figure 4T:
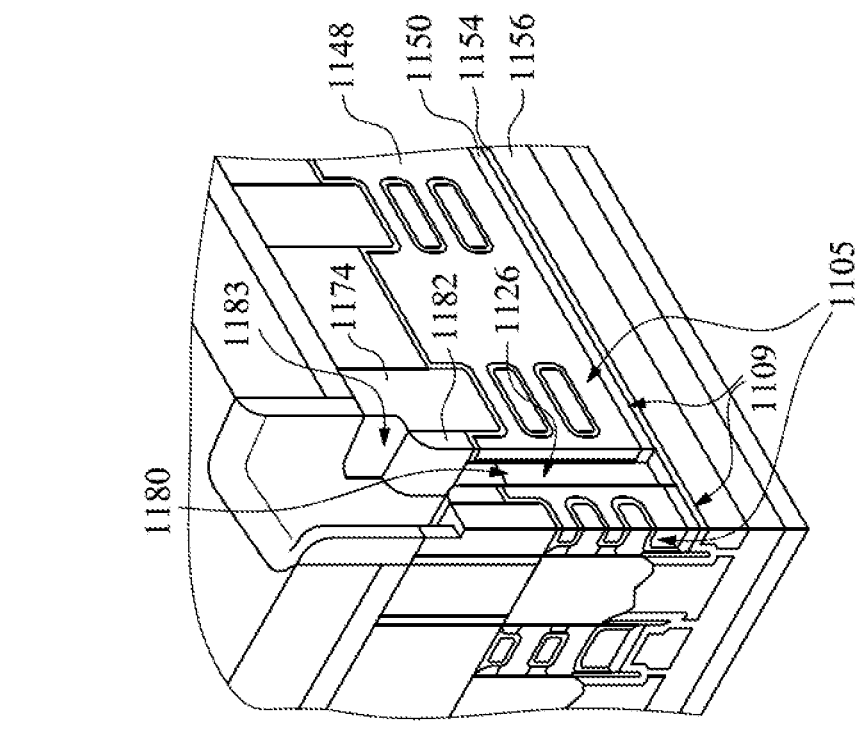
Figure 4S:
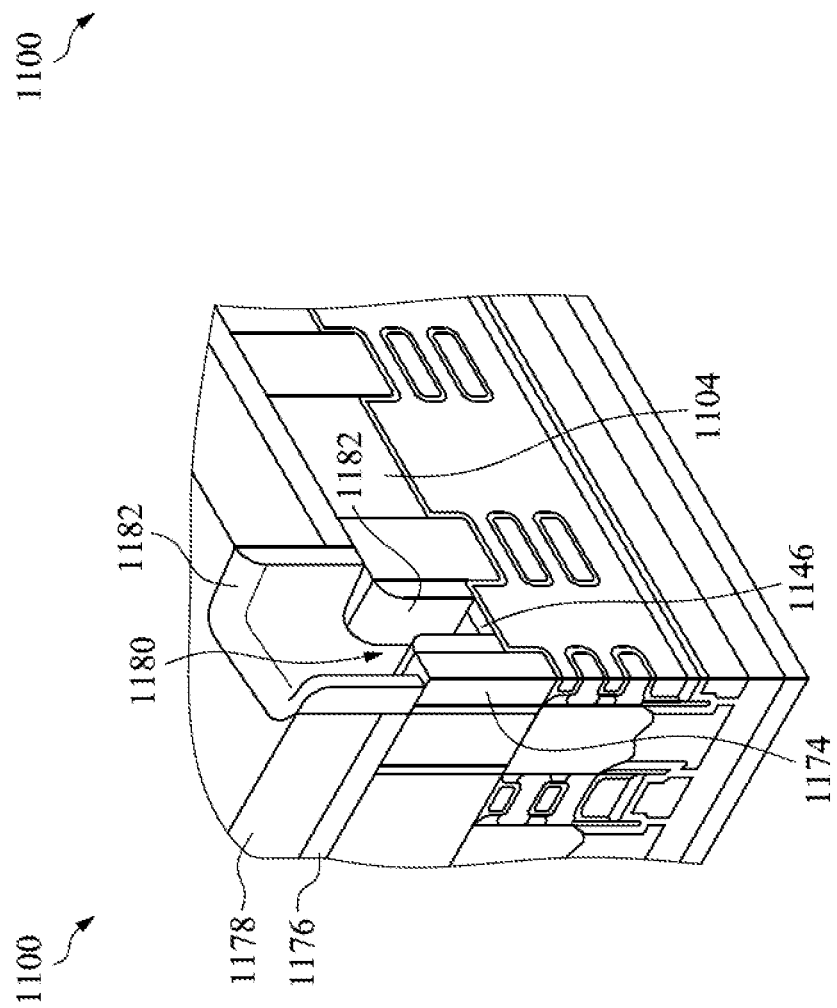

In FIG. 4S, a dielectric layer 1182 is formed in the trench 1180. In one example, the dielectric layer 1182 includes silicon nitride. However, the dielectric layer 1182 can include silicon oxide, silicon oxynitride (SiON), SiOCN, SiCN, fluorine-doped silicate glass (FSG), a low-K dielectric material or other dielectric materials without departing from the scope of the present disclosure. An etching process has been performed to remove the dielectric layer 1182 from the horizontal surfaces of the integrated circuit 1100. The result is that the dielectric layer 1182 remains on the vertical sidewalls of the dielectric fin structures 1174 and on the vertical sidewalls of the hard mask 1176 and the photoresist 1178.

In FIG. 4T, an etching process has been performed to extend the depth of the trench 1180. In particular, the etching process etches the exposed portion of the gate dielectric 1146, the gate metal 1148, and the gate metal 1150. The result is that the gate electrodes 1109 of two adjacent transistors 1105 are physically separated from each other. A portion of the dielectric layer 1154 is exposed at the bottom of the trench 1180. The etching process can include an anisotropic etch that etches in the downward direction. The anisotropic etching process selectively etches the materials of the gate dielectric 1146, the gate metals 1148 and 1150 with respect to the dielectric layer 1182. The exposed portions of the dielectric fin structures 1174 also slightly etched such that a step is formed in the dielectric fin structures 1183.

Though not apparent in the view of FIG. 4T, the etching process that cuts the gate metals 1148 and 1150 also etches a portion of the hybrid fin structure 1126 adjacent to the gate electrodes 1109. A recess is formed in the hybrid fin structure 1126. The shape of the recess and the overall shape of the trench 1180 depends, in part, on the etching process utilized to form the trench 1180. If an etching process is performed that etches the dielectric layers 1128 and 1130 more rapidly than the dielectric layer 1134 of the hybrid fin structures 1126, then the trench 1180 will include a pronounced step at the fin structures 1126. If the etching process etches the dielectric layers 1128, 1130, and 1134 have substantially similar rates, then the trench 1180 will have a relatively smooth slope throughout the hybrid fin structure 1126.

In FIG. 4U, a gate isolation structure 1115 has been formed in the trench 1180. The gate isolation 1115 structure physically separates the gate electrodes 1109 of two of the transistors 1105. The gate isolation structure 1115 in one example, the gate isolation structure 1115 includes silicon nitride. However, the gate isolation structure 1115 can include silicon oxide, silicon oxynitride (SiON), SiOCN, SiCN, fluorine-doped silicate glass (FSG), a low-K dielectric material or other dielectric materials without departing from the scope of the present disclosure. The gate isolation structure 1115 can be deposited by CVD, PVD, ALD, or other suitable deposition processes. In some embodiments, the bottom surface of the gate isolation structure 1115 is coplanar with the bottom surface of the dielectric fin structure 1174. The bottom surface of the gate isolation structure 1115 is also coplanar with the bottom surface of the shallow trench isolation 1104.

FIG. 4V is a cross-sectional view of the integrated circuit 1100 at the stage of processing of FIG. 4U, taken along cut lines V. The cross-sectional view of FIG. 4V illustrates that the gate isolation structure 1115 cuts partially into the adjacent hybrid fin structure 1126. Furthermore, the gate isolation structure 1115 has a relatively smooth edge through the gate isolation structure 1115. This is because the etching process that was chosen to form the trench 1180 etched the dielectric layers 1130, 1312, and 1134 of the hybrid fin structure at substantially similar rates. In some cases, the sidewall 1185 of the gate isolation structure 1115 can be substantially vertical through the entirety of the gate isolation structure 1126. In some cases, the sidewall 1185 of the gate isolation structure 1115 will have a smooth gradual curve as shown in FIG. 4V. In other cases, the sidewall 1185 of the gate isolation structure 1115 may have a relatively sharp step feature in the hybrid fin 1126.

Figure 4X:
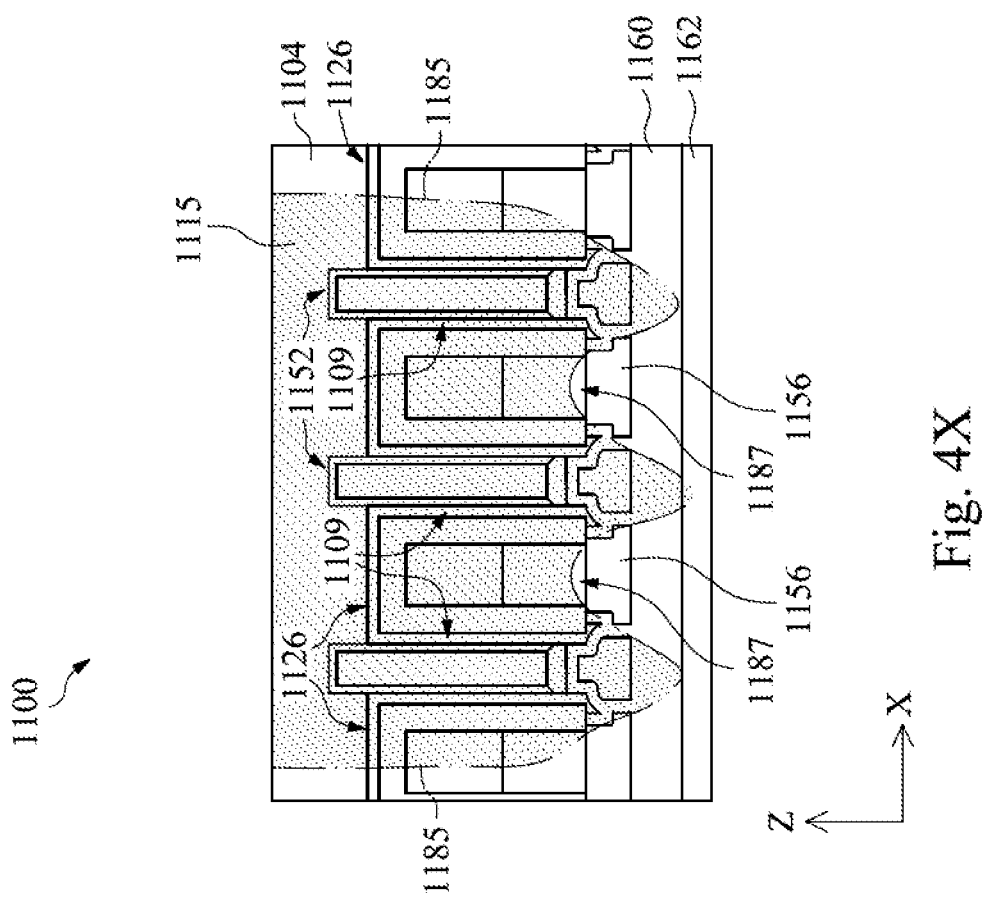
Figure 4W:
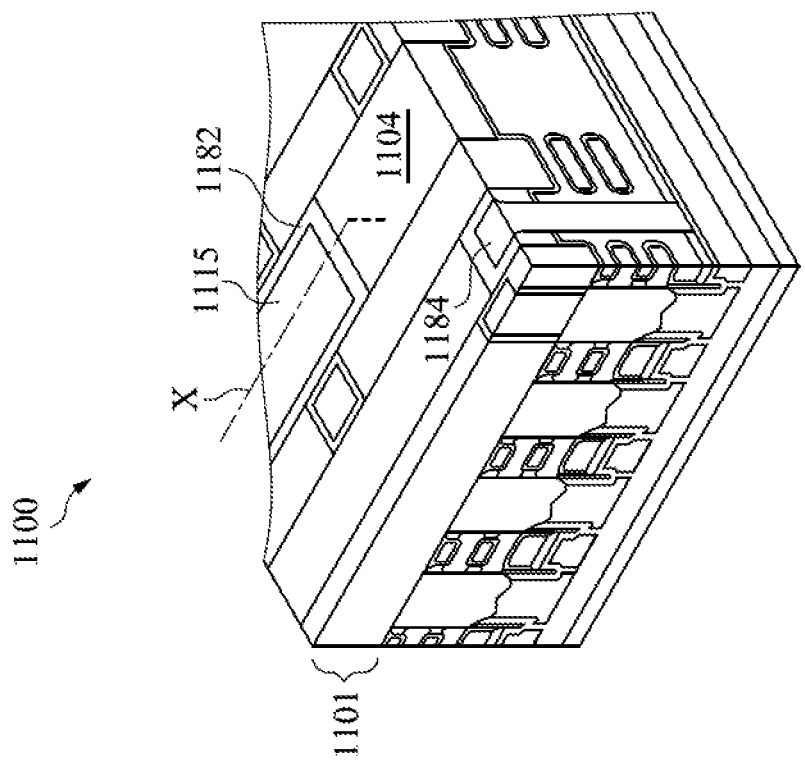

FIG. 4W is a view of the integrated circuit 1100 at the stage of processing shown in FIG. 4U. The view of FIG. 4W illustrates that a second, larger gate isolation structure 1115 has been formed through the substrate 1101 at a different location. The second, larger gate isolation structure 1115 is formed in the same process includes the same materials as the previously described gate isolation structure 1115. However, the larger gate isolation structure 1115 breaks multiple gate electrodes 1109, as is apparent in the view of FIG. 4X.

FIG. 4X is a cross-sectional view of the integrated circuit 1100 at the stage of processing of FIG. 4W, taken along cut lines X. In the view of FIG. 4X, the gate isolation structure 1115 is illustrated with transparency to show the positions of the gate electrodes 1109 and the gate isolation structures 1126 on the far side of the gate isolation structure 1115 into the drawing sheet. A trench 1180 was formed through the gate electrodes 1109 and portions of the hybrid fins 1126. The gate isolation structure 1115 was then formed within the trench 1180. The gate isolation structure 1115 has a substantially smooth sidewall as described previously in relation to FIG. 4V. FIG. 4X illustrates that the process for forming the trench 1180 does not substantially etched through the source/drain contacts 1156. Accordingly, the gate isolation structure 1115 has a sawtooth shape around the source/drain contacts 1156. Stated another way, the gate isolation structure 1115 is positioned above the source/drain contacts 1156 and extends downward between source/drain contacts 1156. Accordingly, the gate isolation structure 1115 may have arc or arch shapes that arc over the source/drain contacts 1156.

Figure 4Y:
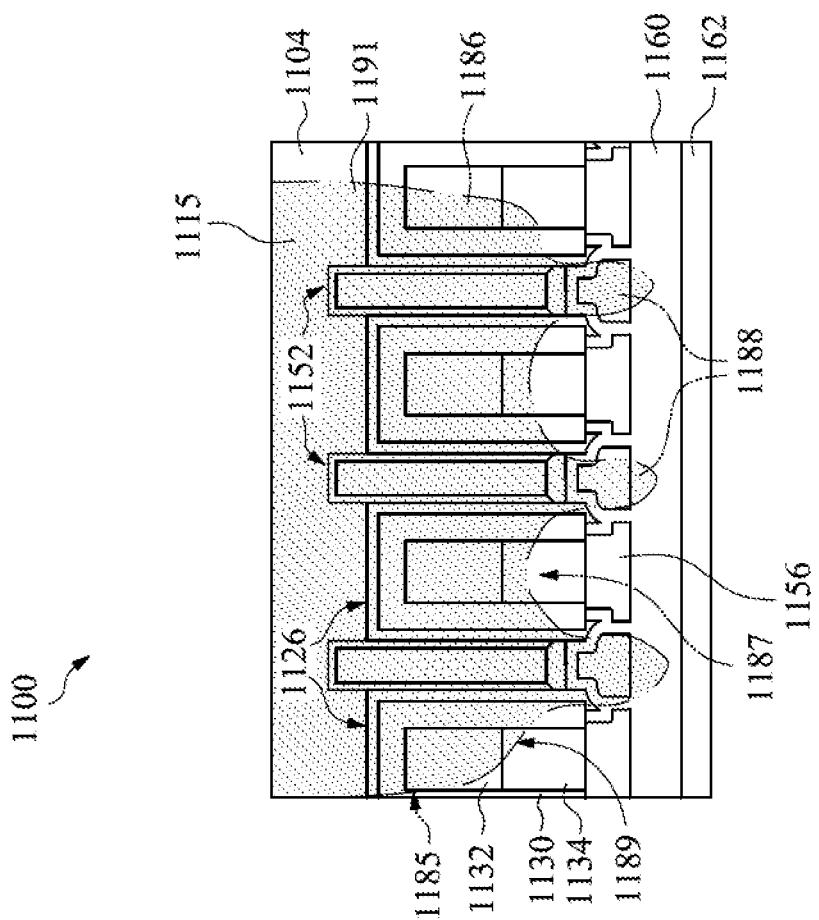

FIG. 4Y is a cross-sectional view of the integrated circuit 1100 at the stage of processing of FIG. 4W, also taken along cut lines X. However, the view of FIG. 4Y illustrates that the trench 1180 was formed in a different manner than for FIG. 4X. The etch chemistry for the trench 1180 may be such that the etching process etches the dielectric layer 1134 at a slower rate than the dielectric layers 1132 and 1130. Accordingly, the arch shapes 1187 in the gate isolation structure 1115 do not extend so deeply into the dielectric layer 1124 as they did in FIG. 4X. Furthermore, the sidewall 1185 has a step feature in the hybrid fin structure 1126 due to the etching process that formed the trench 1180 in which the gate isolation structure 1115 is formed. The gate isolation structure 1115 has lower regions 1188 that extend downward between source/drain contacts 1156. The gate isolation structure 1115 has upper regions 1191 above the dielectric layer 1134 of the hybrid fin structures 1126.

FIG. 4Z is a cross-sectional view of an integrated circuit 1100 including a gate isolation structure 1115 that breaks a single gate electrode, rather than multiple gate electrodes as in FIGS. 4X and 4Y. The trench 1180 for the gate isolation structure 1115 is formed using an etching process that results in a relatively smooth sidewall 1185 of the gate isolation structure 1115. The gate isolation structure 1115 is narrower at a bottom region 1188 than at the top region 1191.

FIG. 5 is a cross-sectional view of an integrated circuit 1100 including a gate isolation structure 1115 that breaks a single gate electrode, rather than multiple gate electrodes as in FIGS. 4X and 4Y. The trench 1180 for the gate isolation structure 1115 is formed using an etching process that results in a step 1189 in the sidewall 1185 of the gate isolation structure 1115.

Figure 6:
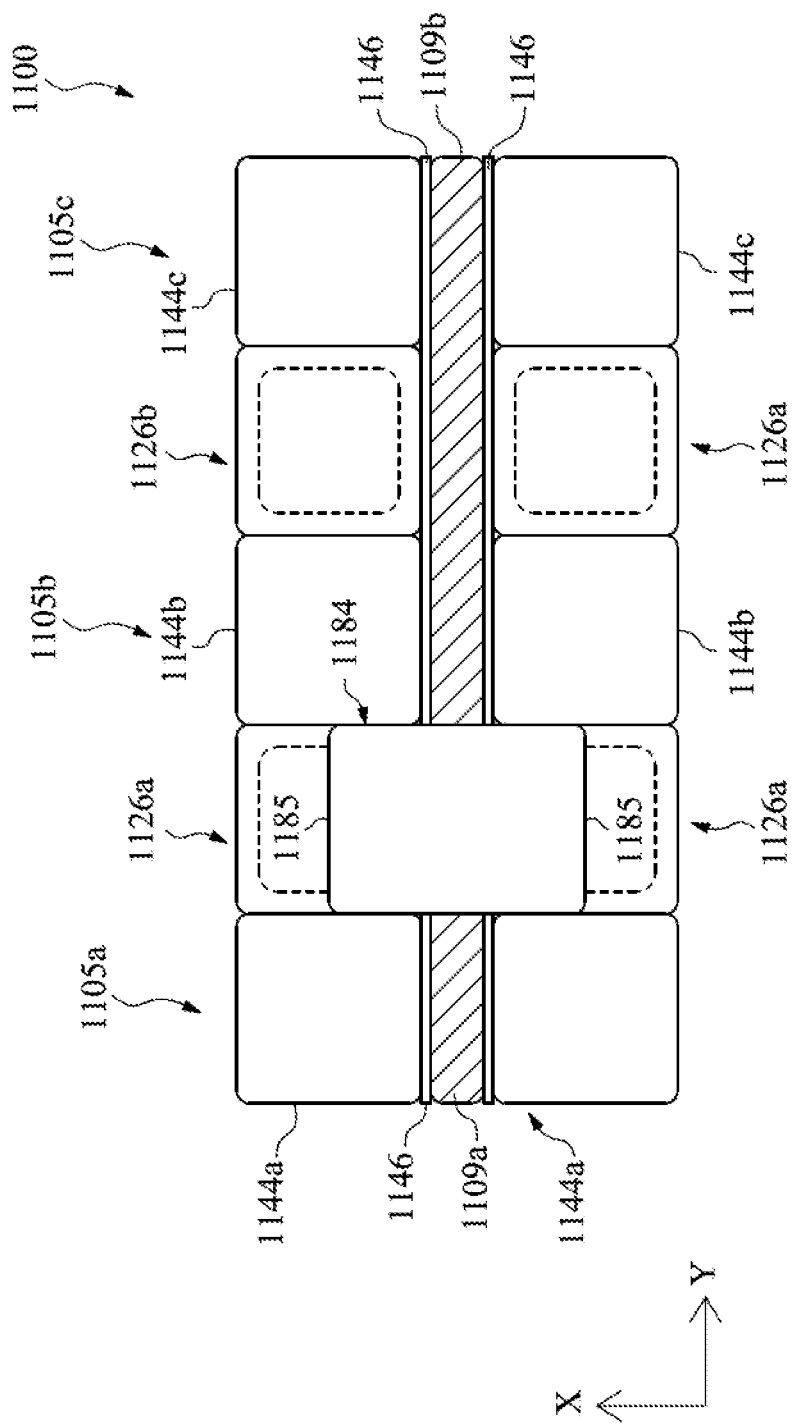
FIGS. 6 and 7 are top views of an integrated circuit, in accordance with some embodiments.

FIG. 6 is a top view of an integrated circuit 1100, in accordance with some embodiments. The integrated circuit 1100 may correspond to the integrated circuit of FIG. 4Z and is flipped so that the shallow trench isolations 1104 are facing upwards as in FIG. 4Z. Nevertheless, the shallow trench isolations 1104 and the dielectric fin structures 1174 are not shown in FIG. 6 so that the relative positions of gate electrodes, gate isolation structures, source/drain regions, and hybrid fin structures can be more clearly understood.

FIG. 6 illustrates three transistors 1105a, 1105b, and 1105c. The transistor 1105a includes source/drain regions 1144a. The transistor 1105a includes a gate electrode 1109a. The second transistor 1105b includes source/drain regions 1144b. The transistor 1105b includes the gate electrode 1109b. The transistor 1105c includes source/drain regions 1144c. The transistor 1105c shares the gate electrode 1109b with the transistor 1105b. The stacked channels 1108 of the transistors 1105a-c are secured within the gate electrodes 1109a and 1109b. Though not visible, the stacked channels 1108 of the transistor 1105a extend in the X direction between the source/drain regions 1144a. The stacked channels 1108 of the transistor 1105b extend in the X direction between the source/drain regions 1144b. The stacked channels 1108 of the transistor 1105c extend in the X direction between the source/drain regions 1144c. Hybrid fin structures 1126a physically and electrically isolate the source/drain regions 1144a from the source/drain regions 1144b. Hybrid fin structures 1126b physically and electrically isolate the source/drain regions 1144b from the source/drain regions 1144c.

A gate isolation structure 1115 electrically and physically separates the gate electrode 1109a from the gate electrode 1109b. The gate isolation structure 1115 overlaps the hybrid fin structures 1126a. More particularly, the gate isolation structure 1115 replaces material of the hybrid fin structures 1126a that was etched away while forming the trench 1180 as described previously.

Figure 7:
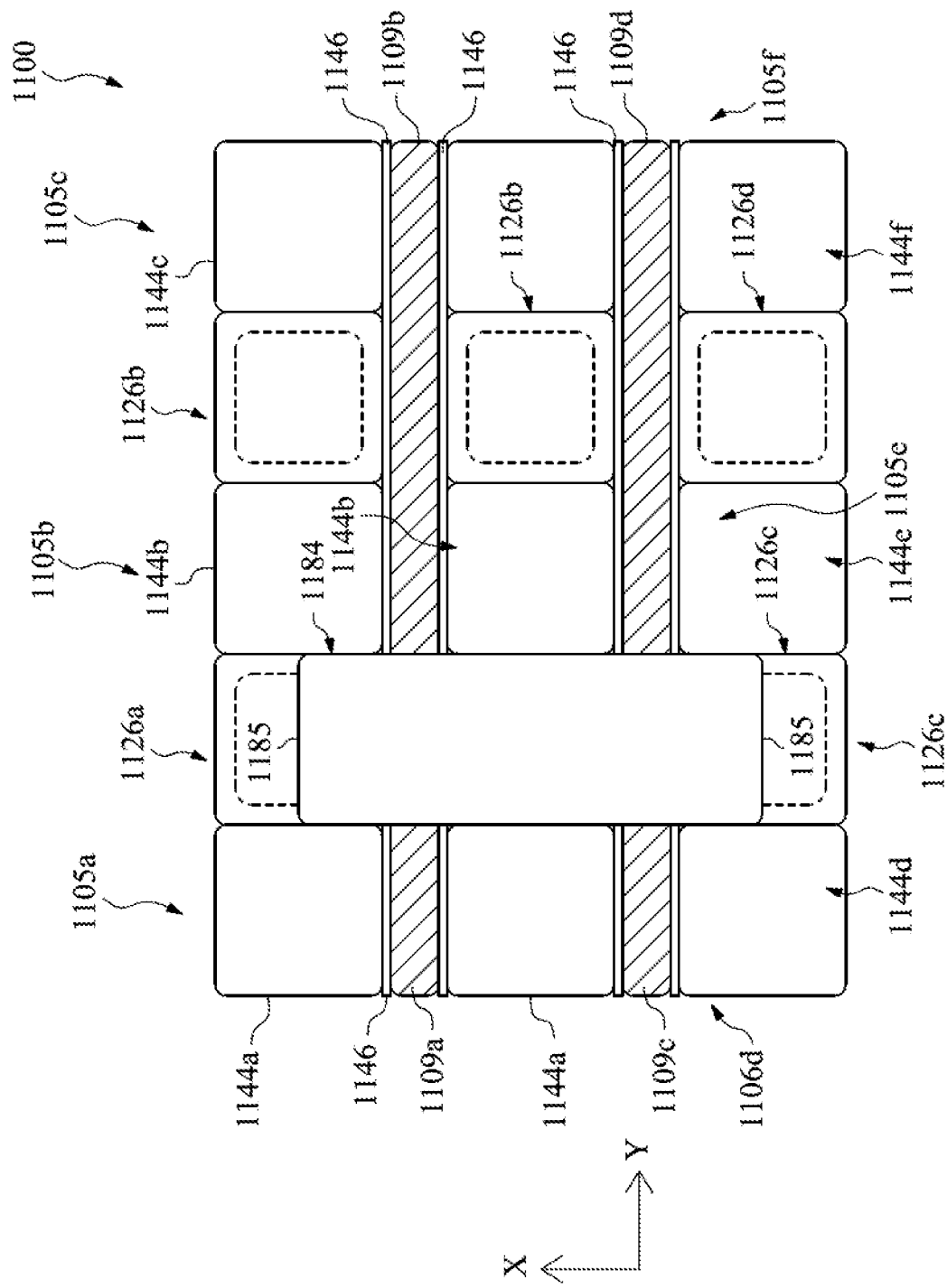

FIG. 7 is a top view of an integrated circuit 1100, in accordance with some embodiments. The view of FIG. 7 is similar to the view of FIG. 6, except that six transistors 1105a-f are illustrated in FIG. 7.

The transistor 1105a includes source/drain regions 1144a. The transistor 1105a includes a gate electrode 1109a. The second transistor 1105b includes source/drain regions 1144b. The transistor 1105b includes the gate electrode 1109b. The transistor 1105c includes source/drain regions 1144c. The transistor 1105c shares the gate electrode 1109b with the transistor 1105b. The stacked channels 1108 of the transistors 1105a-c are secured within the gate electrodes 1109a and 1109b.

The transistor 1105d includes a gate electrode 1109c, a source drain region 1144d, and the source/drain region 1144a shared with the transistor 1105a. The transistor 1105e includes a gate electrode 1109d, a source drain region 1144e, and the source/drain region 1144b shared with the transistor 1105b. The transistor 1105f includes a gate electrode 1109d shared with the transistor 1105e, a source drain region 1144e, and the source/drain region 1144c shared with the transistor 1105c.

Hybrid fin structures 1126a physically and electrically isolate the source/drain regions 1144a from the source/drain regions 1144b. Hybrid fin structures 1126b physically and electrically isolate the source/drain regions 1144b from the source/drain regions 1144c. A hybrid fin structure 1126d physically and electrically isolate the source/drain region 1144d from the source/drain regions 1144e. A hybrid fin structure 1126d physically and electrically isolates the source/drain region 1144e from the source/drain regions 1144f.

A gate isolation structure 1115 electrically and physically separates the gate electrode 1109a from the gate electrode 1109b. The gate isolation structure 1115 overlaps the hybrid fin structures 1126a. More particularly, the gate isolation structure 1115 replaces material of the hybrid fin structures 1126a that was etched away while forming the trench 1180 as described previously. The gate isolation structure 1115 electrically and physically separates the gate electrode 1109c from the gate electrode 1109d. The gate isolation structure 1115 overlaps the hybrid fin structures 1126d. More particularly, the gate isolation structure 1115 replaces material of the hybrid fin structure 1126c that was etched away while forming the trench 1180 as described previously.

Figure 8:
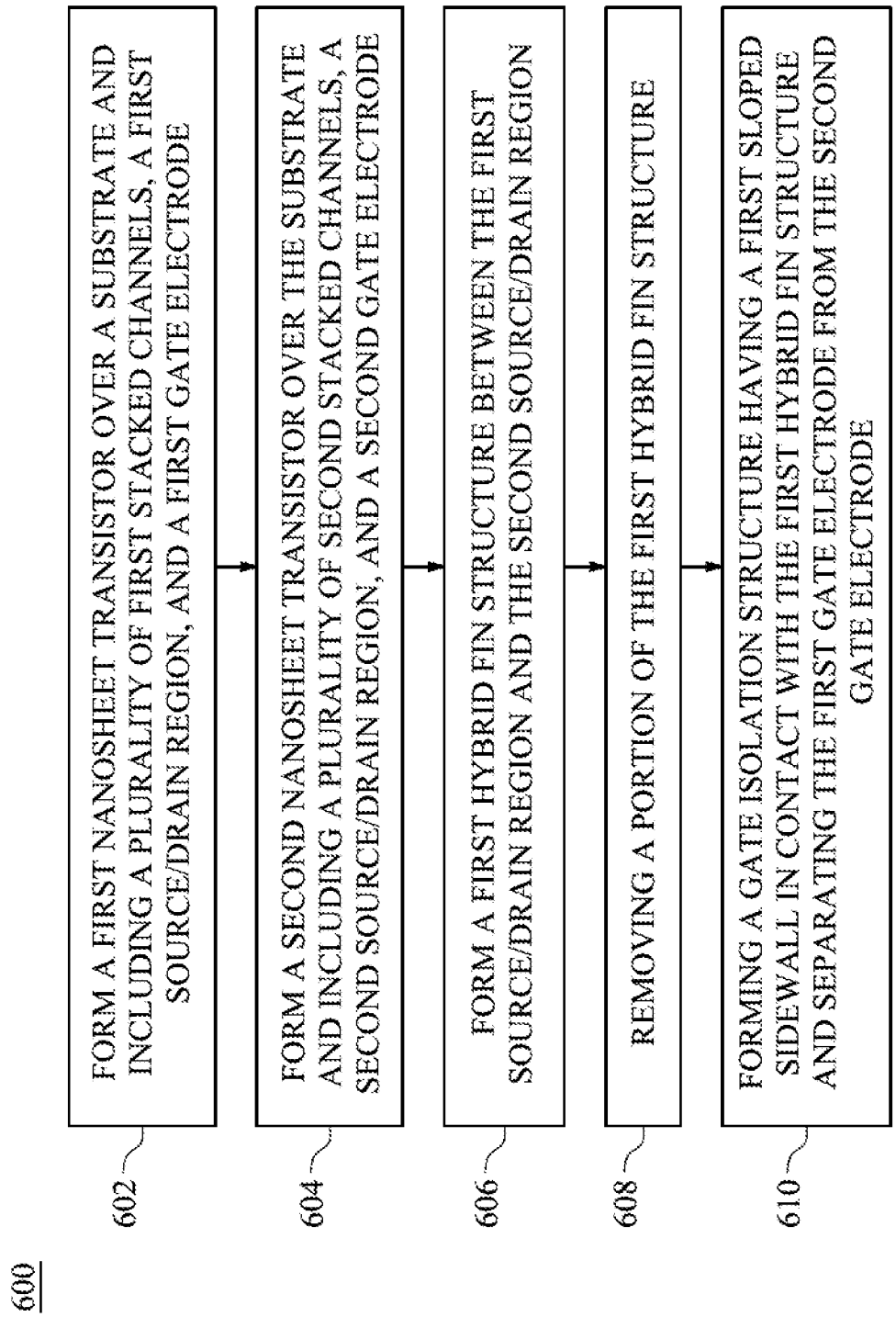
FIG. 8 is a flow diagram of a process for forming an integrated circuit, in accordance with some embodiments.

FIG. 8 is a flow diagram of a method 600 for forming an integrated circuit, in accordance with some embodiments. The method 600 can utilize processes, structures, or components described in relation to FIGS. 3-7. At 602, the method 600 includes forming a first nanostructure transistor over a substrate and including a plurality of first stacked channels, a first source/drain region, and a first gate electrode. One example of a first nanostructure transistor is the transistor 1105a of FIG. 6. One example of a first source/drain region is the source/drain region 1144a of FIG. 6. One example of stacked channels are the stacked channels 1108 of FIG. 3. One example of a substrate is the substrate 1101 of FIG. 3. One example of a first gate electrode is the first gate electrode 1109a of FIG. 6. At 604, the method 600 includes forming a second nanostructure transistor over the substrate and including a plurality of second stacked channels, a second source/drain region, and a second gate electrode. One example of a second nanostructure transistor is the transistor 1105b of FIG. 6. One example of stacked channels are the stacked channels 1108 of FIG. 3. One example of a second source/drain region is the second source/drain region 1144b of FIG. 6. One example of a second gate electrode is the gate electrode 1109b of FIG. 6. At 606, the method 600 includes forming a first hybrid fin structure between the first source/drain region and the second source/drain region. One example of a first hybrid fin structure is the hybrid fin structure 1126a of FIG. 6. At 608, the method 600 includes removing a portion of the first hybrid fin structure. At 610, the method 600 includes forming a gate isolation structure having a first sloped sidewall in contact with the first hybrid fin structure and separating the first gate electrode from the second gate electrode. One example of a gate isolation structure is the gate isolation structure 1115 of FIG. 6. One example of a sloped sidewall is the sloped sidewall 1185 of FIG. 4V.

Embodiments of the present disclosure provide semiconductor devices and methods of manufacturing semiconductor devices in which hybrid fin structures are formed source/drain regions of neighboring transistors and between gate electrodes of neighboring transistors. The hybrid fin structures include a plurality of silicon oxycarbonitride (SiOCN) hybrid fin dielectric layers, with each of the SiOCN layers having different ratios or different concentrations of at least one of Si, O, C, or N with respect to one another. This results in a hybrid fin structure having good qualities for use in a transistor (e.g., high thermal stability and excellent step coverage), while providing a low dielectric material capable of reducing or preventing current leakage between neighboring transistors. The hybrid fin structures include non-high-K dielectric materials to improve the performance and manufacturing processes of the transistors. The hybrid fin structures may be formed with a lower height as compared to hybrid fin structures which utilize a high-K dielectric material. Moreover, by forming the semiconductor device using non-high-K dielectric materials in the hybrid fin, costs are reduced as the materials and processes may be less costly and more efficient, and process risks associated with high-K dielectric hybrid fins may be avoided.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes a gate electrode over the channel region. When the gate metals of the gate electrodes are initially deposited, all of the gate electrodes may initially be electrically shorted together. Embodiments of the present disclosure advantageously electrically isolate the individual gate electrodes by utilizing gate isolation structures to cut the gate metals. The gate isolation structures are formed by forming trenches via the backside of the substrate and filling the trenches with one or more dielectric materials. The trenches cut through the gate metals between the transistors and thereby remove conductive materials that would otherwise electrically short the gate electrodes of adjacent transistors. The gate isolation structures isolate the gate electrodes from each other.

This process provides many benefits. Gate metals can be cut and hybrid fins that separate adjacent transistors can be removed in a self-aligned process. This can avoid utilizing a separate photolithography process to cut the gate metals. Furthermore, an isolation wall can replace the hybrid fin within a narrower space, thereby allowing high-density formation of transistors. Alternatively, a wider isolation wall can be utilized and achieve better isolation capability. Furthermore, transistor heights can be reduced utilizing this process. All of this results in more cost-effective and efficient formation of transistors, better functioning transistors, and higher wafer yields.

In some embodiments, a device includes a substrate and a transistor on the substrate. The transistor includes a channel region that has at least one semiconductor nanostructure, and a gate electrode. A source/drain region is disposed adjacent to a first side of the channel region along a first direction. A hybrid fin structure is disposed adjacent to a second side of the channel region along a second direction that is transverse to the first direction. The hybrid fin structure includes a first hybrid fin dielectric layer and a second hybrid fin dielectric layer. The first and second hybrid fin dielectric layers include silicon, oxygen, carbon and nitrogen and have a different concentration of at least one of silicon oxygen, carbon, or nitrogen from one another.

In some embodiments, a method includes forming a first channel region of a first transistor, the first channel region overlying a semiconductor substrate. A source/drain region is formed in contact with the first channel region, with the source/drain region adjacent to the first channel region along a first direction. A hybrid fin structure is formed adjacent to the source/drain region along a second direction that is transverse to the first direction. The hybrid fin structure includes a plurality of silicon oxycarbonitride (SiOCN) layers, each having a different ratio of silicon, oxygen, carbon, or nitrogen with respect to one another.

In some embodiments, a device includes a substrate. A first transistor is disposed on the substrate, and the first transistor includes a plurality of first semiconductor nanostructures corresponding to a channel region of the first transistor. A second transistor is disposed on the substrate, and the second transistor includes a plurality of second semiconductor nanostructures corresponding to a channel region of the second transistor. A source/drain region is in contact with the plurality of first semiconductor nanostructures and the plurality of second semiconductor nanostructures along a first direction. First and second hybrid fin structures are disposed adjacent to opposite sides of the source/drain region along a second direction that is transverse to the first direction. Each of the first and second hybrid fin structures includes a respective a first hybrid fin dielectric layer, a second hybrid fin dielectric layer on the first hybrid fin dielectric layer, an oxide layer on the second hybrid fin dielectric layer, and a third hybrid fin dielectric layer on the oxide layer and contacting side surfaces of the second hybrid fin dielectric layer.

In some embodiments, an integrated circuit includes a substrate and a first nanostructure transistor over the substrate. The first nanostructure transistor includes a first plurality of stacked channels and a first gate electrode. The integrated circuit includes a dielectric fin structure below the first plurality of stacked channels, wherein the first gate electrode surrounds a portion of the dielectric fin structure.

In some embodiments, a method includes forming a first nanostructure transistor over a substrate and including a plurality of first stacked channels, a first source/drain region, and a first gate electrode, forming a second nanostructure transistor over the substrate and including a plurality of second stacked channels, a second source/drain region, and a second gate electrode and forming a first hybrid fin structure between the first source/drain region and the second source/drain region. The method includes removing a portion of the first hybrid fin structure forming a gate isolation structure having a first sloped sidewall in contact with the first hybrid fin structure and separating the first gate electrode from the second gate electrode.

In some embodiments, an integrated circuit includes a first nanostructure transistor. The first nanostructure transistor includes a plurality of first stacked channels, a first source/drain region, and a first gate electrode. The integrated circuit includes a second nanostructure transistor. The second nanostructure transistor includes a plurality of second stacked channels, a second source/drain region, and a second gate electrode. The integrated circuit includes a gate isolation structure between and in contact with the first gate electrode and the second gate electrode and having a sloped sidewall.

In some embodiments, an integrated circuit includes a substrate, a first transistor on the substrate and including a first gate electrode, and a second transistor on the substrate and including a second gate electrode. The integrated circuit includes a third transistor on the substrate and including a third gate electrode, a fourth transistor on the substrate and including a fourth gate electrode, and a first hybrid fin structure adjacent to the first and second gate electrodes. The integrated circuit includes a second hybrid fin structure adjacent to the third and fourth gate electrodes and a gate isolation structure between the first and second gate electrodes, between the third and fourth gate electrodes, and in contact with the first and second hybrid fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first transistor on the substrate, the first transistor including:
      a plurality of stacked first channels;
      a first source/drain region in contact with each of the first channels; and
      a first gate electrode;
   a second transistor on the substrate, the second transistor including:
      a plurality of second stacked second channels;
      a second source/drain region in contact with each of the second channels; and
      a second gate electrode; and
   a hybrid fin structure positioned between and in contact with the first source/drain region and the second source/drain region, the hybrid fin structure including:
      a first hybrid fin dielectric layer including silicon, oxygen, carbon and nitrogen, wherein the first hybrid fin dielectric layer is in contact with the first source/drain region and the second source/drain region;
      a second hybrid fin dielectric layer on the first hybrid fin dielectric layer, the second hybrid fin dielectric layer including silicon, oxygen, carbon and nitrogen and having a different concentration of at least one of the silicon oxygen, carbon, or nitrogen than that of the first hybrid fin dielectric layer; and
      a third hybrid fin dielectric layer on the second hybrid fin dielectric layer, wherein the third hybrid fin dielectric layer includes silicon, oxygen, carbon and nitrogen, and the first, second, and third hybrid fin dielectric layers have different concentrations of at least one of silicon oxygen, carbon, or nitrogen.

2. The device of claim 1, wherein the hybrid fin structure includes an oxide layer on the second hybrid fin dielectric layer and disposed between the second hybrid fin dielectric layer and the third hybrid fin dielectric layer.

3. The device of claim 2, wherein the third hybrid fin dielectric layer has a height between an upper surface of the oxide layer and an upper surface of the hybrid fin that is less than 30 nm.

4. The device of claim 2, wherein a distance between an upper surface of the second hybrid fin dielectric layer and an upper surface of the third hybrid fin dielectric layer is less than 30 nm.

5. The device of claim 1, wherein the hybrid fin structure has a width between the first and second source/drain regions that is less than 100 nm.

6. The device of claim 1, wherein the first gate electrode has a width that is less than 20 nm.

7. An integrated circuit, comprising:
   a first transistor including:
      a plurality of stacked first channels;
      a first source/drain region; and
      a first gate electrode;
   a second transistor including:
      a plurality of stacked second channels;
      a second source/drain region; and
      a second gate electrode; and
   a first hybrid fin structure between the first and second source/drain regions and having a first dielectric layer including oxygen, carbon, and nitrogen, a second dielectric layer including oxygen, carbon and nitrogen and having a different composition than the first dielectric layer, a third dielectric layer including oxygen, carbon, and nitrogen above the second dielectric layer; and
   a gate isolation structure between and in contact with the first gate electrode and the second gate electrode.

8. The integrated circuit of claim 7, wherein the first hybrid fin structure has a sloped sidewall, wherein the gate isolation structure has a sloped sidewall in contact with the sloped sidewall of the first hybrid fin structure.

9. The integrated circuit of claim 8, wherein the sloped sidewall of the gate isolation structure includes a step structure on the first hybrid fin structure.

10. The integrated circuit of claim 7, further comprising:
    a source/drain contact electrically connected to the first source/drain region and in contact with the hybrid fin structure, wherein the gate isolation structure is in contact with the hybrid fin structure and includes an arch structure adjacent to the source/drain contact.

11. The integrated circuit of claim 7, wherein the gate isolation structure is in contact with the first dielectric layer and the second dielectric structure.

12. The integrated circuit of claim 7, wherein the first hybrid fin structure includes a fourth dielectric layer of silicon oxide between the second dielectric layer and the third dielectric layer.

13. An integrated circuit, comprising:
    a first transistor including:
       a first source/drain region;
       a second source/drain region;
       a plurality of stacked first channels extending between the first source/drain region and the second source/drain region; and
       a first gate electrode;
    a first transistor including:
       a third source/drain region;
       a fourth source/drain region;
       a plurality of stacked second channels extending between the third source/drain region and the fourth source/drain region; and
       a second gate electrode;
    a first hybrid fin structure between and in contact with the first and third source/drain regions and having first, second, and third dielectric layers including different compositions of a same group of elements, wherein the group of elements includes silicon, oxygen, carbon, and nitrogen; and
    a second hybrid fin structure between and in contact with the second and fourth source/drain regions.

14. The integrated circuit of claim 13, comprising a gate isolation structure between the first and second gate electrodes and between the first and second hybrid fin structures.

15. The integrated circuit of claim 13, wherein the first hybrid fin structure includes a fourth dielectric layer of silicon oxide between the second and third dielectric layers.

16. The integrated circuit of claim 13, wherein the third hybrid fin dielectric layer has a height between an upper surface of the oxide layer and an upper surface of the hybrid fin that is less than 30 nm.

17. The integrated circuit of claim 13, wherein a distance between an upper surface of the second hybrid fin dielectric layer and an upper surface of the third hybrid fin dielectric layer is less than 30 nm.

18. The integrated circuit of claim 13, wherein the hybrid fin structure has a width between the first and second source/drain regions that is less than 100 nm.

19. The integrated circuit of claim 13, wherein the first gate electrode has a width that is less than 20 nm.

20. The integrated circuit of claim 13, wherein the first hybrid fin structure has a sloped sidewall.

* * * * *